US012631162B1

(12) United States Patent
Liang

(10) Patent No.: US 12,631,162 B1
(45) Date of Patent: May 19, 2026

(54) RECURSIVE AND ENCAPSULATED HEAT HARVESTING SYSTEM

(71) Applicant: Jemm's Labs, Sunnyvale, CA (US)

(72) Inventor: Jemm Yue Liang, Sunnyvale, CA (US)

(73) Assignee: Jemm's Labs, Sunnyvale, CA (US)

( * ) Notice: Subject to any disclaimer, the term of this patent is extended or adjusted under 35 U.S.C. 154(b) by 0 days.

(21) Appl. No.: 19/325,513

(22) Filed: Sep. 11, 2025

Related U.S. Application Data

(60) Provisional application No. 63/785,098, filed on Apr. 8, 2025, provisional application No. 63/774,085, filed on Mar. 18, 2025, provisional application No. 63/765,783, filed on Mar. 3, 2025, provisional application No. 63/761,944, filed on Feb. 22, 2025, provisional application No. 63/761,172, filed on Feb. 21, 2025, provisional application No. 63/760,113, filed on Feb. 18, 2025.

(51) Int. Cl.
*F03G 7/04* (2006.01)
*H05K 7/20* (2006.01)

(52) U.S. Cl.
CPC ......... *F03G 7/045* (2021.08); *H05K 7/20827* (2013.01)

(58) Field of Classification Search
CPC ........................... F03G 7/045; H05K 7/20827
See application file for complete search history.

(56) References Cited

U.S. PATENT DOCUMENTS

2021/0087949 A1 * 3/2021 Han ..................... F01K 23/103

* cited by examiner

*Primary Examiner* — Shafiq Mian
(74) *Attorney, Agent, or Firm* — Winston Hsu

(57) ABSTRACT

A system for cooling and heat harvesting includes a first organic Rankine cycle (ORC), a second ORC, and a first chiller, disposed between the first ORC and the second ORC. The first ORC is configured to harvest a first heat from a heat source and generate electricity. The first chiller provides a first facility fluid to the first ORC. The second ORC is configured to harvest a second heat from the first chiller and generate electricity.

29 Claims, 36 Drawing Sheets

RECURSIVE AND ENCAPSULATED HEAT HARVESTING SYSTEM

CROSS REFERENCE TO RELATED APPLICATIONS

This application claims the benefit of U.S. Provisional Application No. 63/760,113, filed on Feb. 18, 2025. Further, this application claims the benefit of U.S. Provisional Application No. 63/761,172, filed on Feb. 21, 2025. Further, this application claims the benefit of U.S. Provisional Application No. 63/761,944, filed on Feb. 22, 2025. Further, this application claims the benefit of U.S. Provisional Application No. 63/765,783, filed on Mar. 3, 2025. Further, this application claims the benefit of U.S. Provisional Application No. 63/774,085, filed on Mar. 18, 2025. Further, this application claims the benefit of U.S. Provisional Application No. 63/785,098, filed on Apr. 8, 2025. Further, this application claims the benefit of U.S. Provisional Application No. 63/788,873, filed on Apr. 15, 2025. Further, this application claims the benefit of U.S. Provisional Application No. 63/790,948, filed on Apr. 18, 2025. Further, this application claims the benefit of U.S. Provisional Application No. 63/795,350, filed on Apr. 25, 2025. Further, this application claims the benefit of U.S. Provisional Application No. 63/873,901, filed on Sep. 1, 2025. The contents of these applications are incorporated herein by reference.

BACKGROUND OF THE INVENTION

1. Field of the Invention

The present application relates to a heat harvesting system, and more particularly, to a recursive and encapsulated heat harvesting system.

2. Description of the Prior Art

Thermal management is a critical aspect in various modern systems, ranging from small-scale electronic devices, to living condition improvements, to large industrial facilities. Effective heat dissipation is essential for maintaining optimal operating conditions, ensuring device longevity, and enhancing overall system performance. However, conventional approaches to thermal management present significant challenges, leading to inefficiencies, environmental concerns, and infrastructure limitations.

A primary drawback of many existing heat management systems is their fundamental practice of discharging operational heat directly into the ambient environment. For instance, heat generated by components like datacenter servers, GPU cards, laptops, and HVAC systems is typically expelled into the surrounding air. This method not only represents a loss of precious energy but also often incurs additional costs associated with cooling processes, including significant water and energy consumption in many cooling cycles. The thermal energy, once generated, is typically moved away from the heat source and then simply discarded, rather than being converted into a usable form.

Furthermore, within existing energy conversion systems, such as those employing Organic Rankine Cycles (ORC) for waste heat recovery, efficiency losses are common. Heat not recovered when passing through such heat recovery system or generated from mechanical factors, such as surface friction (and/or boundary layer) of turbine rotors and stators, or electrical factors, such as resistance in generator coils, is typically discharged as waste heat. This practice further reduces the overall efficiency of the energy conversion process, as this heat is generally not recaptured or re-utilized within the system. In many conventional ORC setups, the fluid used in the condenser, which has absorbed residual heat, is ultimately discharged to a heat sink, meaning that unharvested waste heat is permanently dissipated and does not re-enter the energy recovery cycle.

Another significant limitation arises in the structural configurations of current heat recovery solutions. Conventional thermodynamic energy conversion systems, including those that might incorporate chilling units, often face constraints related to the operating temperature differentials. The cold source temperature for these systems is typically bound by ambient conditions, such as the wet-bulb temperature, which can limit the achievable pressure differential across the energy conversion mechanism. This inherent constraint restricts the maximum efficiency with which heat can be converted into electricity, particularly when dealing with heat sources at lower temperatures or when aiming for very high heat recovery rates. The design and operational parameters of such systems are therefore inherently limited by their inability to consistently establish and maintain highly favorable temperature conditions for efficient energy conversion.

For large-scale heat-generating facilities, such as sprawling data/AI centers with 100s megawatt to multi-gigawatt power consumption each, current single-stage heat recovery methodologies are expected to be insufficient for achieving comprehensive energy savings. Due to the low temperature of such heat source (such as 50~65° C. for datacenters), after an initial stage of heat conversion, a substantial amount of residual thermal energy will remain at further reduced temperatures, such as 25~30° C. Reclaiming such low temperature heat through conventional means is exceedingly challenging, necessitating the continued reliance on external power sources to meet these data/AI centers' electricity demands. This inability to effectively cascade or comprehensively harvest heat across multiple temperature stages leads to a significant percentage of heat remaining unharvested and ultimately discharged, thereby perpetuating high net electricity consumption.

Moreover, conventional cooling towers, which are widely deployed as the ultimate heat sinks for many industrial and commercial operations, contribute to environmental burdens and resource depletion. These towers operate by expelling large volumes of heat as water vapor into the atmosphere, often functioning akin to humidifiers. This evaporative cooling process leads to substantial water loss that requires constant replenishment, posing a particular challenge in water-scarce regions. The heat and humidity released from these conventional cooling towers represent not only energy not recovered but also water consumed, contributing to both higher operational costs and heavier environmental impacts.

Therefore, there is a pressing need for advanced thermal management systems that can not only efficiently remove heat but also convert it into useful energy, minimize water consumption, overcome the limitations of conventional cooling methods in various environments, and support the increasing power demands of modern technologies without necessitating extensive infrastructure overhauls.

SUMMARY OF THE INVENTION

It is therefore a primary objective of the present application to provide a recursive and encapsulated heat harvesting system, to improve over disadvantages of the prior art.

An embodiment of the present application provides a system for cooling and heat harvesting, comprising a first organic Rankine cycle (ORC) and a second ORC; and a first chiller, disposed between the first ORC and the second ORC; wherein the first ORC is configured to harvest a first heat from a heat source and generate electricity; and wherein the first chiller provides a first facility fluid to the first ORC; wherein the second ORC is configured to harvest a second heat from the first chiller and generate electricity.

These and other objectives of the present invention will no doubt become obvious to those of ordinary skill in the art after reading the following detailed description of the preferred embodiment that is illustrated in the various figures and drawings.

4

Figure 20:
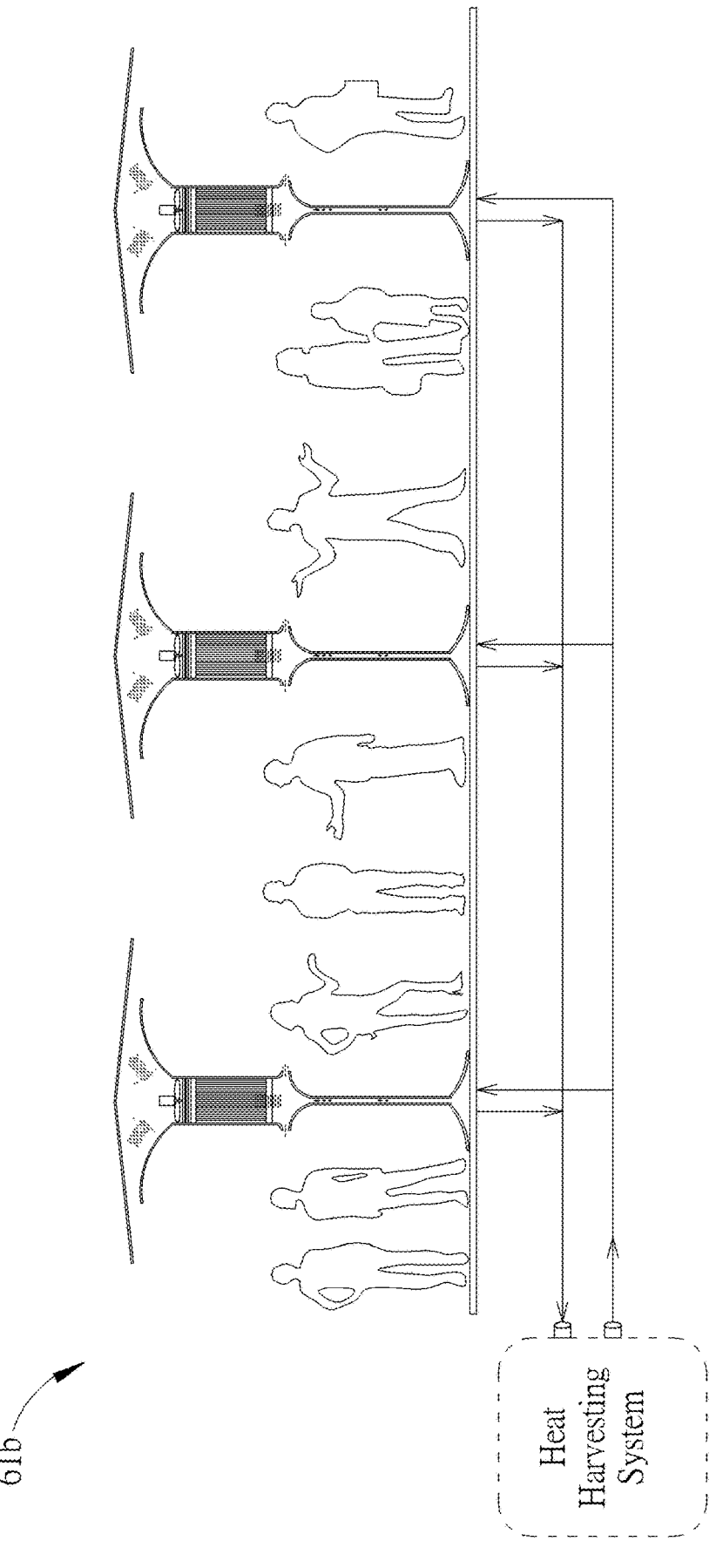

FIG. 20 illustrates a schematic diagram of a heat source according to an embodiment of the present invention.

Figure 21:
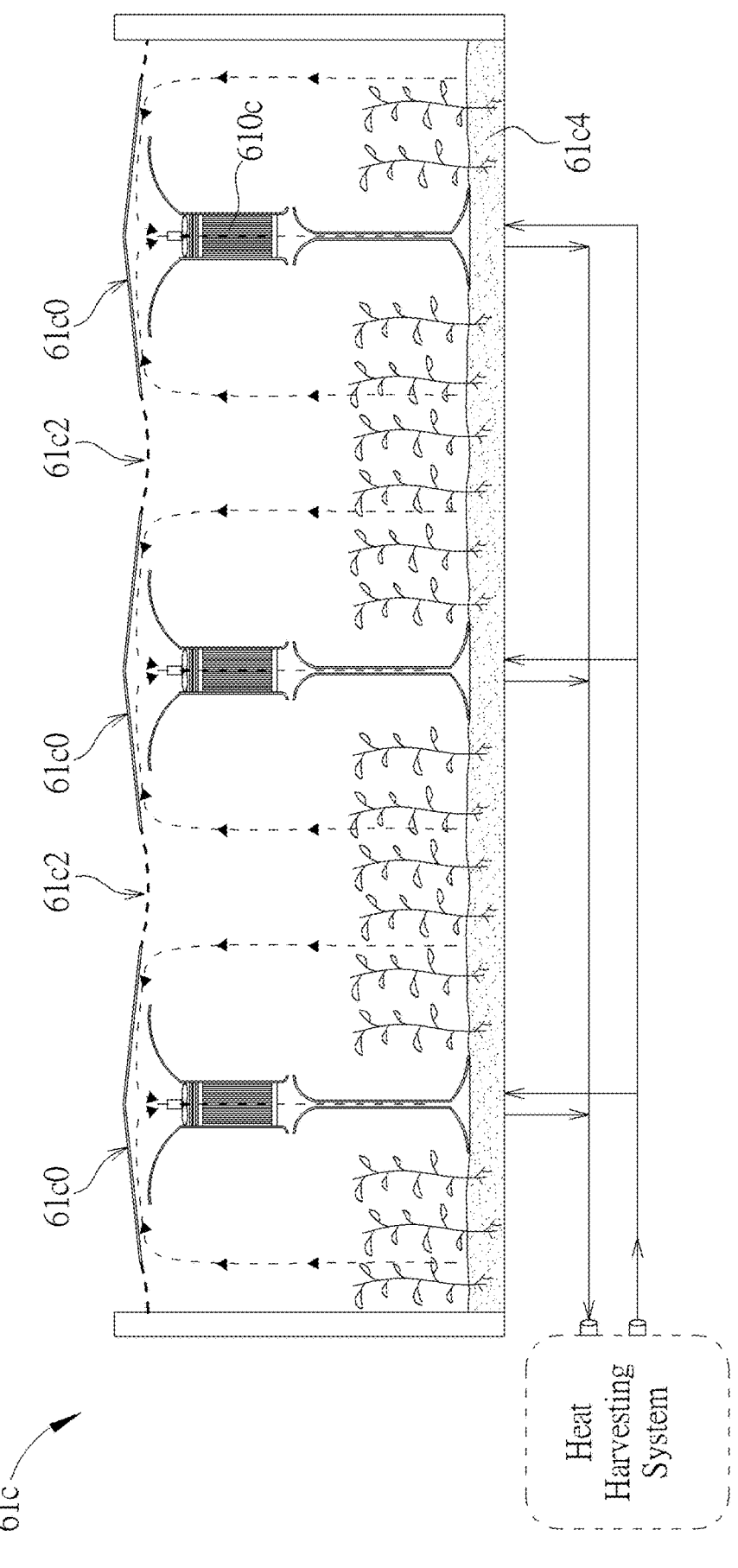

FIG. 21 illustrates a schematic diagram of a heat source according to an embodiment of the present invention.

Figure 22:
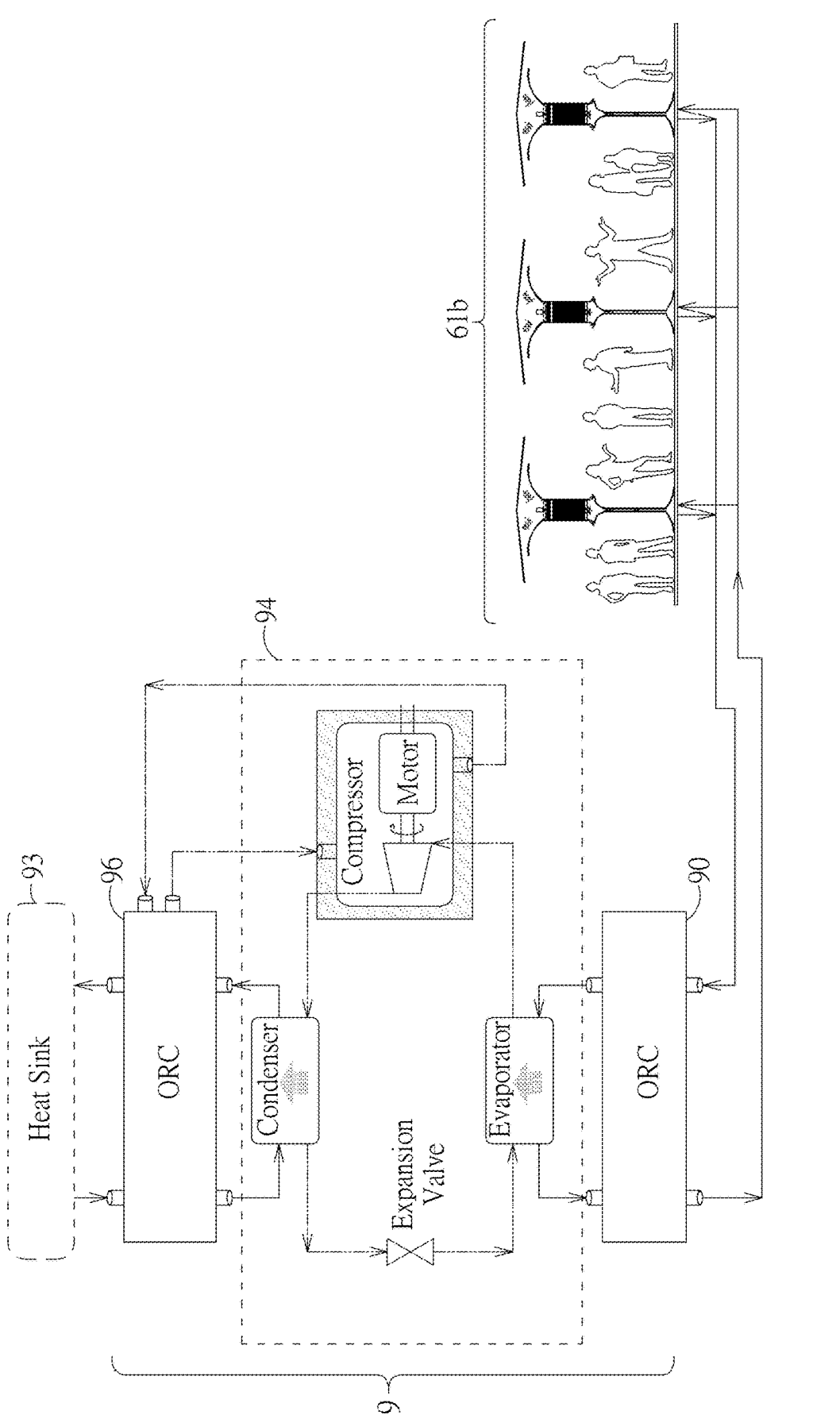

FIG. 22 illustrates a schematic diagram of a heat harvesting system and a heat source according to an embodiment of the present invention.

Figure 23:
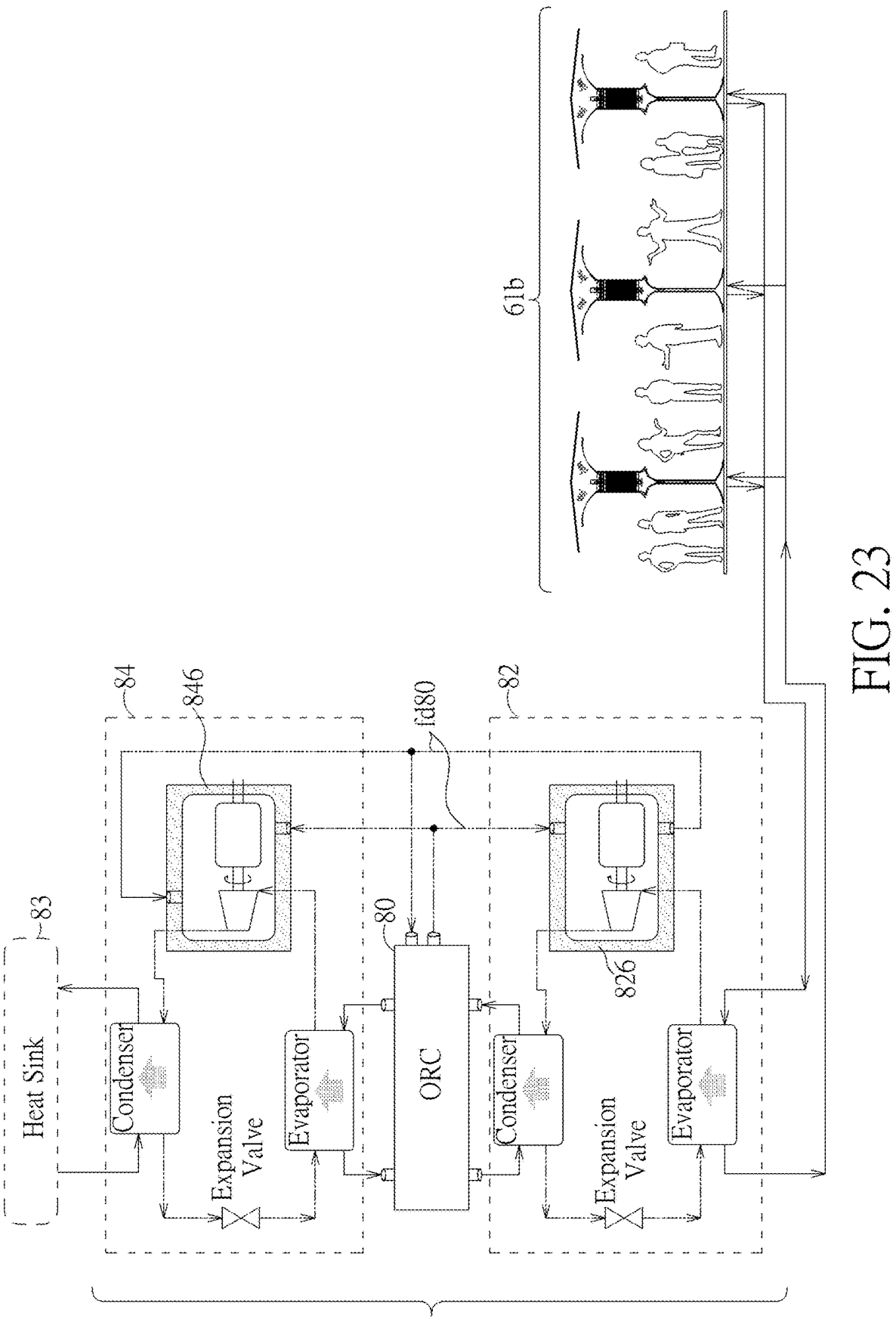

FIG. 23 illustrates a schematic diagram of a heat harvesting system and a heat source according to an embodiment of the present invention.

Figure 24:
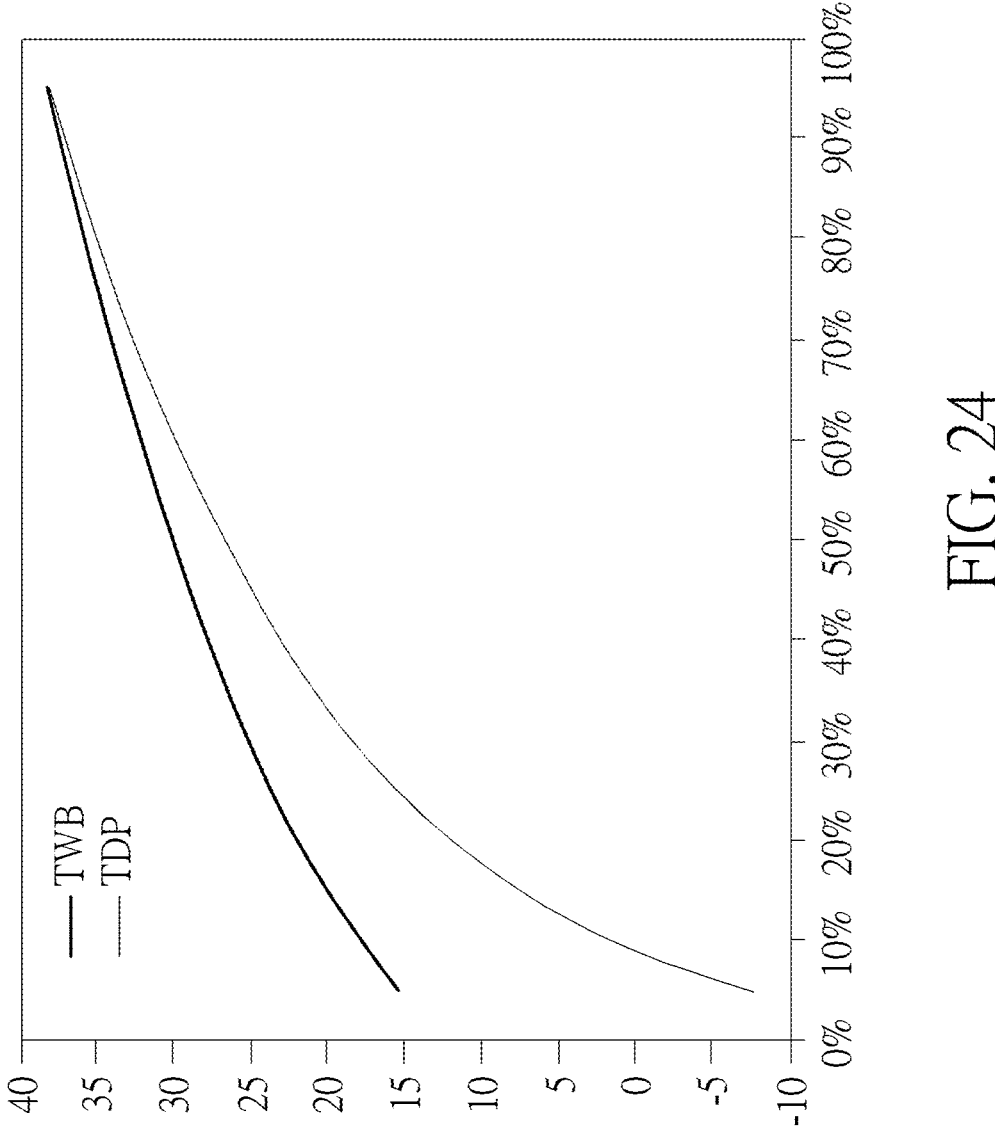

FIG. 24 illustrates curves of wet-bulb temperature and dew point.

Figure 25:
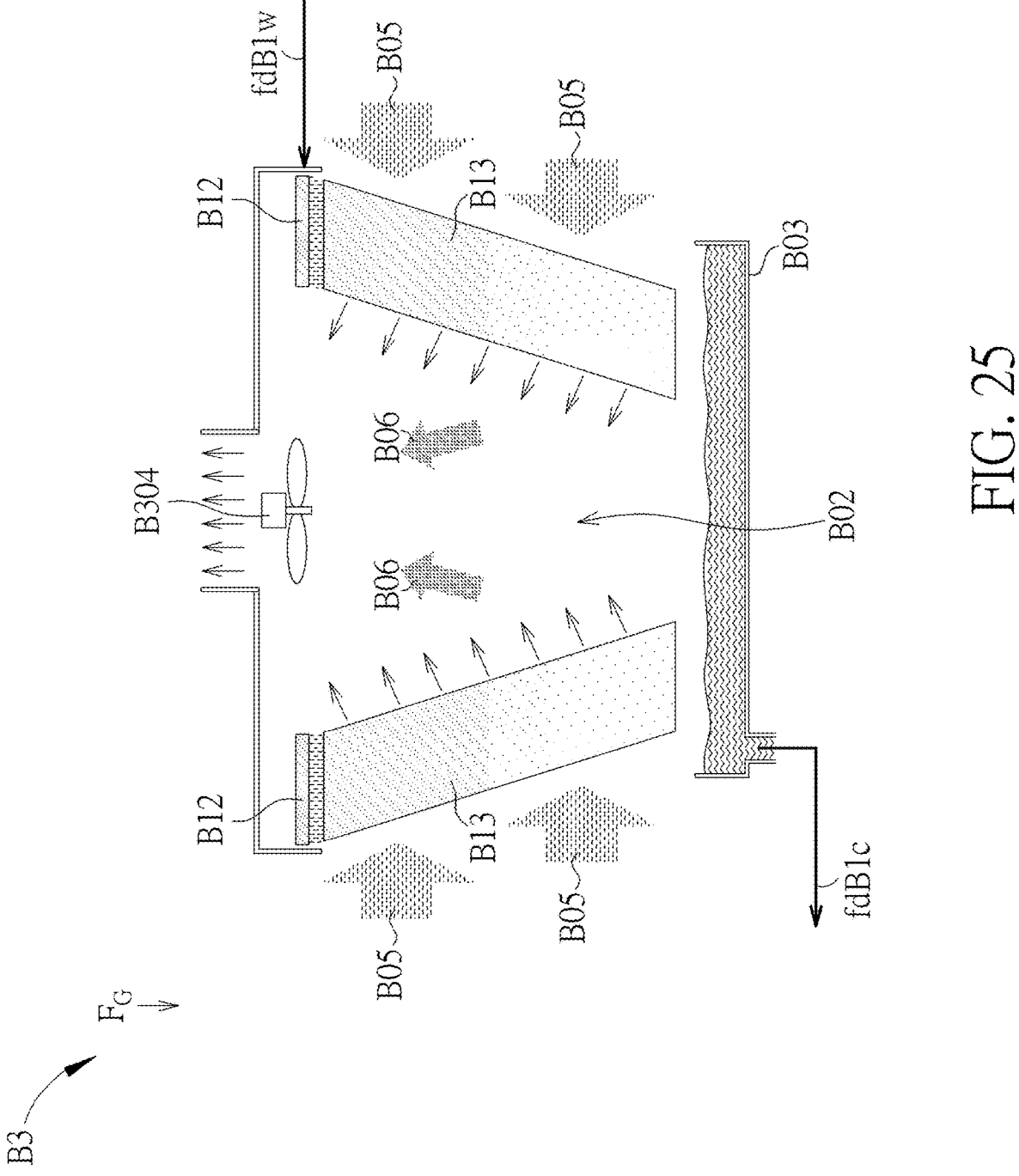

FIG. 25 illustrates a schematic diagram of a cooling tower.

Figure 26:
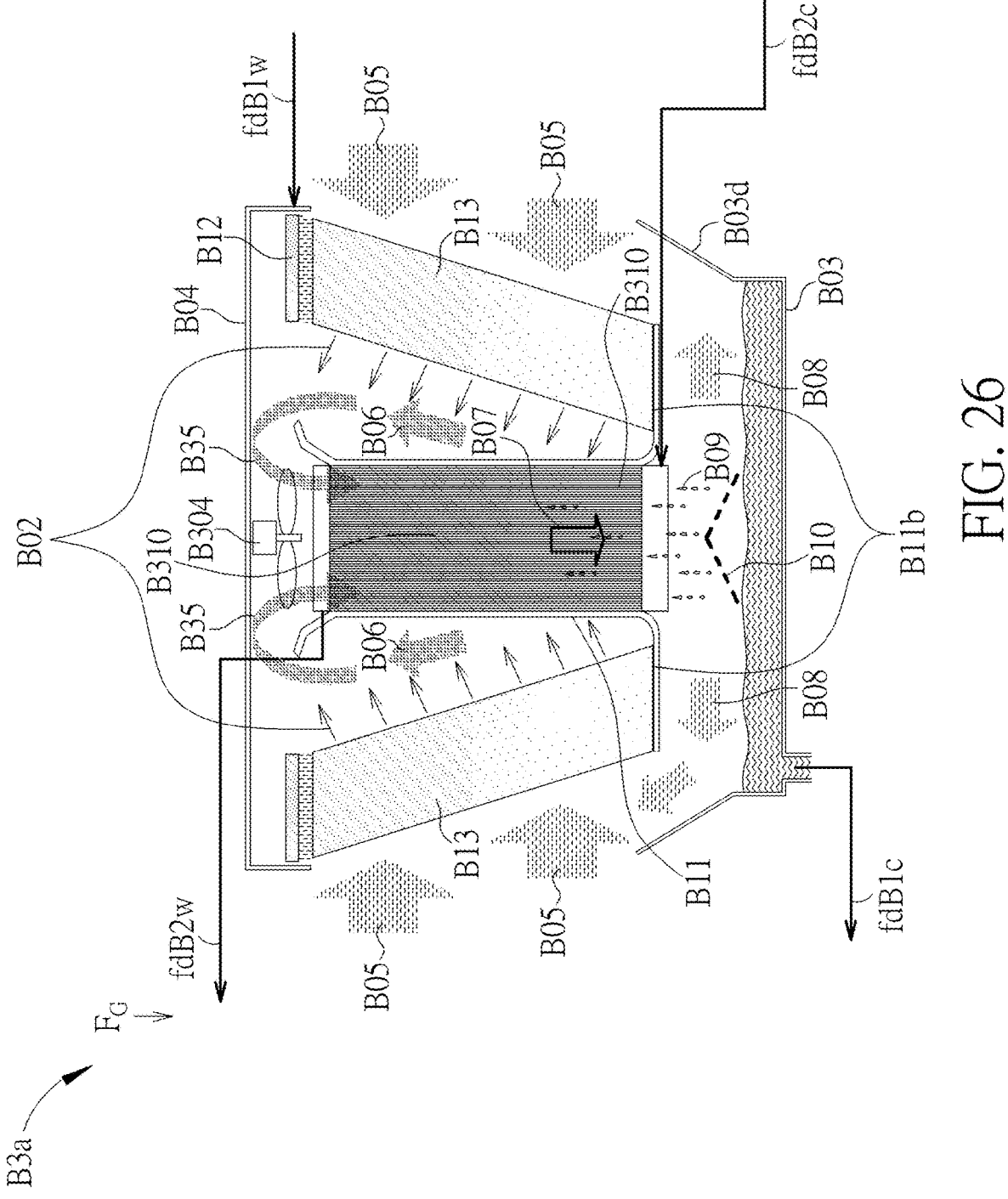

FIG. 26 illustrates a schematic diagram of a cooling tower according to an embodiment of the present invention.

Figure 27:
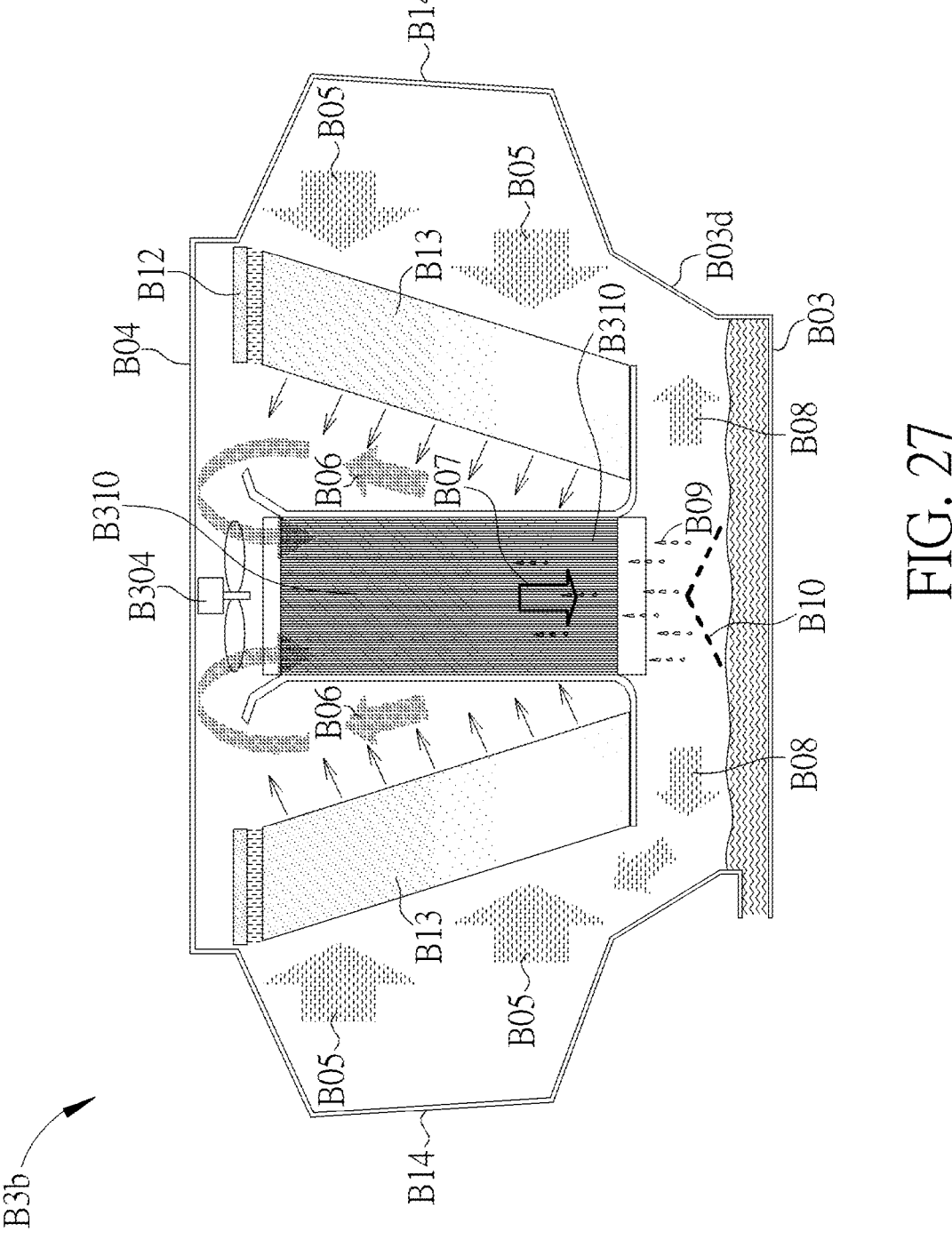

FIG. 27 illustrates a schematic diagram of a cooling tower according to an embodiment of the present invention.

FIG. 27 illustrates a schematic diagram of a cooling tower, a heat harvesting system and a heat source according to an embodiment of the present invention.

Figure 28:
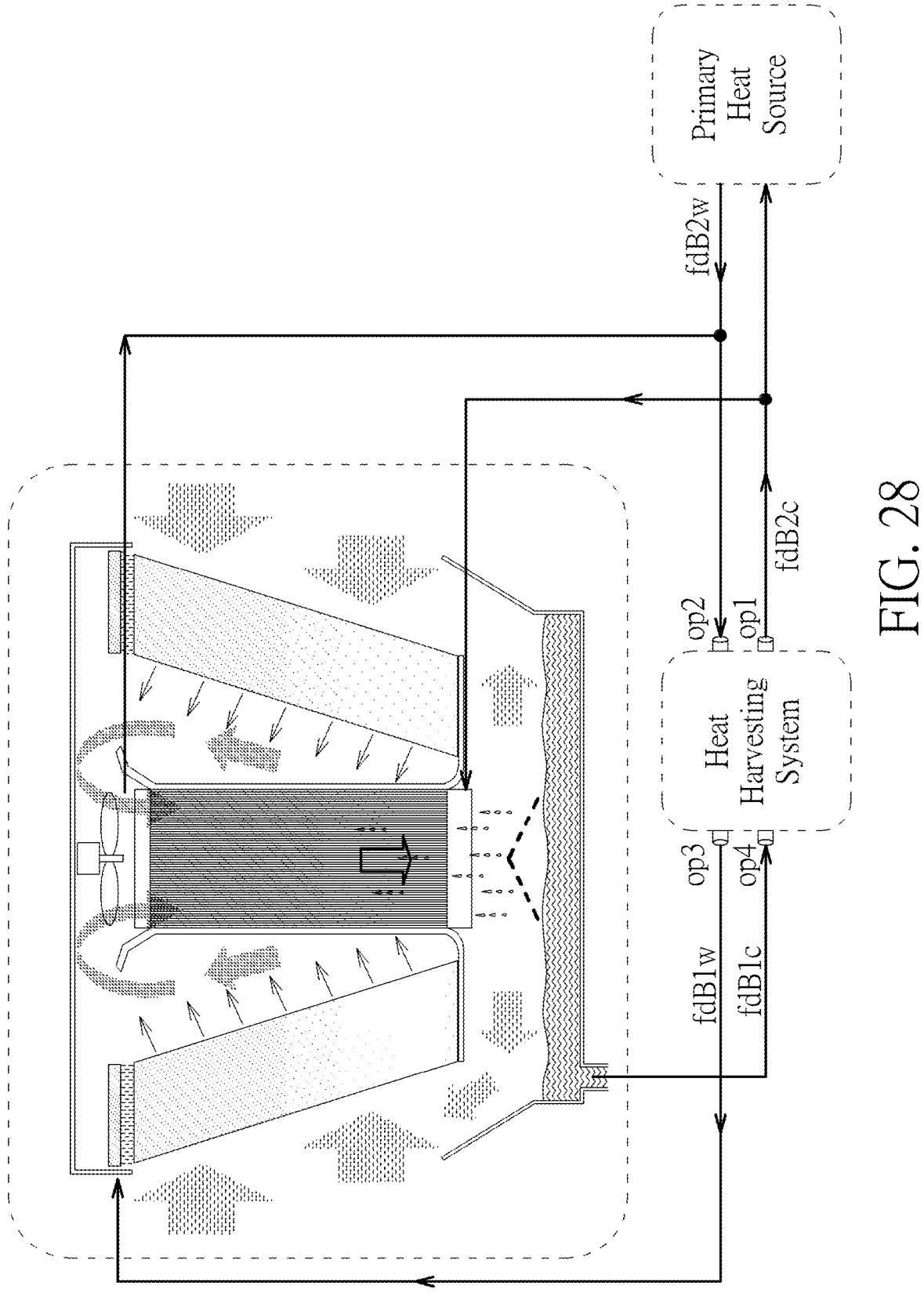

FIG. 28 illustrates a schematic diagram of a heat harvesting system according to an embodiment of the present invention.

Figure 29:
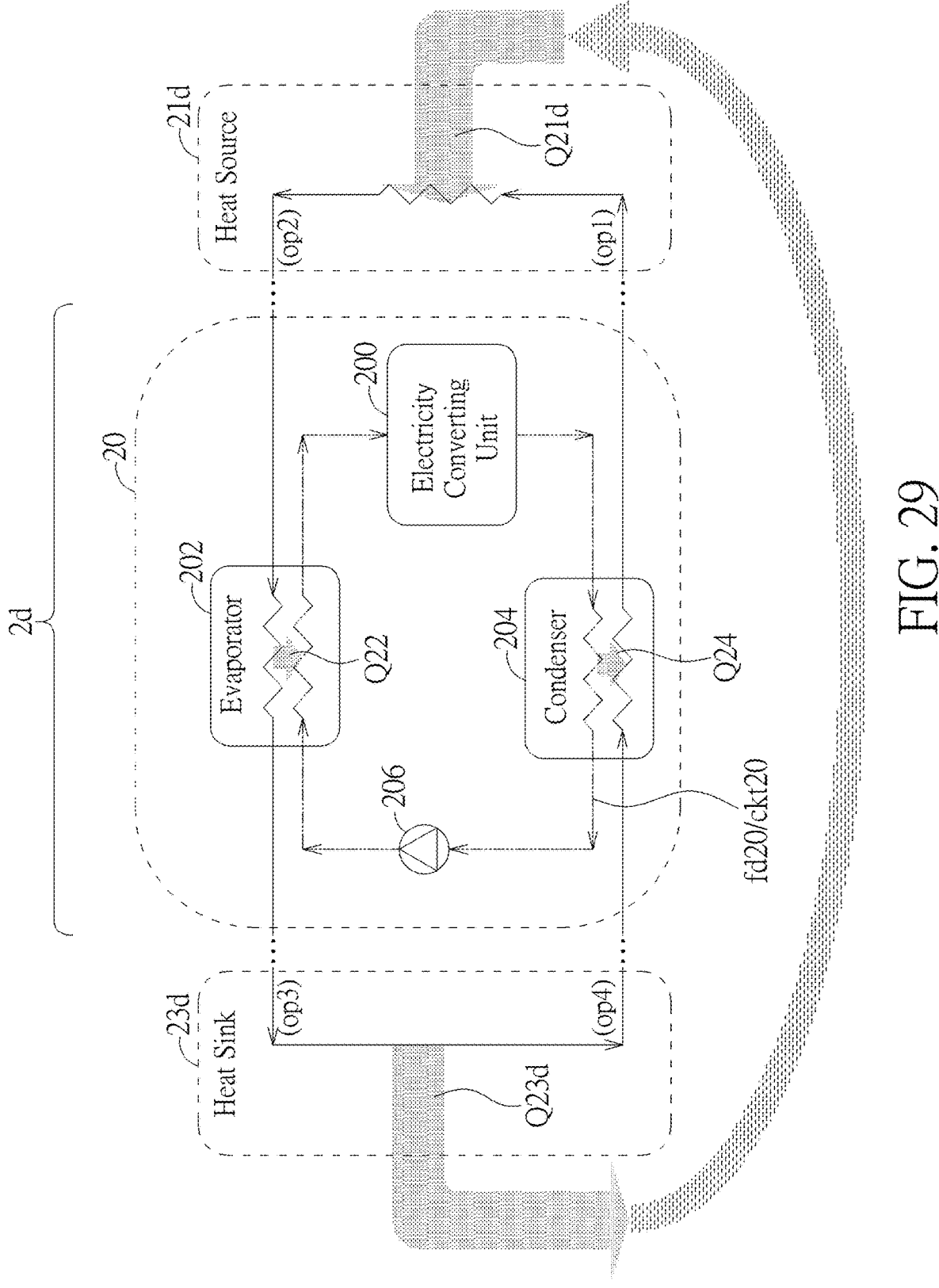
Figure 30:
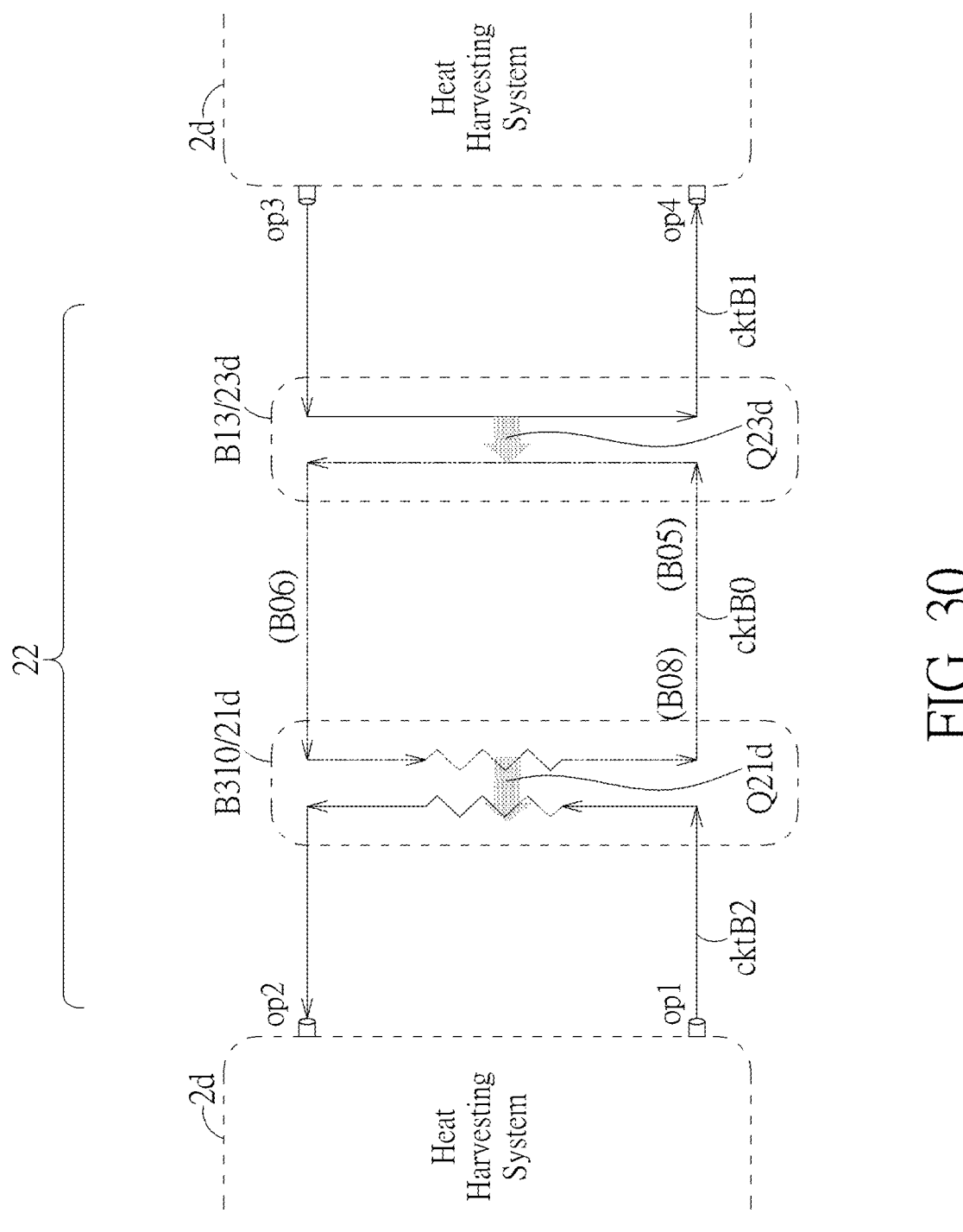
Figure 31:
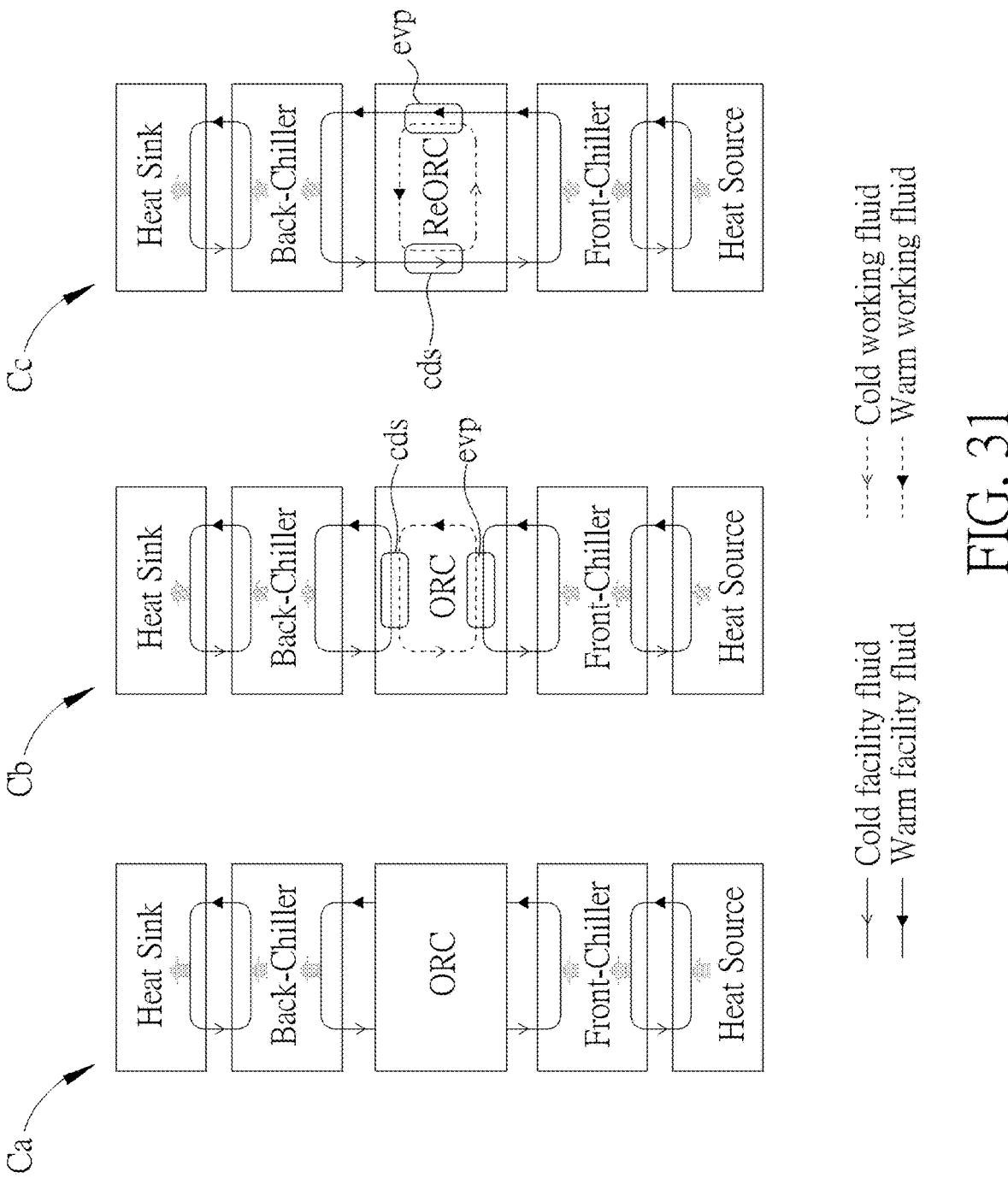

FIG. 29 and FIG. 30 illustrate heat flow diagrams regarding a HH cooling tower and a heat harvesting system of the present invention FIG. 31 illustrates a schematic diagram of heat harvesting systems of the present invention.

Figure 32:
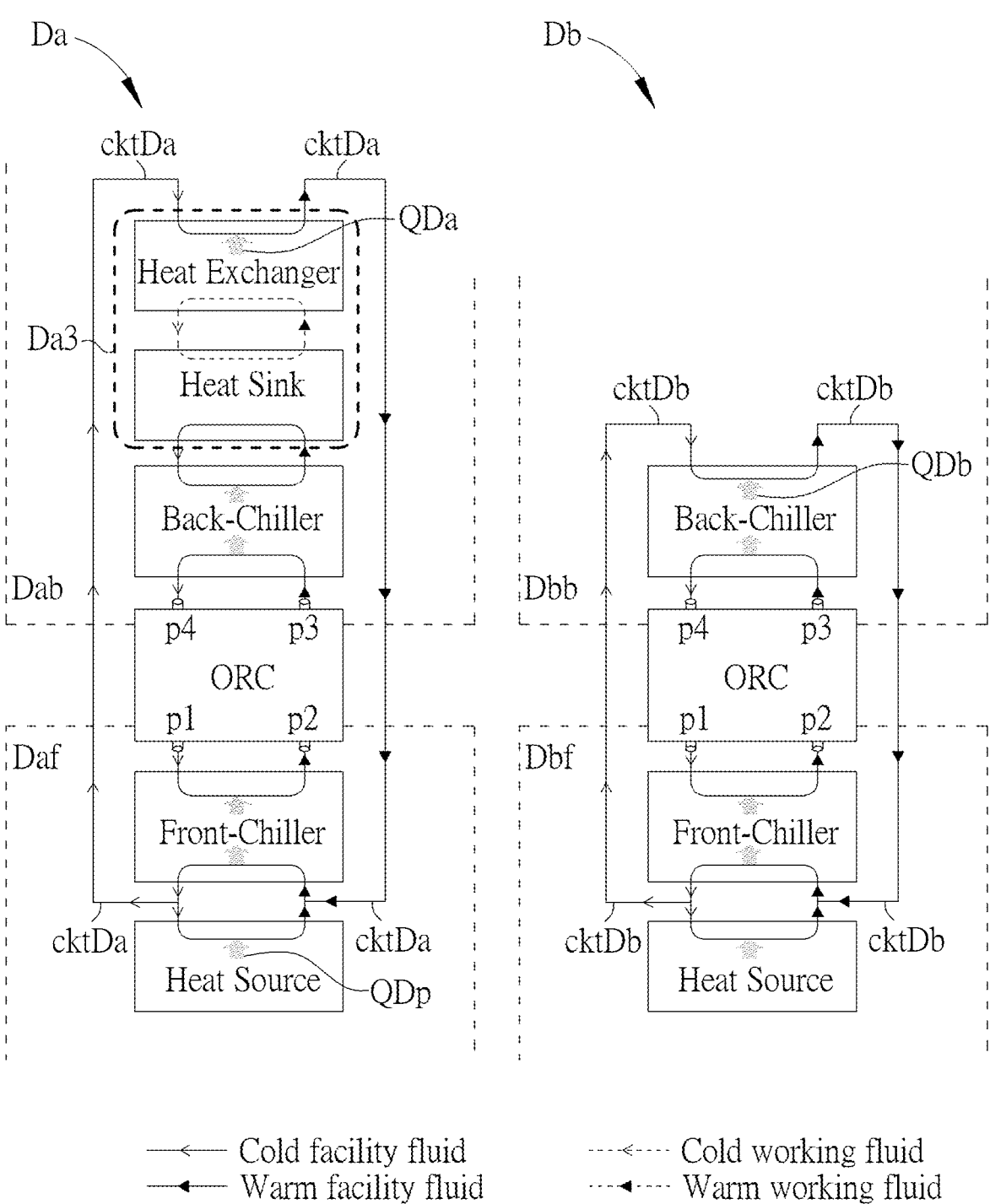

FIG. 32 illustrates a schematic diagram of heat harvesting systems of the present invention.

Figure 33:
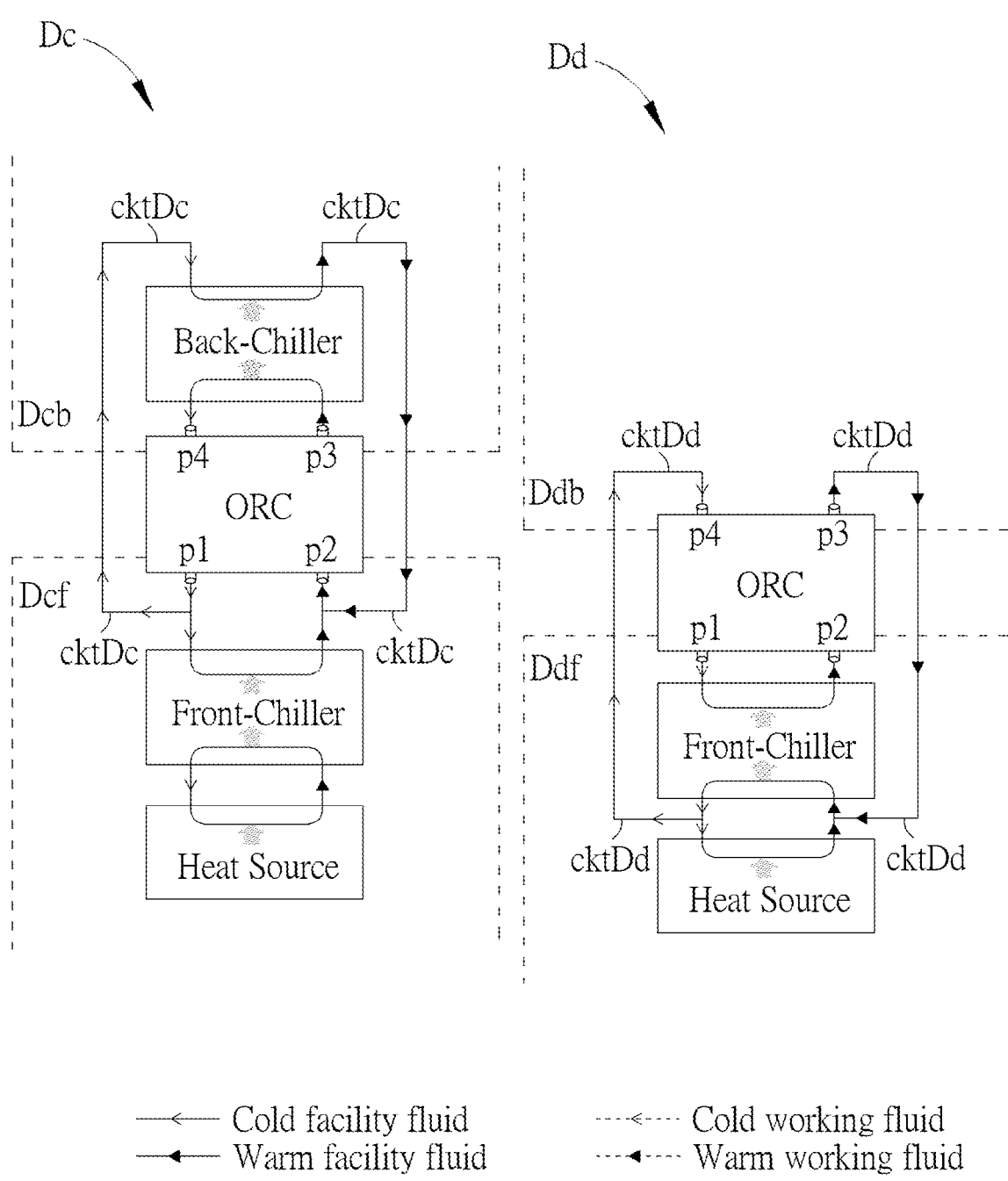

FIG. 33 illustrates a schematic diagram of heat harvesting systems of the present invention.

Figure 34:
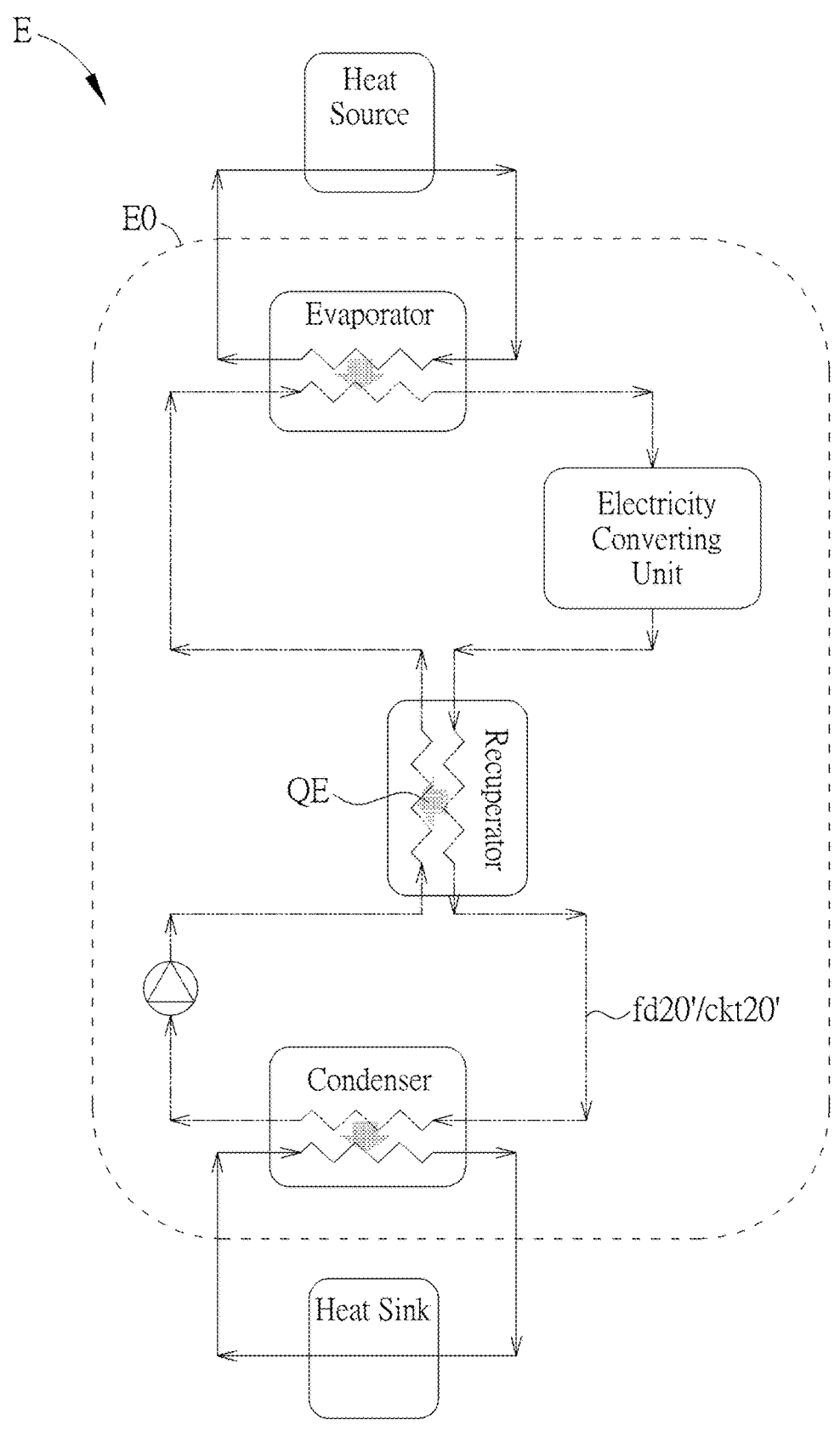

FIG. 34 illustrates a schematic diagram of an ORC with a recuperator.

Figure 35:
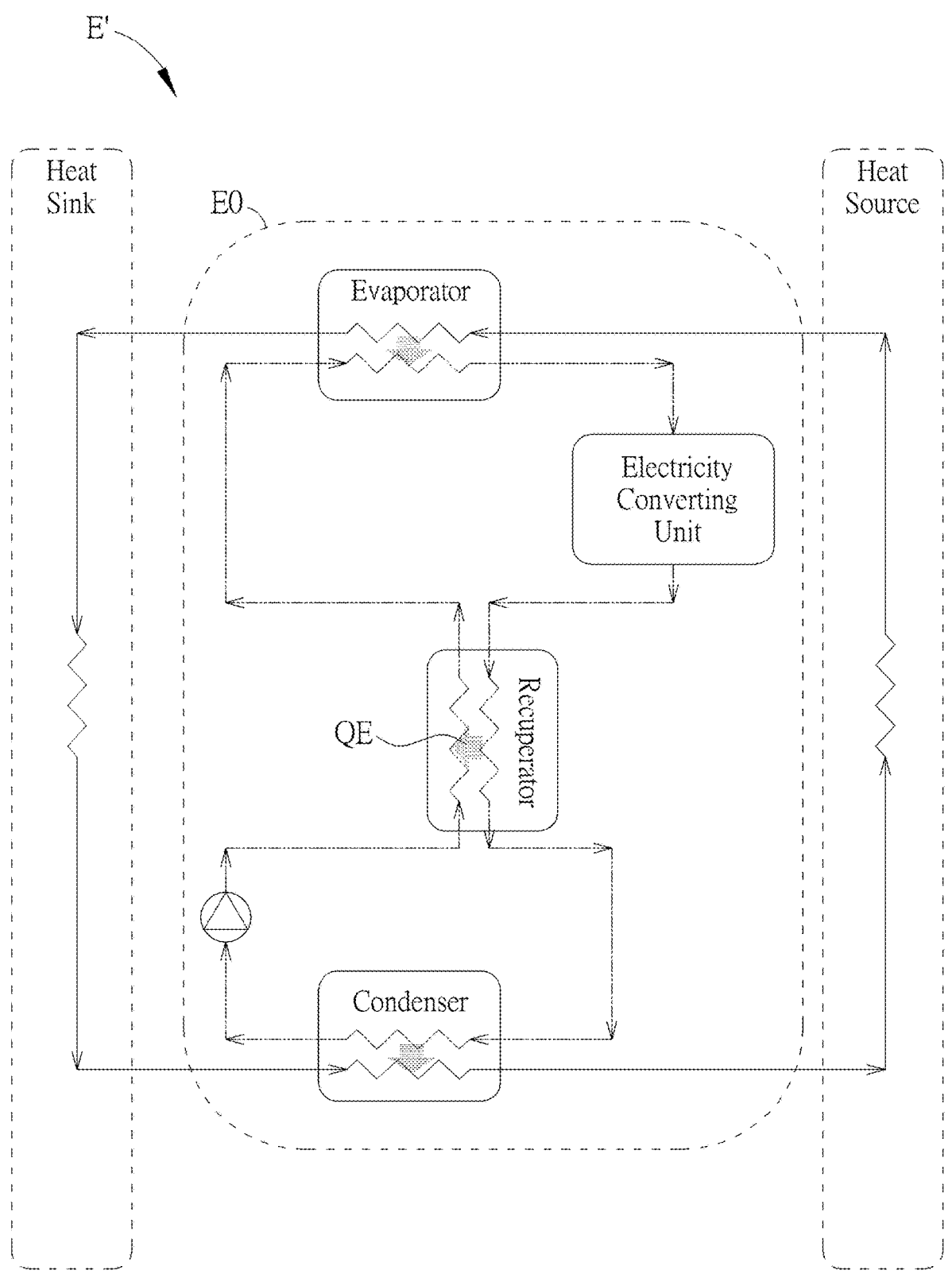

FIG. 35 illustrates a schematic diagram of a heat harvesting system according to an embodiment of the present invention.

Figure 36:
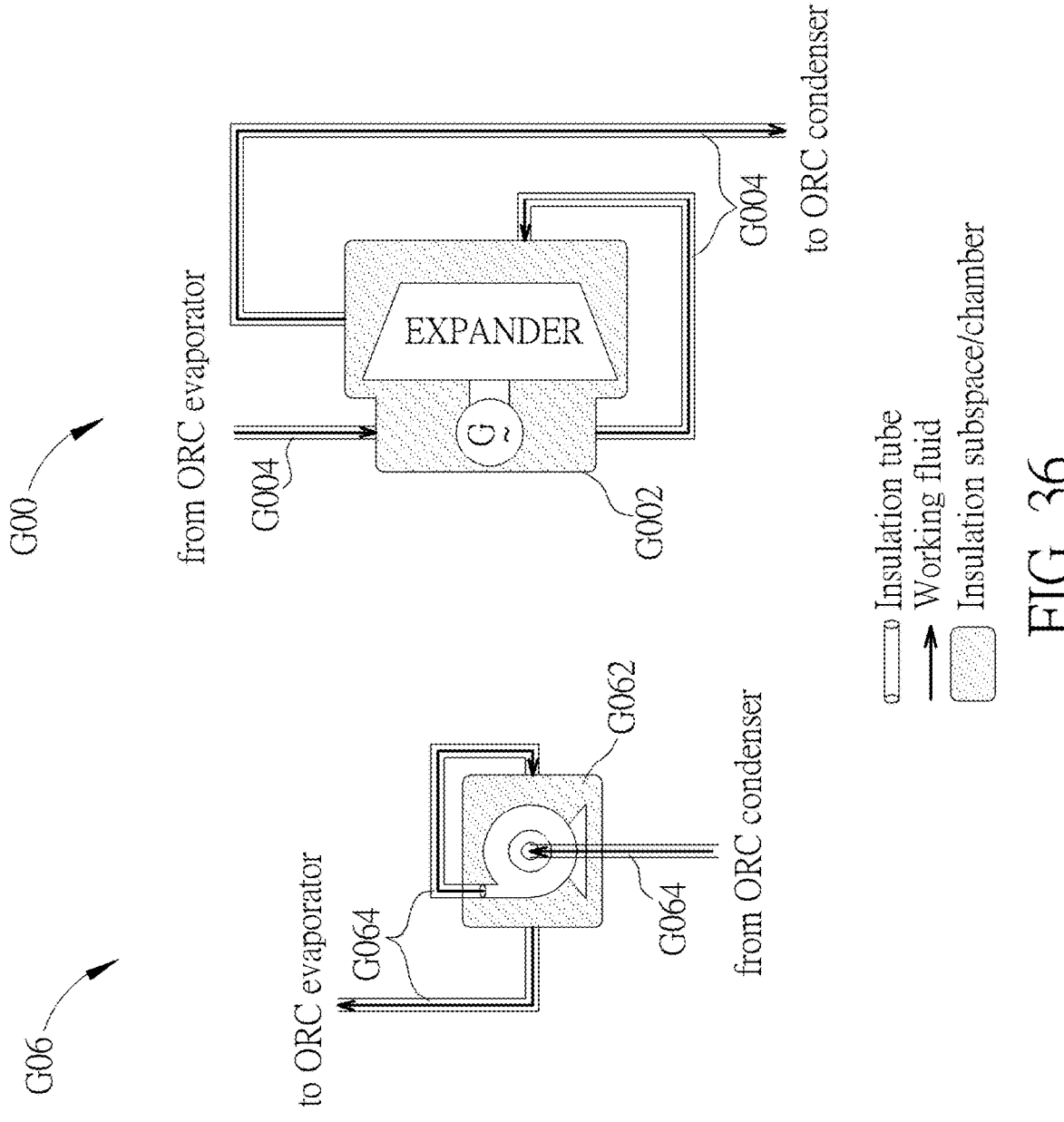

FIG. 36 illustrates a schematic diagram of an encapsulated pump and an encapsulated electricity converting unit.

DETAILED DESCRIPTION

Figure 1:
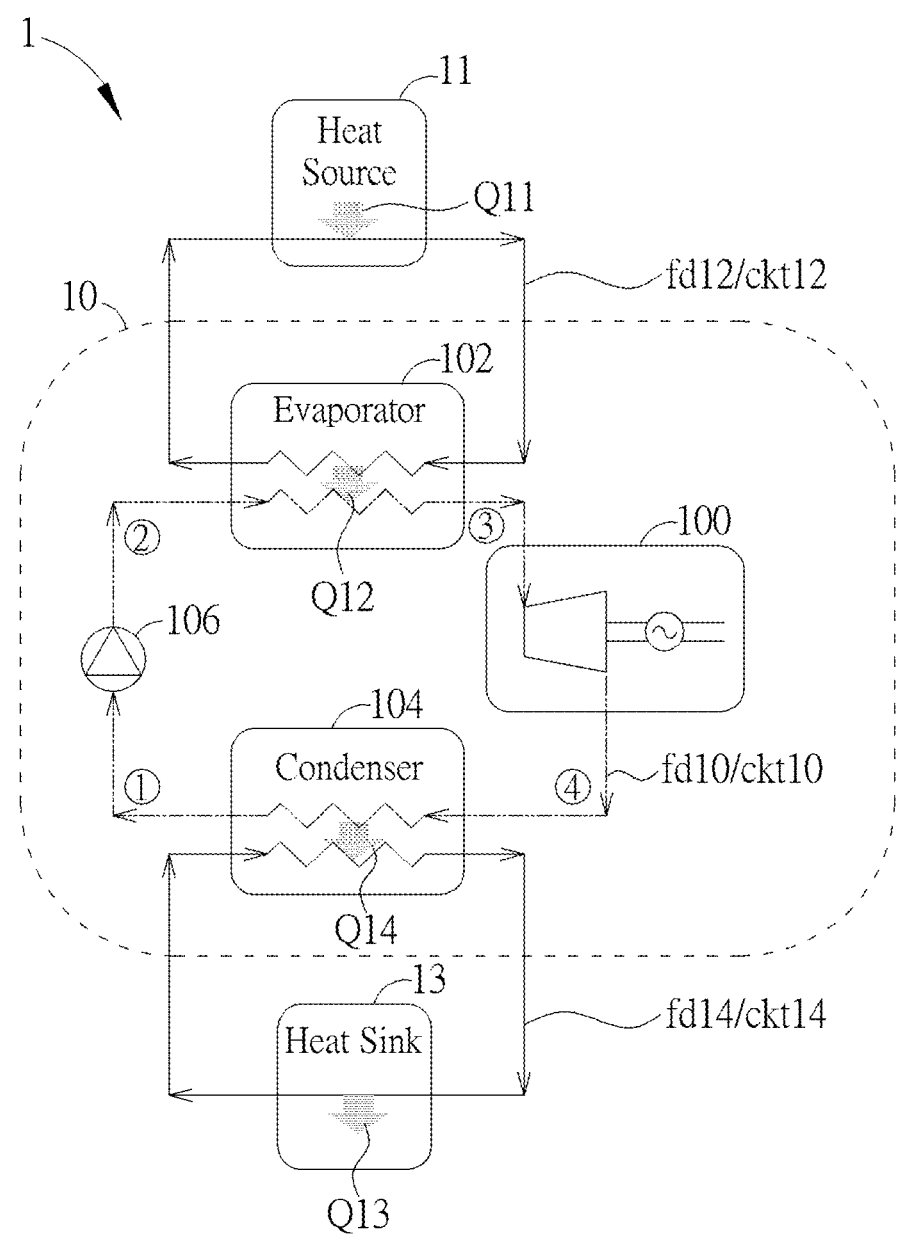
FIG. 1 is a schematic diagram of a heat harvesting system in the art.

FIG. 1 is a schematic diagram of a heat harvesting system 1 in the art. The heat harvesting system 1, as a thermal power system which converts energy from one form to another, absorbs heat from heat source, and converts the heat into mechanical power or into electricity.

The heat harvesting system 1 comprises an organic Rankine cycle (ORC) generator 10. The ORC generator 10 comprises an electricity converting unit 100, an ORC evaporator 102, an ORC condenser 104 and a compressor (pressure increaser) 106. A closed loop, cycle or circuit ckt10 of a fluid fd10 is formed within the ORC generator 10, where the fluid fd10 may be considered as a working fluid of the ORC (generator). Within the organic Rankine cycle, the (working) fluid fd10 in status ① (as low pressure liquid) may be compressed by the compressor 106 (which may be a pump) to status ② (as high pressure liquid), evaporates in the ORC evaporator 102 to status ③ (as high pressure vapor/gas). The (working) fluid fd10 in status ③ may be used to drive turbine (expander) in electricity converting unit 100 to generate electricity. After that, the fluid fd10 in status ④ (as low pressure vapor/gas) condenses in the ORC condenser 104 back to status ①.

In addition to the circuit ckt 10, circuit ckt 12 between a heat source 11 and the ORC evaporator 102 and circuit ckt 14 between a heat sink 13 and the ORC condenser 104 are also formed. Within the circuit ckt 12, a fluid fd12 (usually facility fluid, i.e., water) absorbs a heat Q11 from the heat source 11 and rejects a heat Q12 to the (working) fluid fd10 in the ORC evaporator 102. On the other hand, in the ORC condenser 104, the (working) fluid fd10 rejects a heat Q14 to a fluid fd14 (usually facility fluid, i.e., water) via the circuit ckt 14 and the fluid fd14 rejects a heat Q13 in the heat sink 13.

In a thermal system (with a thermodynamic cycle), working fluid and facility fluid have distinct roles. Working fluid is the medium that absorbs, transports, and releases energy within between the system's components (e.g., boiler, turbine, condenser, compressor, or evaporator). The working fluid is considered as a primary fluid within the thermodynamic cycle that directly undergoes changes in its thermodynamic state (e.g., temperature, pressure, or phase) to achieve the system's main function, which is typically energy conversion or heat transfer. Facility fluid, on the other hand, acts as a medium to transfer heat to or from the working fluid in heat exchangers (e.g., boilers, condensers, evaporators), which helps to establish the necessary temperature differences for heat transfer to occur. The facility fluid is considered as a secondary fluid used to support the operation of the thermal system but does not directly participate in the main thermodynamic cycle for energy conversion. Facility fluid is typically used for auxiliary purposes like heat input or heat rejection. Facility fluid can be facility water, deionized liquid/water, mineral oil, etc., but not limited thereto. Facility fluid may have specific (chemical) properties such as anti-corrosion, anti-fungal, etc.

Specifically, the ORC condenser 104 usually receives cold facility fluid fd14 (the fluid fd14 with low temperature) from the heat sink 13 and returns warm facility fluid fd14 (i.e., temperature higher than the one received) to the heat sink 13. Herein, the heat sink 13 may be cooling towers, chillers, geothermal loops, rivers, lakes or ocean. In other words, when the heat Q14 is rejected to the fluid fd14, it would be dissipated eventually and would not come back. The rejected heat would form another kind/form of waste heat discharged to the environment and there is no way in the system 1 to harvest this kind of waste heat.

If the heat rejected from the ORC condenser (e.g., Q14) can be recycled back to the ORC loop (for converting the electricity), a heat recovery/harvesting ratio of the heat harvesting system shall be enhanced.

Traditional Organic Rankine Cycle (ORC) systems face a fundamental thermodynamic limitation in their ability to efficiently utilize low-grade waste heat. The core of this issue stems from the expansion process in the system's expander, which converts thermal energy into mechanical work. As the working fluid expands, its temperature and pressure drop significantly. This results in the working fluid exiting the expander at a low temperature, which in turn limits the effective temperature difference ($\Delta T$) available for subsequent heat exchange. According to the second law of thermodynamics and the Carnot efficiency principle, the maximum efficiency of a heat engine is dependent on the temperature difference between the hot and cold reservoirs. Since the waste heat available for recovery in a conventional ORC system is often at a low temperature, and the working fluid itself is at an even lower temperature after expansion, the potential to recover this heat efficiently is severely constrained. This leads to a low, and in some cases, negligible thermal efficiency for such waste heat recovery efforts.

The present invention addresses these limitations by introducing three novel approaches to elevate the temperature of the available waste heat, thereby increasing the overall thermodynamic efficiency of the system.

First, the Reheating method involves collecting waste heat from external heat sources using a separate facility fluid. This fluid is then channeled through the primary heat source of the ORC system, effectively using the high-temperature reservoir to raise the temperature of the collected waste heat before it is introduced into the ORC. This approach leverages an external, high-temperature source to enhance the quality of the waste heat.

Second, the Preheating alternative directly integrates waste heat recovery into the ORC. Waste heat is collected by the ORC's working fluid in its liquid state. This collected heat is then used to preheat the working fluid before it enters the evaporator. By raising the temperature of the fluid at the evaporator inlet, the system's overall heat absorption capacity is increased, leading to higher thermodynamic cycle efficiency.

Lastly, a dedicated Heat Pumping stage is integrated into the system to directly elevate the temperature of the waste heat. This can be strategically placed at various points within the system, such as between the evaporator inlet and the heat source, or between the condenser outlet and a recuperator. The heat pump utilizes a small amount of external work to transfer thermal energy from a low-temperature source to a higher-temperature sink, thereby making the waste heat more usable for the ORC.

Figure 2:
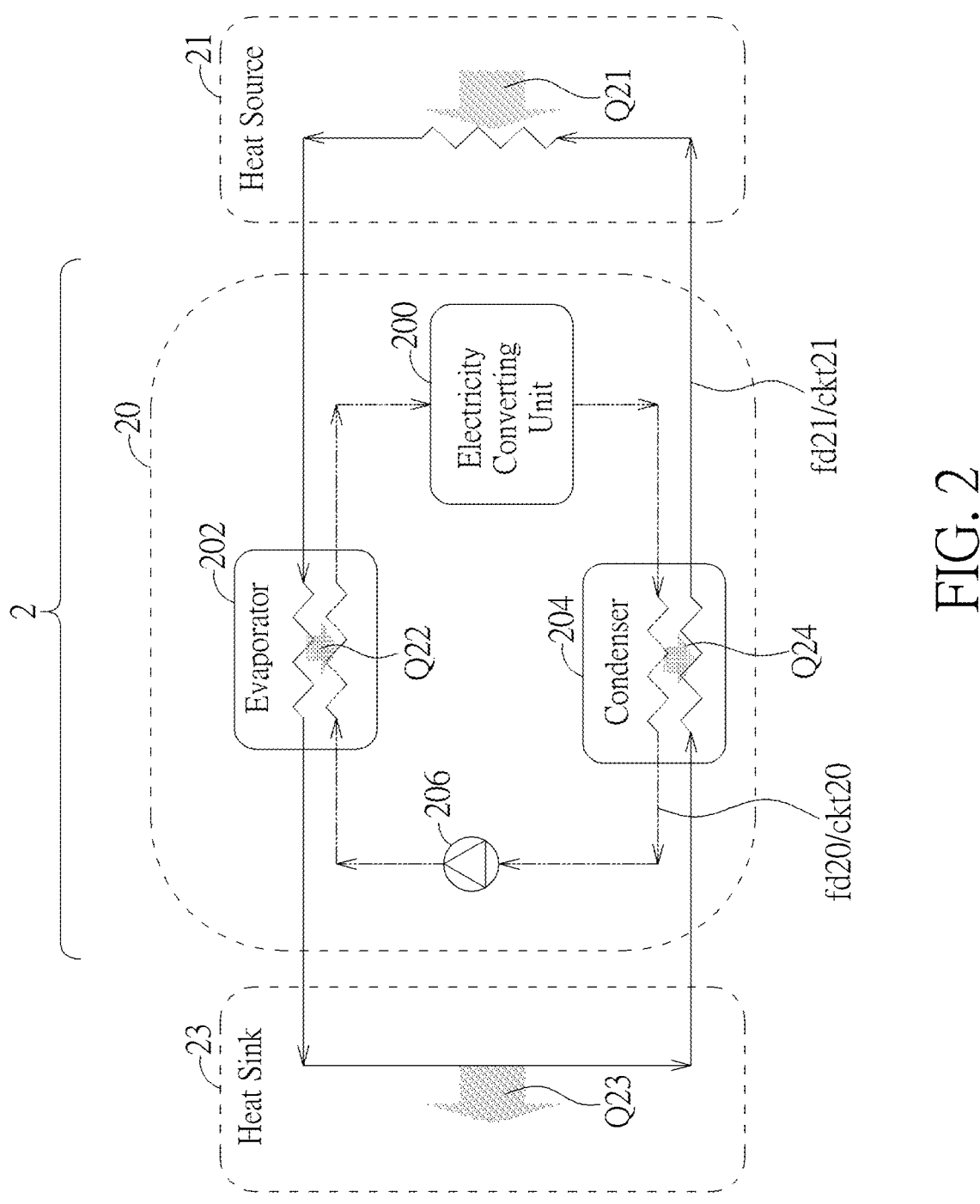
FIG. 2 illustrates a schematic diagram of a heat harvesting system according to an embodiment of the present invention.

FIG. 2 illustrates a schematic diagram of a heat harvesting system 2 according to an embodiment of the present invention. The heat harvesting system 2 attempts to recycle the unharvested heat from the ORC condenser by recirculating/outputting the facility fluid output from condenser 204 to heat source 21 and subsequently, after the facility fluid is reheated by heat source 21, directing the facility fluid back to evaporator 202 where heat is transferred to ORC 20 for harvesting. After passing evaporator 202, the facility fluid goes into the heat sink 23 where some of the excess heat may be rejected and the facility fluid then returns to condenser 204 of ORC 20.

In the present application, heat source may represent an entity which receives a fluid, rejects a heat to the received fluid, and returns the fluid (as warm fluid) which transports the heat back to where it is from. The heat source, usually comprising heat exchanger, may generally refer to or be associated with a man-made machinery, machine, system, device, apparatus, etc. For example, the heat source may be associated with a data center, a HVAC (Heating, Ventilation, and Air Conditioning) system, a CRAC (Computer Room Air Conditioning) system, etc., which has heat needed to be dissipated. Moreover, the heat source may also be associated with natural environment such as hot atmosphere, geothermal area, etc. More generally, heat source in the present application may also represent source of heat, literally. In the context of ORC generator, heat source in the present application may also represent source which provides/rejects heat to certain (thermodynamic) cycle/circuit.

Heat sink, on the other hand, may represent an entity which receives a warm fluid, rejects heat from the received warm fluid and provides a cold fluid (usually facility fluid). The heat sink may generally refer to or be associated with a man-made machinery, machine, system, device, apparatus, etc., such as cooling tower, chiller, etc. Moreover, the heat sink may also be associated with natural environment such as geothermal loops, rivers, lakes or the ocean.

As can be seen from FIG. 2, the heat harvesting system 2, comprising an organic Rankine cycle (ORC) generator 20, is connected to a heat source 21 and a heat sink 23.

Moreover, the ORC generator 20 comprises an electricity converting unit 200, an ORC evaporator 202, an ORC condenser 204 and a compressor (or a pump) 206.

Similar to system 1, a closed loop, cycle or circuit ckt20 of a fluid 20 is formed within the ORC or ORC generator. The fluid 20 may be considered or function as a working fluid of the ORC or ORC generator, which may be coolant, refrigerant, etc. For example, engineered fluid such as 3M™ Novec™ 649/7000/7100 or coolant R1233zd(E), R1234ze (Z), R245fa, etc. may be used as fluid 20 of the present invention, but not limited thereto. Through the loop or circuit ckt20, the evaporator 202 rejects a heat Q22 from circuit ckt21 to circuit ckt20 and the condenser 204 rejects a heat Q24 from circuit ckt20 to circuit ck21.

Different from system 1, one cycle, instead of two cycles, of circuit ckt21 of a fluid fd21, which may be facility fluid, is formed surrounding the ORC or ORC generator. Heat source 21 injects energy/heat Q21 onto fd21 raising temperature of fd21 to high-temp; when high-temp fd21 passes through Evaporator 202, a portion of heat carried by fd21 is ejected to fd20, lowering temperature of fd21 from high-temp to mid-temp; after fd21 passed through Evaporator 202, mid-temp fd21 enters heat sink 23 where additional heat may be rejected, lowering temperature of fd21 to low-temp; when low-temp fd21 passes through Condenser 204, heat Q24 is ejected from mid-temp fd20 to low-temp fd21, raising temperature of fd21 coming out of Condenser 204 to mid-low-temp; this mid-low temp fd21 then enters heat source 21 where its temperature is again raised to high-temp due to heat injected by heat source 21, and the loop repeats.

In the present application, terms like "cycle", "(closed) loop", "circuit", and "circulation" under thermodynamic context are sometimes used interchangeably. The term "ORC generator" sometimes is abbreviated as simply "ORC". Term of "temp" means "temperature".

Different from the system 1, where fd12 is provided by and returned to evaporator 102, in system 2, the fluid fd21 (usually known/considered as facility fluid, e.g., facility water) is provided by condenser 204 to the heat source 21 and returned from heat source 21 to evaporator 202. While flowing through the heat source 21, the facility fluid fd21 absorbs a heat Q21 from the heat source 21. In addition, while flowing through the ORC condenser 204, the facility fluid fd21 absorbs the heat Q24 from the working fluid fd20. Note that, the heat source 21 is external to the cycle ckt21 of fluid fd21 and provides the heat Q21 to the fluid fd21.

Note that, within the system 1, the heat Q11 from the heat source 11 is the only source of heat when the evaporator 102 rejects the heat Q12 to the circuit ckt10. In comparison, within the system 2, source of heat Q22 within the evaporator 202 to be rejected to the circuit ckt20 comprises not only the heat Q21 from the heat source 21, but also the heat Q24 from the condenser 204, meaning more heat can be delivered to the circuit ckt20, which implies more electricity can be generated by the electricity converting unit 200, compared to system 1.

Furthermore, in system 2, the heat Q24 would no longer be dissipated away due to the difficulty in harvesting mid-low-temp heat. Instead, Q24 is reheated to high-temp by heat source 21, allowing Q24 to be harvested by ORC generator 20. As a result, from recycling heat Q24 point of view, heat harvesting system 2 reduces waste heat by recycling (i.e., re-harvesting) the difficult-to-harvest mid-low temp heat Q24 through the heat source and, thereby, improve the waste heat harvesting ratio of system 2.

Figure 3:
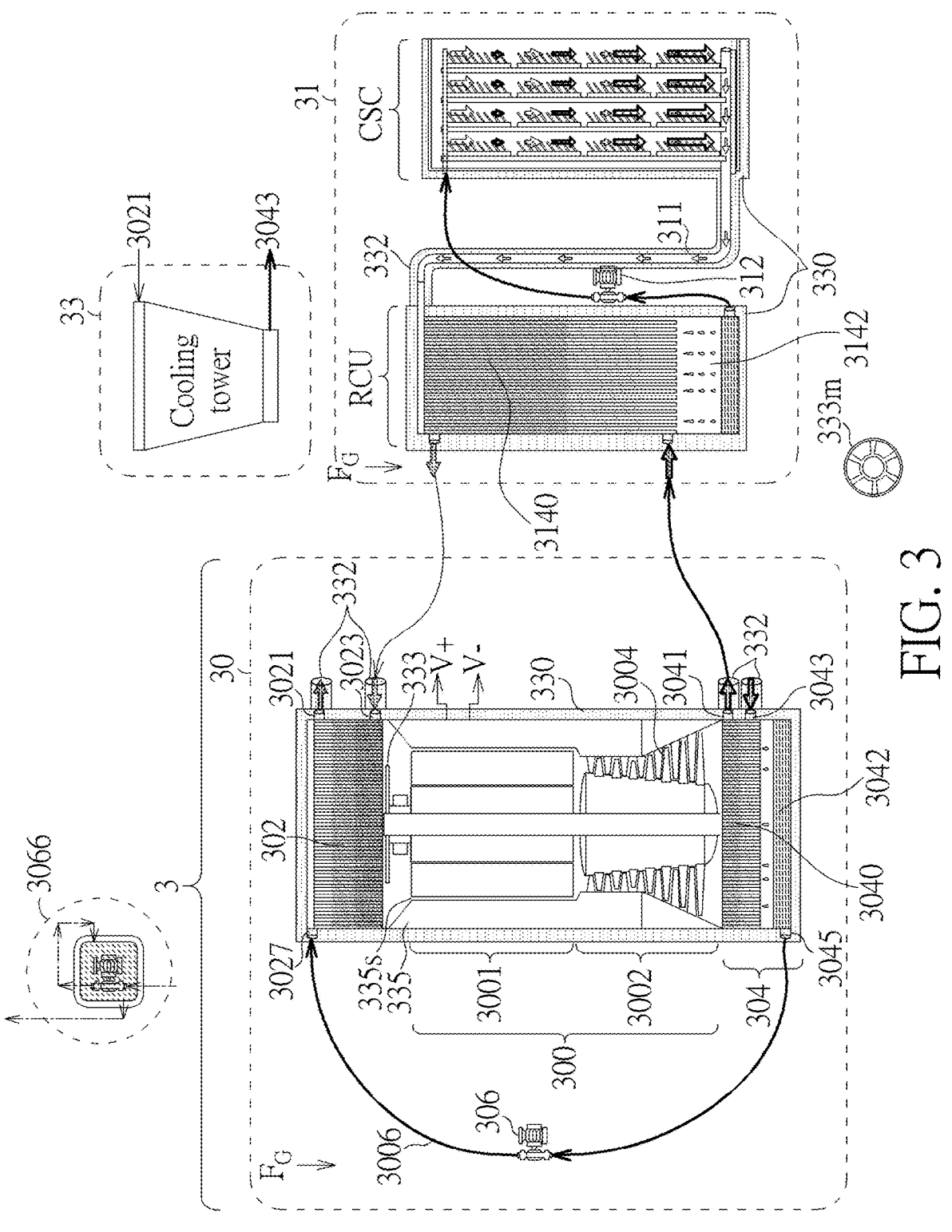
FIG. 3 illustrates a schematic diagram of a heat harvesting system according to an embodiment of the present invention.

Practically, FIG. 3 is a schematic diagram of a heat harvesting system 3 according to an embodiment of the present invention. The heat harvesting system 3, suitable for harvesting heat generated by GPU or computer server racks, comprises an ORC generator 30 connected to a heat source 31 and a heat sink 33.

The heat source 31 itself may be (or comprise) a cooling system or a heat dissipation system (also denoted as 31), which may be disposed by or within a server rack within a data center (will be illustrated later). The cooling system (or heat dissipation system) 31 configured to perform a cooling process (or a heat dissipation process) on a data computation system in the data center.

The heat source (cooling system or heat dissipation system) 31 may comprise a coolant chamber CSC and a coolant condensing unit RCU, configured to dissipate heat generated by (or to cool down) computing devices such as CPU/GPU (central/graphic processing unit) disposed within the chamber CSC. The heat generated by the computing devices (also regarded as heat generating devices) may be viewed as waste heat, which is to be recycled or harvested by the heat harvesting system 3.

A way of dissipating the heat generated by the computing devices is via vaporization. Specifically, by disposing circuit boards within the chamber CSC vertically and showering the circuit boards or the computing devices with liquid coolant (as fluid fd22, which will be discussed later) from sprinklers atop chamber CSC, the heat generated by the computing devices can be dissipated via evaporation latent heat absorption by vaporizing the liquid coolant into gaseous coolant or coolant vapor. The coolant vapor is then transported to the coolant condensing unit RCU, via, e.g., a tube 311. The coolant condensing unit RCU (similar to condenser) comprises a heat exchanger 3140 configured to condense the coolant vapor back to liquid coolant, and comprises a coolant tank 3142 configured to store condensed coolant dripping down from the heat exchanger 3140 due to gravity force FG. The cooling system (or heat source) 31 may comprise a pump 312 to pump the liquid coolant stored in the coolant tank 3142 to sprinklers atop chamber CSC so that the liquid coolant can be again used to shower the circuit boards or the computing devices. The heat generated by the computing devices is transformed as latent heat of the vaporization process in the chamber CSC and is transported to the coolant condensing unit RCU via the coolant vapor.

A step of harvesting heat generated by the computing devices is via heat exchanging and/or condensation. Specifically, by receiving the coolant vapor from the chamber CSC and receiving cold facility fluid (e.g., facility water), a condensation process of coolant vapor back to liquid coolant happens in the heat exchanger 3140, where the cold facility fluid herein is to facilitate the condensation process. Latent heat of the condensation process is released or rejected to the facility fluid while the facility fluid flowing through the heat exchanger 3140.

The heat exchanger 3140 receives cold facility fluid from the ORC generator 30, rejects the condensation latent heat from coolant vapor to the (cold) facility fluid, and returns warm facility fluid back to the ORC generator 30.

In the present application, warm facility fluid carries/transports heat to be rejected to another fluid/cycle/loop/circuit, while cold facility fluid has sufficiently low temperature to absorb heat from another fluid/cycle/loop/circuit.

The ORC generator 30 comprises an electricity converting unit 300, an ORC evaporator 302, an ORC condenser 304 and a pump 306. The ORC evaporator 302 receives the returned warm facility fluid, through a port 3023, from the heat exchanger 3140, exploits the heat transported on the warm facility fluid to vaporize a working fluid of the ORC (e.g., fluid fd20 shown in FIG. 2), and produces the (high-pressure) vaporized working fluid toward the electricity converting unit 300.

The electricity converting unit 300 comprises an alternator 3001 and a turbine (or other type of expander) 3002. The (high-pressure) vaporized working fluid would drive the turbine 3002 to rotate, and the rotating turbine 3002 would drive the alternator 3001 to generate electricity.

After driving the turbine 3002, pressure of the working fluid vapor drops, becomes low-pressure vapor, this low-pressure working-fluid vapor then goes through condenser 304 where working fluid vapor is condensed to the liquid phase. The condenser 304 comprises a heat exchanging part 3040 and a tank 3042. The heat exchanging part 3040 (similar to or the same as heat exchanger, e.g., 302) would receive a facility fluid to facilitate the condensation process of condensing the vaporized working fluid flowing out of the turbine into the liquid working fluid. The tank 3042 would collect the condensed liquid working fluid, which may, e.g., drip from the heat exchanging part 3040 by the action of gravity FG.

In an embodiment, the turbine 3002 may comprise a plurality of rotors 3004. As shown in FIG. 3, a size of the rotors 3004 may be gradually larger in a direction from the ORC evaporator 302 to the ORC condenser 304.

In an embodiment, the ORC generator 30 may comprise a funnel 335. The funnel 335 disposed between the ORC evaporator 302 and the alternator 3001, configured to concentrate the (gaseous) working fluid flowing toward the alternator 3001.

In an embodiment, a gap 335s is formed between the outer surface of stator and inner wall of funnel 335. Liquid working fluid may flow through the gap 335s achieving 2-phase cooling of the stator of the alternator 3001.

The pump 306 would pump the liquid working fluid from the tank 3042 back toward the evaporator 302, so that evaporator 302 vaporizes the working fluid (again and again).

In short, by exploiting the difference of vapor pressure (of properly chosen working fluid) at the temperature of warm facility fluid (entering ORC) and cold facility fluid (entering ORC), the ORC generator uses an expander (such as turbine) to turn the pressure difference into mechanical/kinetic energy and subsequently converts such kinetic energy into electricity.

Had a typical/prior-art ORC generator (e.g., the ORC 10) been used to cool and harvest the heat of an AI/datacenter, the cold facility fluid would have been connected to the "cold/source" inlet of the GPU/CPU racks (corresponding to inlet of exchanger 3140 in heat source 31) directly. However, in the heat harvesting system 3, the cold facility fluid for the heat source 31 is provided by the ORC condenser 304. That is, the cold facility fluid for the heat source 31 first flows through condenser 304 of ORC, goes in through port 3043, comes out through a port 3041, before it flows to heat source 31 (into inlet of exchanger 3140 of RCU).

In addition, in typical ORC arrangement, vapor produced by the ORC evaporator would be fed to expander (such as turbine) directly, would not pass through alternator, to converts thermal energy into mechanic (rotational) energy. And through a rotating shaft, the mechanic (rotational) energy is transmitted from the expander to alternator at a later stage where the coil conductors attached to the rotating shaft will convert mechanic (rotational) energy into electric energy. Note, in such arrangement vapor produced by the ORC evaporator would not pass through alternator.

Different from typical ORC generators, in the embodiment shown in FIG. 3, the vaporized working fluid passes through alternator 3001 first before it drives the turbine 3002. Note that when alternator generates electricity, heat is also produced due to factors such as electric current passing through coil winding resistance 22, mechanical resistance of rotating shaft bearings, etc. Such heat will be deemed as waste heat in typical ORC generator and discharged without further attention. Different from typical ORC generator, the heat produced by the alternator 3001 is carried away by the passing working fluid vapor, which not only lowers the temperature of alternator 3001 (thus lowering winding resistance, improving efficiency of alternator 3001) but also further heats up (akin to superheating) the passing vaporized working fluid produced by the ORC evaporator. Note that, by placing the alternator ahead of the expander (turbine), the working fluid vapor superheating effect, due to heat coming off alternator 3001, may reduce liquid slugging which may damage the turbine, enhancing thermodynamic efficiency; stabilize fluctuation of heat source; or even produce increase pressure difference available to expander (turbine) 3002 and produce more driving force, etc.

In addition, the ORC condenser (heat exchanging part) 3040 receives low-temp facility fluid via port 3043 from the heat sink 33, and the ORC evaporator (heat exchanging part) 302 returns the high-temp facility fluid to the heat sink 33 via a port 3021. In the embodiment shown in FIG. 3, heat sink 33 comprises a cooling tower.

Furthermore, to minimize leaking waste-heat to ambient across the entire system 3, the heat harvesting system 3 may be encapsulated. That is, the heat harvesting system 3 may optionally comprise thermal insulation layer(s) 330 to cover/encompass the ORC generator 30, the chamber CSC and/or the coolant condensing unit RCU. The thermal insulation layer 330 may form an insulation chamber/subspace and is configured to prevent thermal energy (within the insulation chamber) from dissipating. The heat harvesting system 3 may also optionally comprise thermal insulation tube(s) 332 connecting the ORC generator 30 and the heat source 31, connecting the ORC generator 30 and the heat sink 33, or connecting the chamber CSC and the coolant condensing unit RCU. Besides, a "mister" (or "mist generating device") 333, such as a plate with openings like 333m, may be placed atop sensitive area to break up large coolant drops into mist of tiny droplets. In other words, an embodiment, the mist generating device 333 may be disposed between the ORC evaporator 302 and the alternator 3001 and configured to chop drops into droplets of the working fluid.

Figure 4:
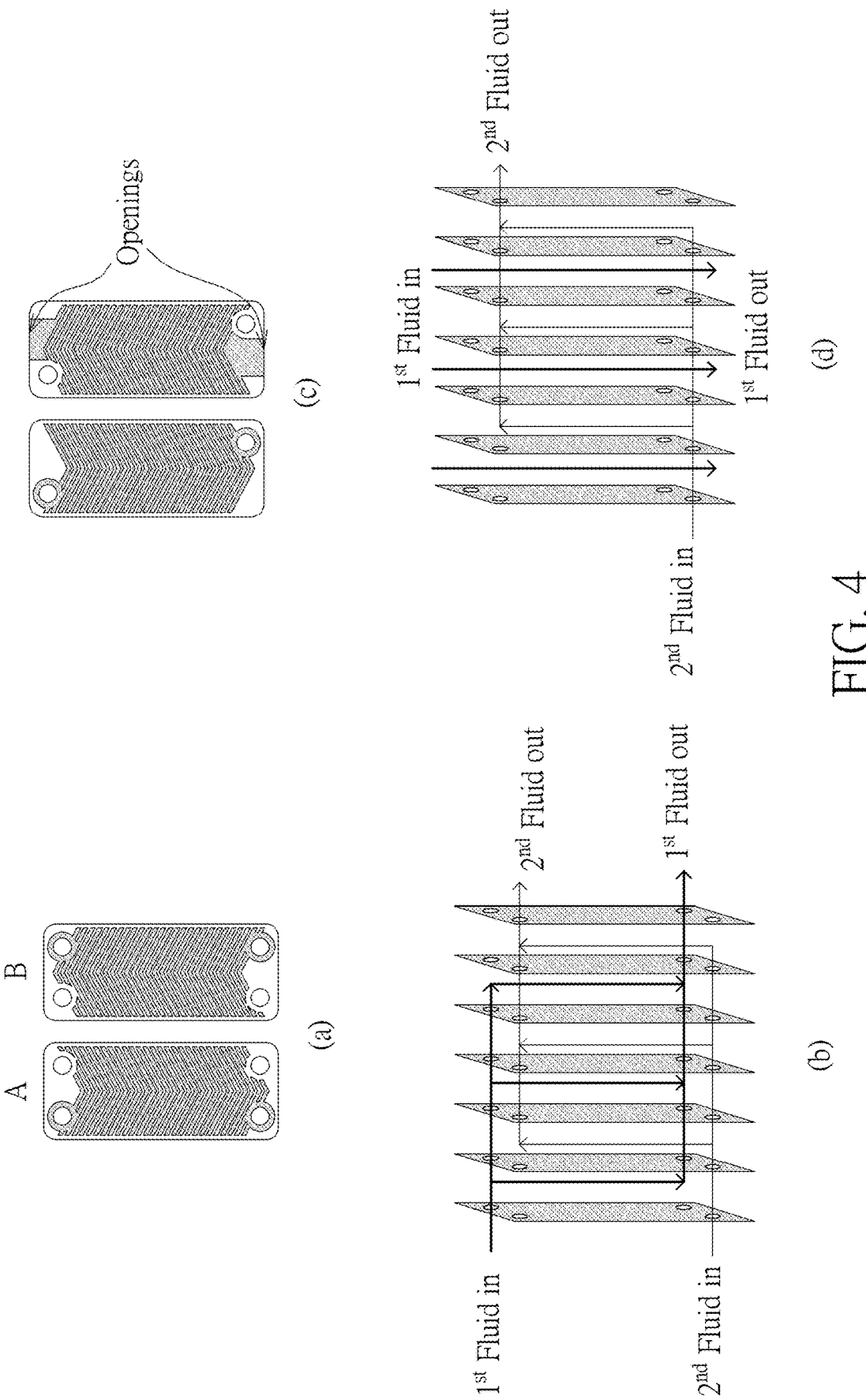
FIG. 4 illustrates schematic diagrams of heat exchangers according to an embodiment of the present invention.

FIGS. 4(a) and 4(b) illustrate commercial/convention plate heat exchanger and FIGS. 4(c)-4(f) illustrate a possible adaptation of such plate heat exchanger to be used as ORC evaporator (e.g., heat exchanging part 302) or ORC condenser (e.g., heat exchanging part 3040) in the present invention. Conventional plate heat exchangers comprise of two sets of metal plates with symmetrical grooves/surfaces such as shown FIG. 4(a). When such thin metal plates are stacked together, channels are formed between the concave groves of a plate (e.g., plate A) and the convex grooves of another plate (e.g., plate B) stacked atop the said plate (e.g., plate A), such channel allows a 1$^{st}$ fluid to flow in a first direction (e.g., downward) in one side of the plate and a 2nd fluid flow in the opposite/second direction (e.g., upward) in the other side of the place. The crisscross fishbone patterned grooves maximize the heat exchange between the two fluids (or the two liquid streams) flowing across the two sides of the metal plate.

Instead of having two sets of inlet-outlet to accommodate two streams of liquid, as shown in FIG. 4(c), the heat exchangers for ORC evaporator and ORC condenser may have only 1 set of inlet-outlet pair, which generally accommodates one stream, usually the facility fluid (such as low-temp facility-fluid return from heat-sink/cooling-tower, or high-temp facility-fluid return from heat source), while the other stream may be working fluid, which will go through phase change (either liquid→vapor in evaporator, or vapor→liquid in condenser) when passing through the plate heat exchanger via openings on the top and bottom of the heat-exchangers, as shown in FIGS. 4(c)-4(d).

Note the inlet and outlet for facility fluid are optionally placed diagonally, as shown in FIG. 4(c) or 4(d). Such diagonal placement may help improve the evenness of facility-fluid flow across the surface of the heat exchanger and thus optimize the heat-exchanging performance.

Note that, the heat harvesting system 2 and ORC with recuperator have fundamental differences. FIG. 34 illustrates an ORC with recuperator, denoted as E0, and corresponding system E. The recuperator receives the working fluid fd20' from the turbine or the electricity converting unit and from the condenser, and transfer residual heat (denoted as QE) from the working fluid from turbine to the working fluid from condenser, to "preheat" the working fluid before entering to the evaporator.

One difference between heat harvesting system 2 and system E (or ORC E0) is the medium which transports the recycled heat. The system E (or ORC E0) recycles the residual heat QE (see FIG. 34) via loop of working fluid (e.g., ckt20') while the heat harvesting system 2 recycles the heat Q24 (see FIG. 2) via loop of facility fluid (e.g., ckt21).

A second difference between heat harvesting system 2 and system E is facility fluid circulation. In system E or conventional ORC, the facility water circulation of heat sources or main waste-heat generating/rejecting system is separated from that of the ORC. In comparison, in system 2 the facility fluid circulation of heat source (e.g., 21, or main waste-heat generating/rejecting system) is embedded within the facility fluid circulation of entire system 2, wherein heat sink, ORC, and heat source are connected serially to form one loop (e.g., ckt21).

A third difference is in system perspective. The (heat harvesting) impact of "recuperator" is local, affecting a particular segment of the ORC. On the other hand, the (heat harvesting) impact of ReORC is global, affecting not only the ORC module but the main heat generating/rejecting system (or the heat source), i.e., the modification reaches beyond the scope of ORC. The term "ReORC" will be introduced later.

Note that, a system may implement both the Recuperator and ReORC, as shown in FIG. 35, which is also within the scope of the present invention.

Figure 5:
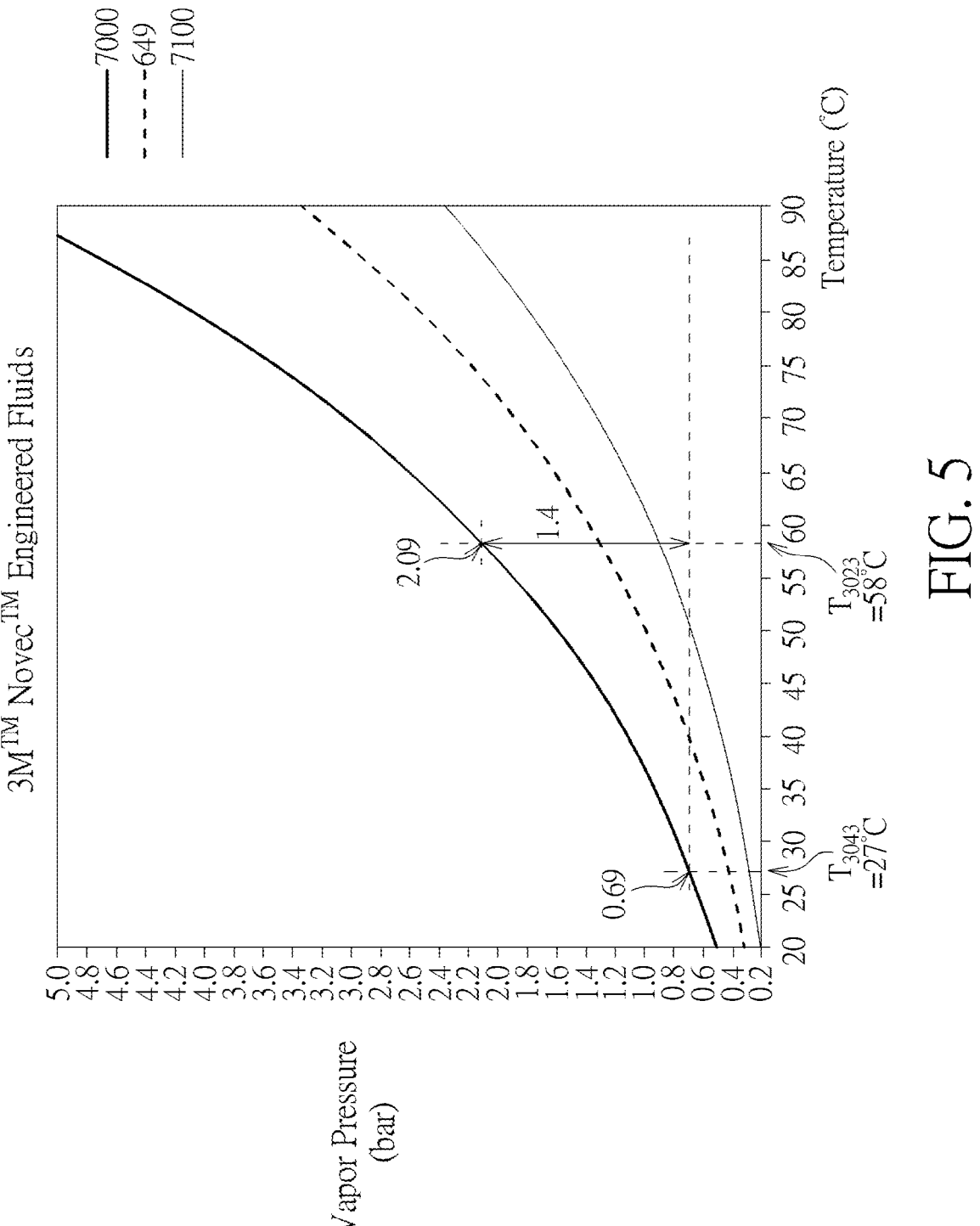
FIG. 5 illustrates curves of vapor pressure versus temperature of working fluid.

FIG. 5 illustrates curves of vapor pressure versus temperature for some engineered fluids, e.g., 3M™ Novec™ engineered fluids, which may be used as the working fluid within the ORC (e.g., the fluid 20).

According to operating conditions as shown on FIG. 5, assuming the warm facility fluid returned from the recycle-and-condense unit RCU in FIG. 3 reaches 58° C. or temperature around or at port 3023 reaches 58° C. (annotated as $T_{3023}$=58° C.) and the cold facility fluid received from cool tower around or at port 3043 reaches 27° C. (annotated as $T_{3043}$=27° C.), around working-fluid outlet of the ORC evaporator 302 would have a vapor pressure as 2.09 Bar and around working-fluid inlet of the ORC condenser 304 (specifically, 3040) would have a vapor pressure as 0.69 Bar (when volume velocity of the cold facility fluid is sufficiently high). Hence, a vapor pressure difference across over the electricity converting unit 300 approximates 2.09−0.69=1.4 bar (20.3 PSI), sufficient to spin the turbine (expander) 3002 and generate electricity.

Since thermal energy (heat) contained in vapor is converted into mechanical energy through the turbine 3002, the heat density (contained in vapor) in space between the turbine 3002 and the condenser 304 is lower than the heat density in the space between the turbine 3002 and the evaporator 302. This residual heat (contained in vapor) is transferred, by releasing latent heat when condensing, to heat exchanging part 3040, and subsequently to the facility fluid, which flows into the heat exchanging part 3040 via port 3043, comes out via port 3041, as mid-low temp facility-fluid. This mid-low temp facility-fluid becomes the "cold facility fluid" or the "source water" for cooling the heat generating device, such as CPU/GPU racks, computer-room AC system (CRAC), commercial HVAC, or even climate adaptation apparatus.

Note, a (heat transferring) loop is formed from port 3041, heat source (e.g., 31), port 3023, ORC evaporator 302, electricity converting unit 300, space between turbine 3002 and condenser 304, condenser 304 and back to the port 3041. This means residual heat left unharvested by ORC generator 30 after one-pass will be rejected to facility-fluid when it passes through condenser (heat-exchanger) 3040. This heat is then raised from mid-low temp to high-temp (carried by facility-fluid, through the heat source 31), looped back to ORC generator 30 through evaporator 302, generator 300, condenser 304 in indefinite recursion, raising the heat-harvesting rate exponentially, eventually boosting the rate of overall heat-to-electricity (H2E) conversion to a value significantly higher than the rate of single-pass H2E.

In the present application, the ORC which is able to recursively harvest waste heat via forming a loop/circuit/cycle of (facility or working) fluid through the ORC condenser, the ORC evaporator and sources of waste heat, such as the ORC 20 or 30 stated above, or the ORC 20a, 20b or 20c which will be introduced later, is generally referred to "ReORC" where R stands for recursion and e stands for encapsulated, e.g., via insulation material such as 330, 332, etc.

In this disclosure ReORC may sometimes also be referred to simply as ORC.

Figure 6:
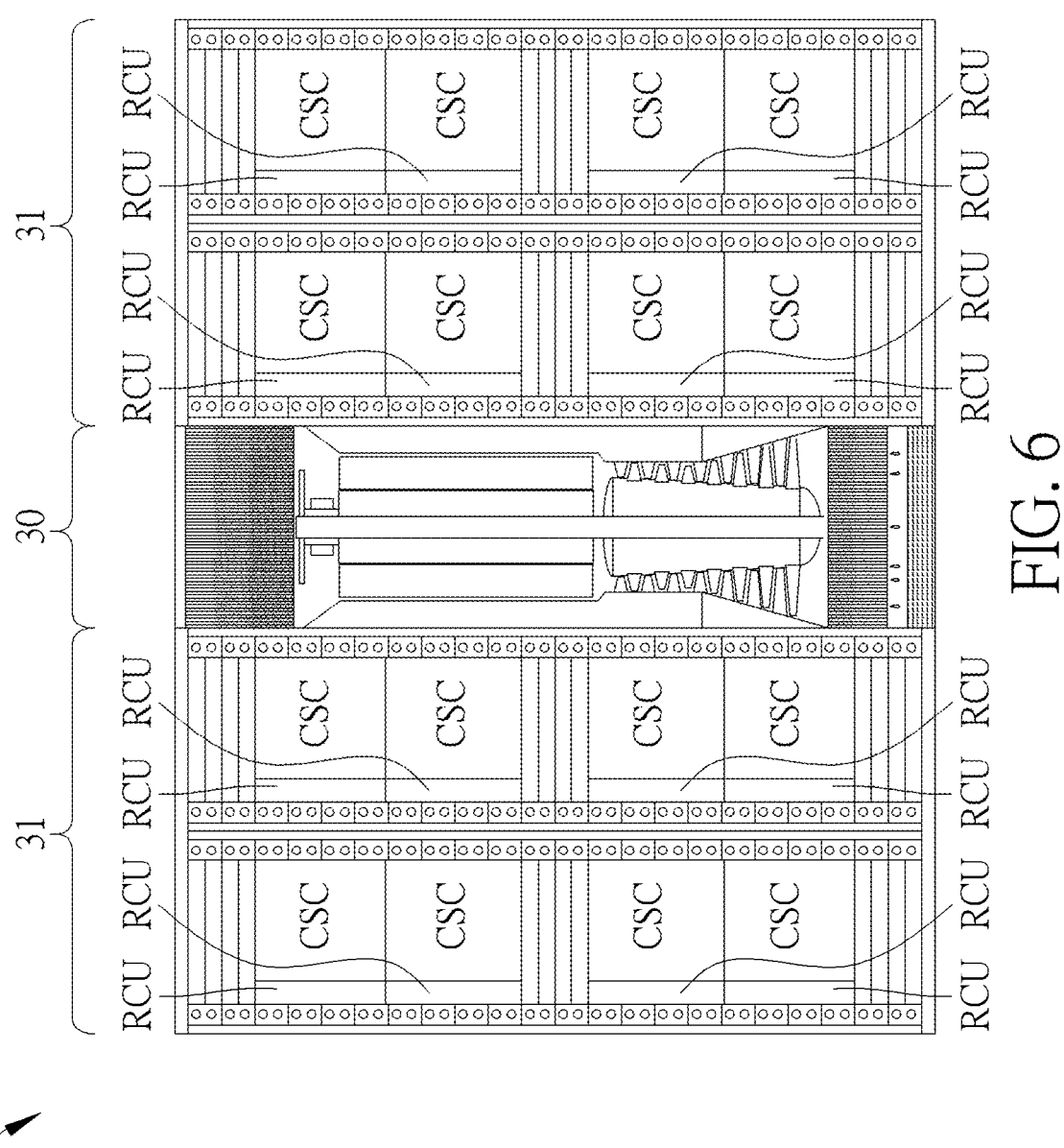
FIG. 6 illustrates schematic diagrams of an arrangement according to an embodiment of the present invention.

FIG. 6 illustrates an arrangement 4 of the heat harvesting system 3 (where heat sink or cooling tower is omitted for brevity) according to an embodiment of the present invention. As can be seen from FIG. 6, the ORC generator 30 may be deployed between server racks with cooling systems (heat dissipation systems) as the heat source 31. It can not only dissipate heat generated while CPU/GPU computing but also harvest such heat to generate electricity.

Figure 7:
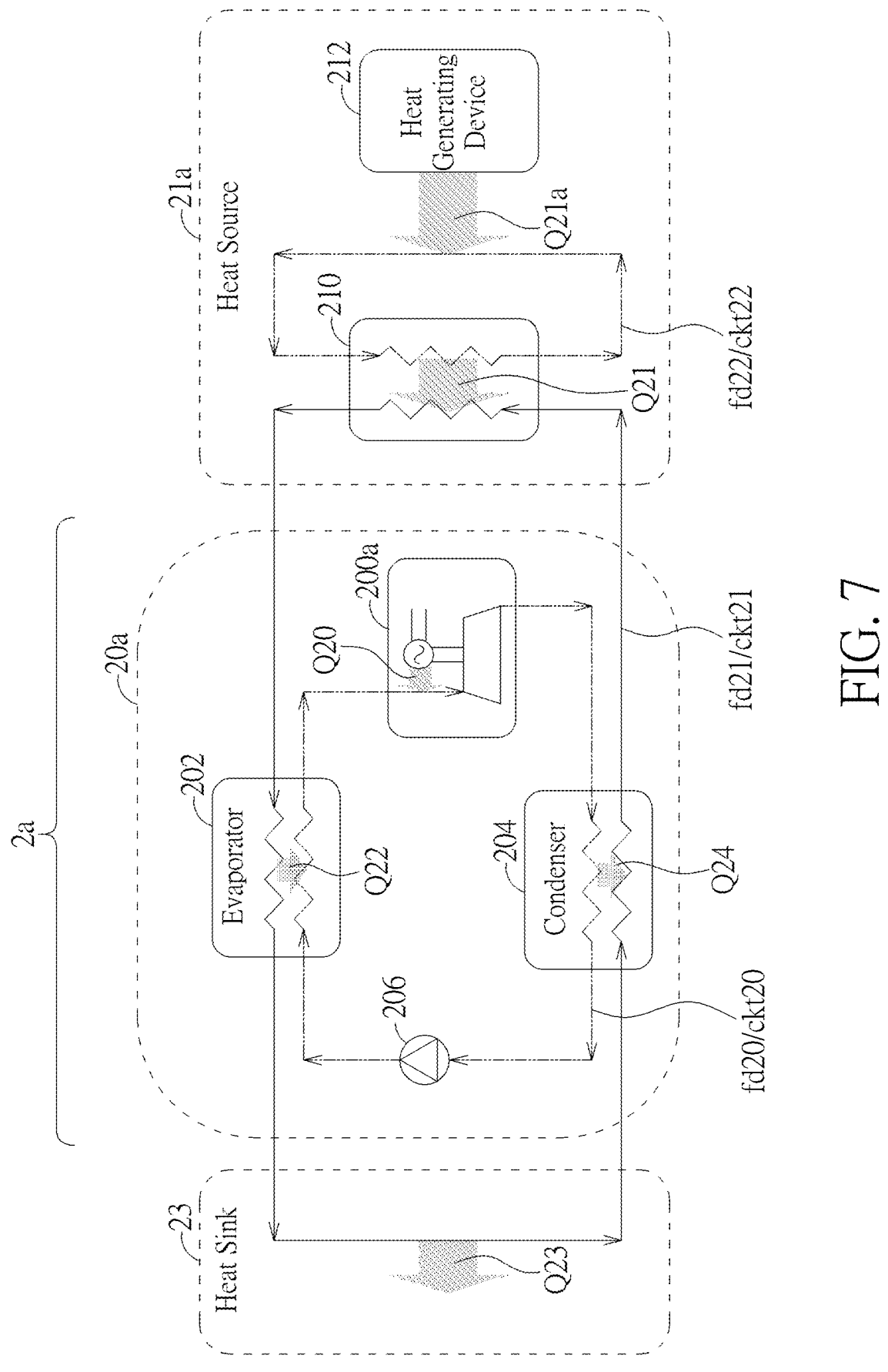
FIG. 7 illustrates a schematic diagram of a heat harvesting system according to an embodiment of the present invention.

The heat harvesting system 3 is reiterated as a heat harvesting system 2a illustrated in FIG. 7 in an abstract form. As can be seen from FIG. 7, within an "encapsulated" electricity converting unit 200a a heat Q20 is provided to the fluid fd20. Herein, "encapsulation" (especially on the electricity converting unit) is generally achieved by 1) optimizing the sequence of heat generating and heat harvesting (e.g., fluid fd20 flowing through alternator first and then turbine subsequently); 2) minimize non-heat energy loss (e.g., EM (Electromagnetic) leakage); and 3) thermally insulation sub modules and inter-module connections thereof (e.g., insulation layer 330 and insulation tube 332) to minimize heat loss to ambient.

In other words, before driving the turbine, the fluid fd20 contains heat not only from the heat Q22, but also from the heat Q20 via encapsulation, where via circuit ckt21 the heat Q24 would be recursively transported back as the heat Q22.

In addition, in heat source 21a, which may be a cooling system, a heat generating device 212 and a circuit ckt22 with a (working) fluid fd22 are included. The heat generating device 212 may be CPU/GPU within the server. The fluid fd22 may represent the coolant in the cooling system. The fluid fd22 absorbs a heat Q21a generated by the heat generating device 212 (e.g., during vaporization in the chamber CSC), and rejects the heat Q21 to the (facility) fluid fd21 (e.g., during condensation in the recycle-and-condense unit RCU).

Comparing conventional heat harvesting system (e.g., system 1) and heat harvesting system of the present invention (e.g., systems 2, 3, or 2a), the heat remains in facility fluid after passing through condenser 204 of ORC is discharged (rejected) to ambience in conventional ORC (e.g., ORC 10) due to difficulty in harvesting mid-low temp heat, but reheated & recycled in ReORC (e.g., ORC 20 or 20a). This means "unharvested waste-heat" will be (re-)cycled through waste-heat harvesting ORC loop repeatedly (recursively), resulting in progressively more waste-heat being harvested through many iterations, and the final, overall, heat-harvesting and energy conversion ratio can be raised significantly.

In addition, most causes of efficiency losses (e.g., surface friction of turbine's rotor & stator or electrical resistance of generator coils, shaft bearing rotation, etc.) produce heat. By encapsulating all efficiency loss mechanisms (such as turbine, compressor/pump and alternator in FIG. 3), within the heat-harvesting-loop, all heat generated by various energy loss factors (mechanical, electrical, chemical, e.g., heat Q20 in FIG. 7), so long as the format of energy is heat, will be lumped together into to the overall waste-heat harvesting loop, harvested, and converted into electrical energy or electricity.

Note that, compared to conventional heat harvesting systems with conventional ORC (e.g., ORC 10), wasted heats will be recursively recycled, and therefore a total waste heat harvesting ration (WHHR) would be further enhanced.

Total WHHR may be estimated or derived by following methodology. Suppose a heat harvesting system with ReORC has a per-iteration (single-pass) WHHR, denoted as w, and an unharvested-waste-heat re-entry ratio, denoted as r. After the $1^{st}$ iteration, "w" of total thermal energy has been harvested and (1−w) of total thermal energy has remained unharvested. At the beginning of the $2^{nd}$ iteration, (1−w)·r of total thermal energy re-enters into the heat-harvesting-loop. After the $2^{nd}$ iteration, "w·(1−w)·r" of (total) thermal energy has been harvested and $(1-w)^2$·r of (total) thermal energy has remained unharvested. At the beginning of the $3^{rd}$ iteration, $(1-w)^2$·$r^2$ of (total) thermal energy re-enters into the heat-harvesting-loop. After the $3^{rd}$ iteration, w·$(1-w)^2$·$r^2$ of (total) thermal energy has been harvested and $(1-w)^3$·$r^2$ of (total) thermal energy has remained unharvested, and so on and so forth.

Therefore, a total WHHR, denoted as $WHHR_{total}$, for a ReORC can be expressed as $$WHHR_{total}=w(1+r'+r'^2+r'^3+\ldots) \qquad (eq.\ 1),$$

where r'=(1−w)·r and 0<r'<1 for 0<r<1 and 0<w<1. According to the formula for sum of infinite geometric series, the total WHHR can be expressed as $$WHHR_{total} = w\frac{1}{1-r'} = w\frac{1}{1-(1-w)\cdot r}. \qquad (eq.\ 2)$$

For example, a (first) heat harvesting system with ReORC may have $(w_1, r_1, WHHR_{total,1})$=(10%, 95%, 69.0%), and another (second) heat harvesting system with ReORC may have $(w_2, r_2, WHHR_{total,2})$=(32%, 72%, 62.7%), according to eq. 2. Note that, even though $w_2>w_1$, $WHHR_{total,1}>WHHR_{total,2}$, because of $r_1>r_2$. As can been seen, the impact of encapsulation (which effectively enhances re-entry ratio r) is paramount (even more important than per-iteration WHHR w), since r→1 would lead to $WHHR_{total}$→1, according to eq. 2.

Note that, improving per-iteration (single-pass) WHHR w usually entails the use of fancier expanders (such as turbines) and generators which are generally not only more difficult to design, manufacture, but also heavier, bulkier and likely far more expensive. On the other hand, improving re-entry ratio r generally entails just using more insulation material which tends to be light in weight and low in cost. Hence, improving the encapsulation and raising the re-entry ratio r may yield equivalent or better results (in terms of $WHHR_{total}$) far more expediently and economically.

Referring back to FIG. 6, by utilizing the waste-heat-to-electricity (WH2E) conversion of ReORC, existing datacenters potentially can migrate to C/GPU of several times higher kW/rack rating (corresponding to WHHR of 40%~80%) without changing existing power & cooling subsystems of the facility, e.g., a datacenter of NVIDIA NVL72, which has a power requirement of 120 kW/rack, can migrate to future C/GPU server racks of 250/375/750 kW/rack by adopting ReORC WH2E systems of $WHHR_{total}$=40/60/80%, without need to change the datacenter's power and cooling subsystems.

In a short remark, recursive recycling and encapsulation are two key concepts of the present invention. Recursive recycling contributes the $(r'+r'^2+r'^3+\ldots)$ terms to total WWHR in eq. 1; while encapsulation contributes effect of r→1 and thus $WHHR_{total}$→1 in eq. 2. Recursive recycling may be realized by diverting fluid (either working fluid or facility fluid) from ORC condenser to ORC evaporator or forming a loop/circuit/cycle connecting ORC condenser, ORC evaporator and source of waste heat. Encapsulation may be realized by 1) creating, with insulation material, insulated/insulation subspaces encompassing heat conducting and/or generating components of the entire system (e.g., expander, compressor, alternator, motor, pump, chiller, heat source, pipes, etc.) to minimize total heat loss at the facility level; and 2) collecting heat from all heat generating components (e.g., expander, compressor, alternator, motor, pumps, chiller, etc.) with circulating cooled, pressurized, working fluid (e.g. by tapping after outlet of pump 206). In the present application, unless specified, WHHR usually refers to total WHHR.

Note that, in the case of the recursion, the heat collected by facility-fluid may be looped back through the heat source, reheating the collected low-temp heat to high-temp heat, thusly sharply raising the heat recovery efficiency of the recycled heat; in the case of the encapsulation, a set of "preheating" steps may be created by causing pressurized working-fluid to flow through each of the encapsulated heat generating subspaces, resulting in increased amount and/or pressure of vapor generated by the evaporator.

For example, to achieve encapsulation, an insulation chamber/subspace may be included to collect waste heat generated by encompass pump, alternator, turbine/expander or other heat emitting components. For example, FIG. 36 illustrates a schematic diagram of an encapsulated pump G06 and an encapsulated electricity converting unit G00. The encapsulated pump G06 and the encapsulated electricity converting unit G00 comprises insulation chamber/sub-spaces G062 and G002, respectively. The insulation chamber/subspaces G062 encompasses a pump and the insulation chamber/subspaces G002 encompasses an alternator and/or a turbine/expander. Working fluid may be injected into the insulation chamber/subspaces G062 and G002. The working fluid in the insulation chamber/subspace G062 would absorb/collect (waste) heat generated by the pump, and the working fluid in the insulation chamber/subspace G002 would absorb/collect (waste) heat generated by the alternator and/or the turbine/expander. After absorbing (waste) heat, the working fluid would be output to evaporator or condenser. Insulated tubes G064 and G004 are also included to prevent heat dissipation. Hence, the encapsulated pump G06 would have the working fluid preheated before entering into evaporator, and the electricity converting unit G00 would have the working fluid superheated, further enhancing re-entry ratio r and thus enhancing WHHR.

In addition to harvesting man-made waste heat in applications involving datacenters, HVAC or industrial processing, the heat harvesting system of present invention may also harvest naturally occurring excess ambient heat.

Figure 8:
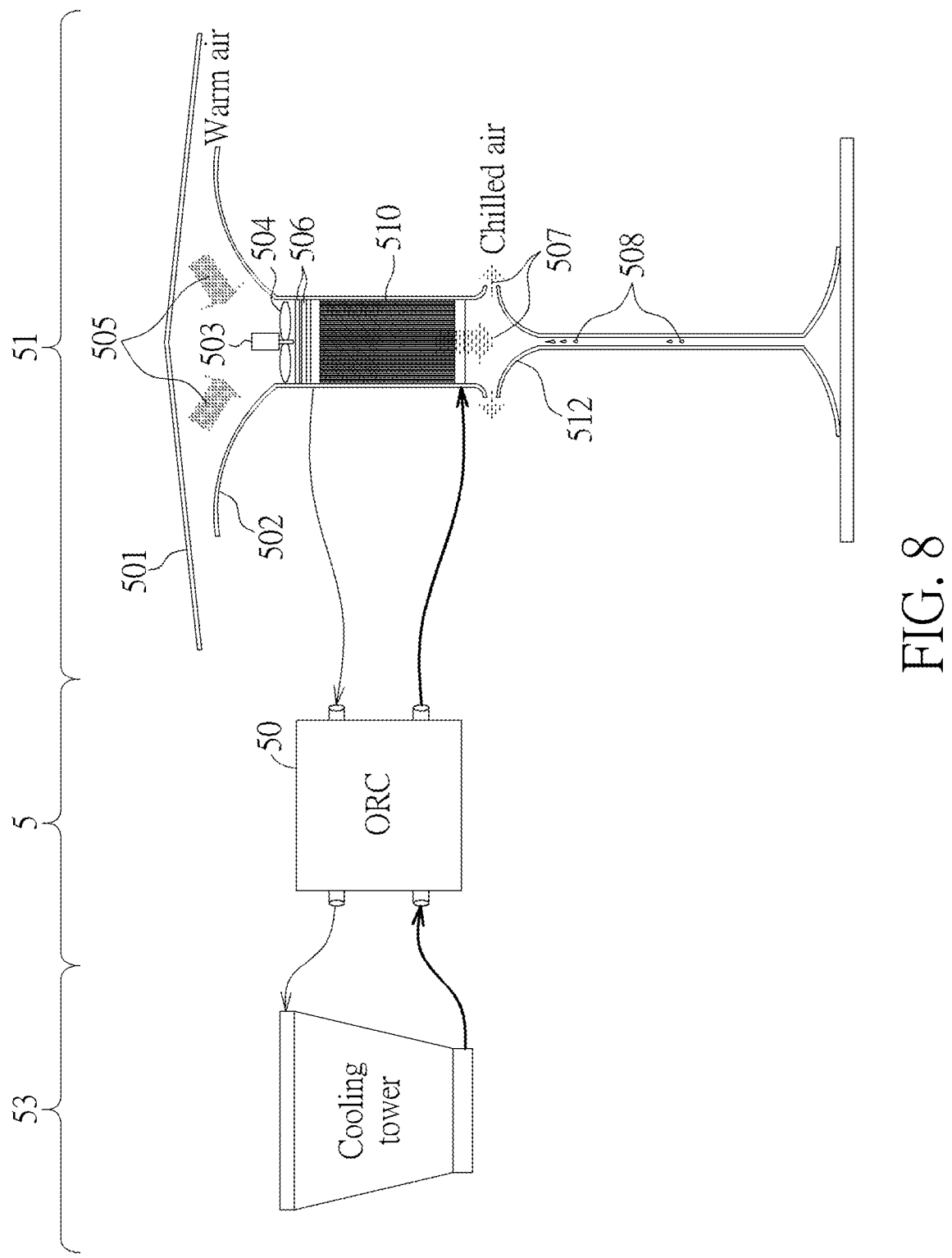
FIG. 8 illustrates a schematic diagram of a heat source according to an embodiment of the present invention.

FIG. 8 illustrates an open-space ambient cooling (OSAC) system according to an embodiment of the present invention. The OSAC systems of FIG. 8 treat ambient excess heat as its heat source, producing cool air as the result of its H2E process, and therefore can be regarded as an ambient cooling system. OSAC systems may be deployed in (sub) tropical region or hot environment such as Arabia cities like Baghdad, Riyadh, Kuwait, Dubai, Abu Dhabi or US cities like Las Vegas, Phoenix (but not limited thereto), where daily high temperature may reach suffering 38~45° C. during summer months.

OSAC system may comprise a plurality of heat source 51 (where FIG. 8 only shows one). Each heat source 51 may comprise a parasol (which may additionally function as sunshade) 501, a funnel 502 to help define the radius of hot air collection, a heat exchanger 510 to transfer heat from ambient air to the circulating working-fluid, and a motor-fan-blade assembly 503-504 to move the air through different parts of 51. In first upward fluid channel, heat exchanger 510 receives a cold fluid from a heat harvesting system 5 at inlet near its bottom and returns a warm fluid back to the heat harvesting system 5 from out near its top. In second downward fluid channel, heat exchanger 510 receives hot ambient air 505 from its top and, as ambient air 505 moves down heat exchanger 510, the heat in ambient air 505 will be rejected to the upward moving fluid in the said first upward fluid channel of heat exchanger 510. In the present invention, 501 may have any form. The term "parasol" and the parasol-like figure shown in FIG. 8 is for illustration only and could have any shapes.

In an embodiment, heat source 51 may comprise a motor 503 and a fan 504 to suck/draw/force the hot/warm ambient air 505 into/down the heat exchanger 510. Optionally, heat source 51 may also comprise a filter 506 to filter out dust in/from ambient. The filter 506 may be a HEPA (High Efficiency Particulate Air) filter, but not limited thereto.

Figure 9:
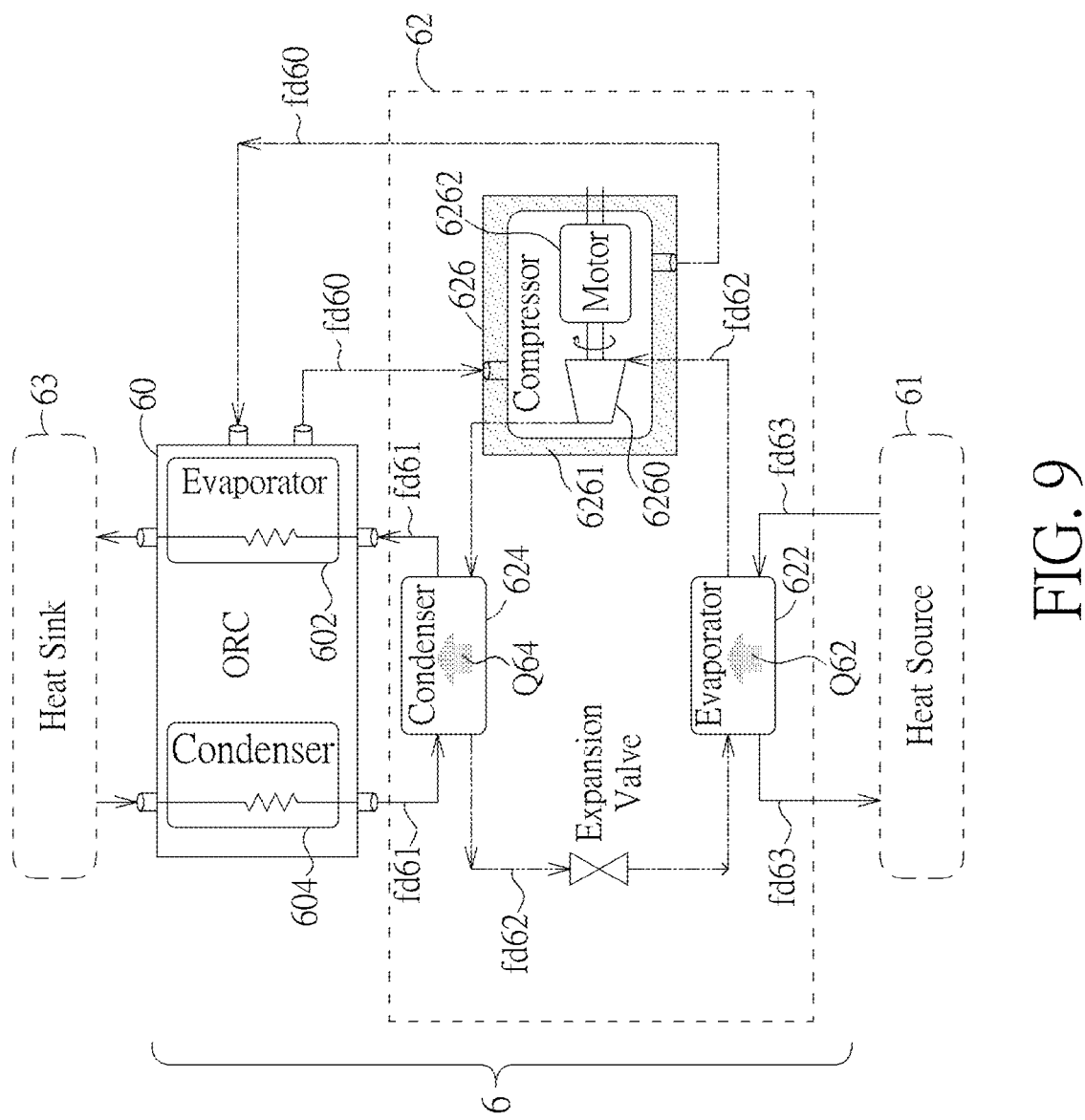
FIG. 9 illustrates a schematic diagram of a heat harvesting system according to an embodiment of the present invention.

In an embodiment, a chiller may be inserted between ORC 50 and heat source 51 of FIG. 8 (by connecting chiller's condenser ports to ORC 50 and chiller's evaporator ports to heat source 51, similar to system 6 shown in FIG. 9), and the heat exchanger disposed under the sunshade/parasol (e.g., 510) may receive cold fluid from chiller and return warm fluid back to the chiller, which is also within the scope of the present invention.

Moreover, the OSAC heat source 51 can be viewed as comprising a combo of parasol 501 and funnel (or funnel-shaped air guide) 502 in FIG. 8. The functions parasol-funnel combo are: the rim/boundary of funnel (or funnel-shaped air guide) 502 define a column which is the rough boundary of space from where the air will be collected and circulated under parasol 501; the parasol/sunshade 501, which may extend beyond the rim/boundary of funnel(-shaped air guide) 502, controls the orientation of how hot air gathered, e.g., when 501 extends significantly beyond 502, the circulating airflow tend to be pointed directly toward the ground plane; on the other hand when 501 only extend slightly beyond 502, the circulating airflow tend to extend outwards horizontally to cover a wider radius.

After the collected (hot/warm) ambient air 505 passed through fan 504 and filter 506, it enters heat exchanger 510. As the air passes through heat exchanger 510, the heat in the air is rejected progressively (to ORC 50 eventually) along the way, causing the temperature of the air to drop progressively as it passes through heat exchanger 510. When the air emerges from the other end of heat exchanger 510, the temperature of air will have dropped near the temperature of cold facility fluid entering heat exchanger 510 and this air will be referred to as chilled air 507. When the temperature of cold facility fluid entering 510 is low enough, such as 8~10° C., condensation 508 may occur, which will not only lower the humidity of chilled air 507 but also produce condensed water droplet (condensation) 508.

Depending on the objectives of each specific embodiment of FIG. 8, the chilled air 507, the low humidity of air 507, the condensation 508, may each be more valuable than electricity generated by ORC 50. For example, instance-A may prioritize low humidity of air 507, instance-B may prioritize the flow rate of condensation 508, and instance-C may prioritize the flow rate chilled air 507, all may be at the expense of lowering the electricity generated.

The heat harvesting system 5, which may comprise an ORC generator 50, where the ORC generator 50 may be realized by the ORC generator 20, 30, 20a of the present application, harvests ambient heat by receiving the warm fluid returned from the heat exchanger 510, which is to generate electricity by exploiting the ambient heat.

Furthermore, condensation might occur within the heat exchanger 510, which means that heat exchanger 510 may produce condensed water 508.

Embodiment shown in FIG. 8 has advantages of lowering ambient air temperature, producing condensed water and generating electricity.

Note that, in the previous embodiment, the heat harvesting system provides cold facility fluid directly from the ORC condenser and the cold facility fluid is sourced from cooling tower. In this case, the cold facility fluid in the heat harvesting system would be limited (lower bounded) by ambient wet-bulb temperature, which may become problematic if ambient temperature approaches or rises above 40° C. To ensure the low temperature of the cold facility fluid (e.g., 8° ~15° C.), a chiller may be included to gain better control of heat transportation and/or heat exchanging efficiency.

FIG. 9 illustrates a schematic diagram of a heat harvesting system 6 according to an embodiment of the present invention. The heat harvesting system 6 comprises an ORC generator 60 and a chiller (as a heat-pump) 62. The ORC generator 60 may be realized by the ORC generators of the present application (e.g., the ORC 20, 30 or 20*a*).

The chiller 62 comprises a chiller evaporator 622 and a chiller condenser 624. The chiller evaporator 622 provides the cold facility fluid (in a low temperature, e.g., 10° C. or lower) to a heat source 61 (e.g., ReORC 4*a*0 in FIG. 12, heat source 61*b*/61*c* in FIG. 20 or 21, or a HVAC, CRAC system), which is colder than what cooling tower or simply ORC generator with cooling tower can provide (which may become elevated when ambient temperature approaches or rises above 40° C.), so as to enhance the heat to electricity conversion efficiency (e.g., in ReORC 4*a*0 of FIG. 13), heat transportation efficacy (e.g., in 2-phase AI/datacenter cooling system 31 of FIG. 3) and cooling capacity (e.g., in OSAC system of FIG. 8).

In addition to lowering the temperature of cold facility fluid fd63 provided to heat source 61, chiller (heat-pump) 62 also raises the temperature of warm facility fluid fd61 provided to ORC generator 60, improving the H2E conversion efficiency of ORC 60. However, despite such double-sided benefits of adding a heat-pump (chiller) between heat source 61 and ORC generator 60, this approach has not been attempted due to the extra energy consumed by chiller 62. This "energy consumed" includes 1) heat loss when electric current flows through coils of motor 6262, 2) friction losses in compressor 6260 and motor 6262; 3) fluid dynamic loss due to friction, turbulence, etc. when fluid flows through heat-exchangers, pipes, valves, etc.

Among the "energy consumed" itemized above, the last item, "fluid dynamic loss", can be addressed by "passive encapsulation", i.e., insulate the relevant parts to prevent heat from escaping and keep the heat within the reach of the flow of working/facility-fluid (liquid or vapor), so that heat can be collected by the flowing working-fluid, e.g., fd62, and transported to condenser 624, from where the heat can pass through to ORC 60 and be harvested by the ORC generator 60.

On the other hand, the first two of the itemized "energy consumed", e.g., heat generated/emitted by motor and compressor, involves heat outside of the reach of normal passage ways of working-fluid flow, e.g., none of fd60~ fd63 circuit would come close to the coils of motor normally, and thus a purposely-established detour of one of the fluid is required so that the heat generated/emitted by these blocks can be "actively collected" by circulating the fluid across the heat generating/emitting blocks. This will be referred to as "active encapsulation". System 6 in FIG. 9 contains an embodiment of such "active encapsulation" where working fluid fd60 of ORC 60 takes a detour, across subcomponent boundary, sweeping across the volume inside capsule 626 (encapsulated by insulating box 6261) in chiller 62, collecting heat generated/emitted by motor 6262 and compressor 6260, and returns back to ORC 60.

Note that, HVAC/CRAC system usually comprises chiller, and the chiller 62 may be the chiller of the HVAC/CRAC system. That is, in applications of system 6 for WH2E involving HVAC/CRAC, chiller 62 may correspond to the chiller inside HVAC/CRAC, heat source 61 may correspond to the space cooled by the HVAC/CRAC system, and the WH2E harvesting system 6 will harvest all heat generated/emitted by devices or components which are reached by circulating cool air while the HVAC/CRAC system operates.

Note the concept of "insulating heat generating emitting components within an insulated capsule and circulating working facility-fluid (liquid or vapor) through the encapsulated volume to collect heat generated emitted within the capsule, and subsequently harvest the collected heat" can be generalized and applied to anywhere within the xH2E system and within/around facility covered by the xH2E system. Embodiments of "within the xH2E system" disclosed herein include the case of working fluid vapor passing through alternator 3001 of ORC 3 in FIG. 3, the case of fd60 taking a detour to collect heat within capsule 626 and blowup bubble 3066 in FIG. 3 where working fluid or coolant, after being pressurized by a pump, loops back to sweep through an insulated volume within a capsule encompassing the pump, collecting the heat generated by the pump. An example of "within the facility" has been discussed related to FIG. 9 above, where the heat source 61 of system 6 may refer to any heat generating/emitting parts within the entire space cooled by the datacenter CRAC system, be it electrical (e.g., compute/storage/networking/power management/sensing devices), electromechanical (e.g. fans, pumps, generators, HVAC), or other (various thermal or fluid dynamic losses), etc. An example of "around the facility" may involve circulating a suitable fluid through the fan-motor assemblies in cooling towers to collect the heat generated by them.

Specifically, the ORC generator 60 may comprise an ORC evaporator 602 and an ORC condenser 604. The facility fluid fd61 is provided from condenser 604 of ORC 60, absorbs a heat Q64 in condenser 624 of chiller 62, and returned to evaporator 602 of ORC.

Besides, a heat Q62 from the heat source 61 would be transported/rejected to the working fluid (e.g., fluid fd62) of the chiller 62 within the chiller evaporator 622 and the heat Q64 would be rejected to the facility fluid (e.g., fluid fd61) provided by the ORC generator 60 within the chiller condenser 624. More specifically, from the point of view of the chiller condenser 624, the fluid fd61 is provided from an ORC condenser 604 and is returned to the ORC evaporator 602; from the point of view of the ORC generator 60, the ORC condenser 604 receives the fluid fd61 from a heat sink 63 (e.g., a cooling tower but not limited thereto) and the ORC evaporator 602 returns the fluid fd61 to the heat sink 63. In a perspective, the chiller 62 functions as a heat source or heat pump for the ORC generator 60 and the heat Q64 would be harvested and converted into electricity by the ORC generator 60.

As the heat Q64 is harvested by ORC 60, the remaining source of "heat lost to the ambient" is the compressor and motor of the chiller, which are usually air-cooled. In order to recycle the waste heat generated from the compressor and motor, working fluid in ORC 60, fd60, may be utilized to collect the waste heat generated from the compressor and motor and return thus collected heat back to ORC generator 60 to be harvested.

In the embodiment shown in FIG. 9, given the chiller 62 comprises a compressor 6260 and a motor 6262, the heat harvesting system 6 or the chiller 62 may comprise a chamber 626 encompassing the compressor 6260 and the motor 6262. The chamber 626 may be an enclosed and thermal insulated chamber, filled with a fluid fd60 and formed by thermal insulation walls/material (e.g., 6261). In an embodiment, the fluid fd60 may be the working fluid of the ORC cycle of the ORC generator 60 (analogous to the fluid fd20 shown in FIG. 2). The chamber 626 may receive the fluid fd60 from a first port of the ORC generator 60 and return the fluid fd60 to a second port of the ORC generator 60. In an embodiment, the first port of the ORC generator 60 may be connected to the outlet of working fluid pump in ORC generator 60 (analogous to output port of the pump 206 shown in FIG. 2 or 306 shown in FIG. 3), sending pressurized fd60 (fluid pump) to chamber 626, while the second port of the ORC generator 60 may be connected to input port of evaporator within ORC generator 60 (analogous to port 3027 shown in FIG. 3), receiving the preheated working fluid fd60 from chamber 626. In this arrangement, the fluid fd60 can be thought of as being "preheated" by the waste heat generated from the compressor 6260 and the motor 6262, before entering into the evaporator of the ORC generator 60.

For example, for an HVAC system, the temperature range of 180~200° F. (82.2~93.3° F.) may be reached at the exhaust of HVAC compressor, according to FIG. 5, the vapor pressure difference may reach 3.6~ 6.2 Bar, which changes the classification of turbine from low pressure to medium pressure. It means ReORC applications in HVAC can theoretically achieve system-wide WHHR as high as 86~90%, cutting the electricity demand by 7~10 times.

In short, in typical chiller, heat rejected by the chiller condenser is usually transported to the heat sink such as cooling tower and discharged to ambience. In comparison, in embodiment system 6, the heat Q64 rejected by the chiller condenser 624 would be harvested and recycled by the ORC generator 60 to generate electricity, so as to lower overall energy consumption. Moreover, system 6 comprises the enclosed insulation chamber/subspace 626 to encapsulate the compressor 6260 and the motor 6262, to prevent waste heat from dissipating to open space, so as to allow the heat generated by compressor 6260 and motor 6262 to be harvested, further enhancing re-entry ratio r and thus enhancing WHHR.

Figure 10:
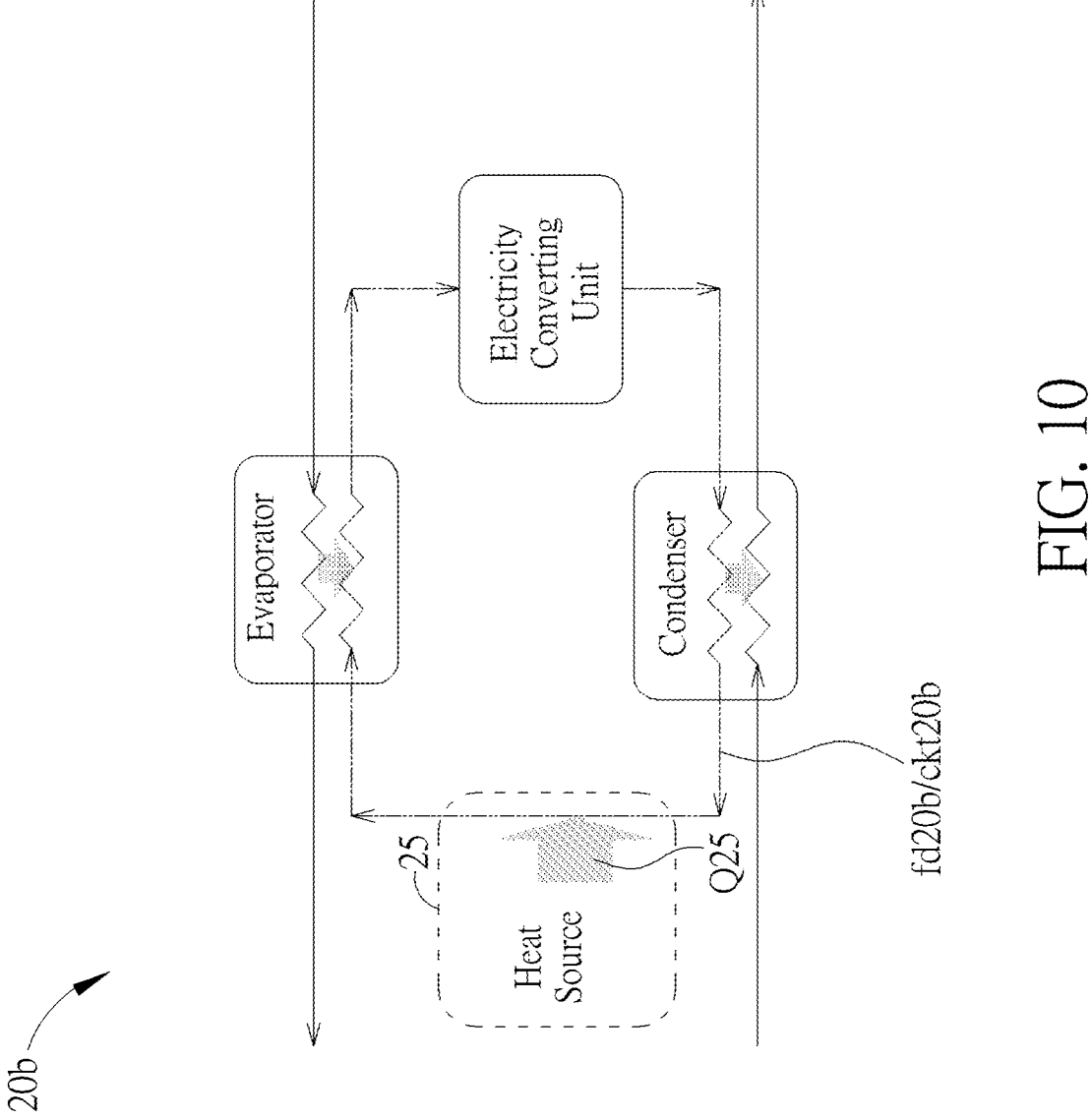
FIG. 10 illustrates a schematic diagram of an ORC according to an embodiment of the present invention.

A conceptual diagram illustrating the chamber 626 and the fluid fd60 can be reiterated as an ORC cycle/generator 20_b_ shown in FIG. 10, where the pump is omitted herein for brevity. In the ORC cycle/generator 20_b_, a fluid fd20_b_ (corresponding to the fluid fd20 in FIG. 2 or the fluid fd60 in FIG. 9), representing the working fluid of the ORC, flows through a heat source 25 (corresponding to the chamber 626 in FIG. 9) to absorb a heat Q25 from the heat source 25. The heat Q25 can preheat the working fluid fd20_b_ before it enters the ORC evaporator. Note that, this preheating approach is conceptually closer to the regenerator/recuperator construct of more advanced/modern conventional ORC (in the sense they both preheats the working fluid within the ORC) than to the typical ORC treatment of heat source, where the heat Q25 from the heat source 25 would have been rejected to a circuit of facility fluid, instead of ORC working fluid.

Note that, although the ORC 20_b_ (shown in FIG. 10) and the ORC E0 (shown in FIG. 34) shares some similarity (working fluid is "preheated" before entering evaporator in both ORCs 20_b_ and E0), the ORC 20_b_ is fundamentally different from the ORC E0 due to their heat sources for preheating working fluid. In ORC E0, the heat source for preheating working fluid is the heat remaining after vapor passes through expander and is carried by working fluid (in vapor phase) itself; however, in the ORC 20_b_, an external heat source 25 is exploited to preheat the working fluid, i.e., the heat source 25 is generated outside of (external to) the cycle of conventional ORC operation and a detour of working fluid (e.g., fd60 detour in FIG. 9) is required to collect such external heat (e.g., Q25 in FIGS. 10 & 11) into the normal ORC working fluid circuit (e.g. ckt20_b_ in FIG. 11).

Figure 11:
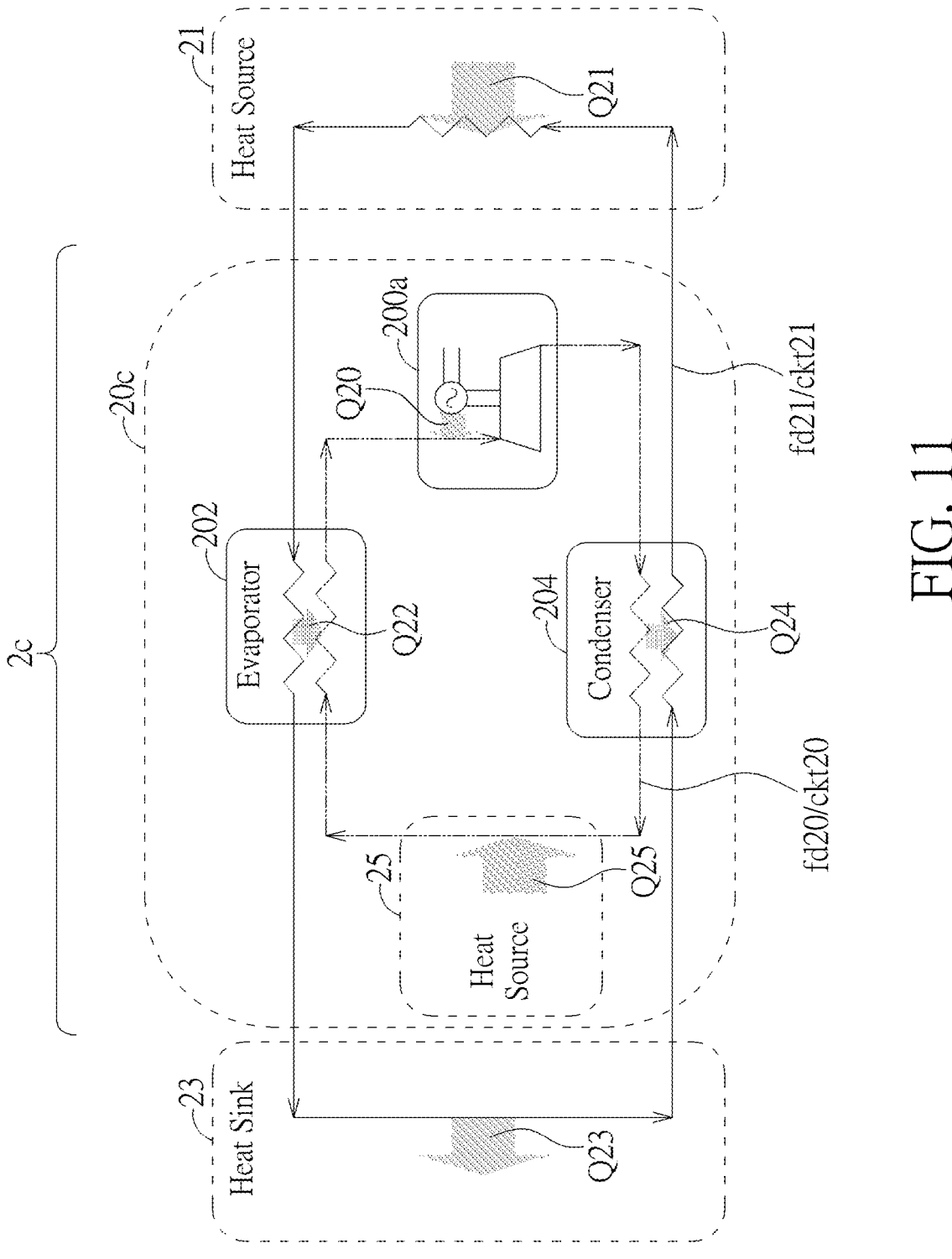
FIG. 11 illustrates a schematic diagram of a heat harvesting system according to an embodiment of the present invention.

In a short summary, FIG. 11 illustrates a schematic diagram of a heat harvesting system 2_c_ with an ORC 20_c_ according to an embodiment of the present invention. In FIG. 11, the heat Q24, rejected to facility-fluid fd21 through condenser 204, is recursively harvested by first being reheated when passing through heat source 21, where additional heat Q21 is rejected to fd21, and the combined heat Q24+Q21 then reenters evaporator 202 of ORC 20_c_, where heat Q22 is rejected to working-fluid fd20, passing through expander-generator 200_a_ and the remaining/unharvested heat is rejected in condenser to facility fluid fd21 as Q24 again, and starts anew the cycle through circuit ckt21 of facility fluid fd21.

Moreover, the heat Q20 from high-temp waste heat source (e.g., waste heat Q20 produced by the alternator 3001 in FIG. 3) and mid-temp heat source (e.g., waste heat Q25, collected from capsule 626 in FIG. 9 or pump capsule in bubble 3066) will both be recursively harvested by cycling Q20 and Q25 repeatedly through circuit ckt20 of working fluid fd20, mid-temp heat may preheat the working fluid (liquid) before it enters evaporator 202, while high-temp waste heat may superheat the working fluid (vapor) after it exists evaporator 202.

Furthermore, to maximize re-entry ratio r (eq.2) the heat loss should be minimized across the entire system. Therefore, the heat source 21, the electricity converting unit 200_a_ and the heat source 25 may be thermal insulated, so are the tubes connecting therebetween. When thusly insulated, the heat harvesting system 2_c_ is considered as (highly) thermally encapsulated, where system-wide heat (thermal energy) lost to ambient is minimized. Therefore, the re-entry ratio r would be maximized, and thus WHHR would be optimized.

Note that, the heat harvesting system of the present invention (e.g., the system 6 in FIG. 9) may be applied in "local climate adaptation" applications where ReORC is utilized for excess ambient heat harvesting. In such applications the heat source 61 may simply be associated with the surrounding open-space atmosphere, the ambience, and heat source 61 may further comprise a heat collecting apparatus or air cooling system, such as the air cooling system 51 as an example.

The heat harvesting system of the present invention (e.g., the system 6) may also be applied in datacenter. By substituting heat source 61 with the arrangement 4 shown in FIG. 4, a 2-stage (or even multi-stage) ReORC or 2-stage heat harvesting system may be realized. In a 2-stage heat harvesting system (or 2-stage ReORC), a first/upstream (stage of) heat harvesting system may function as heat source of a second/downstream (stage of) heat harvesting system and the second/downstream (stage of) heat harvesting system may function as heat sink of the first/upstream (stage of) heat harvesting system.

Figure 12:
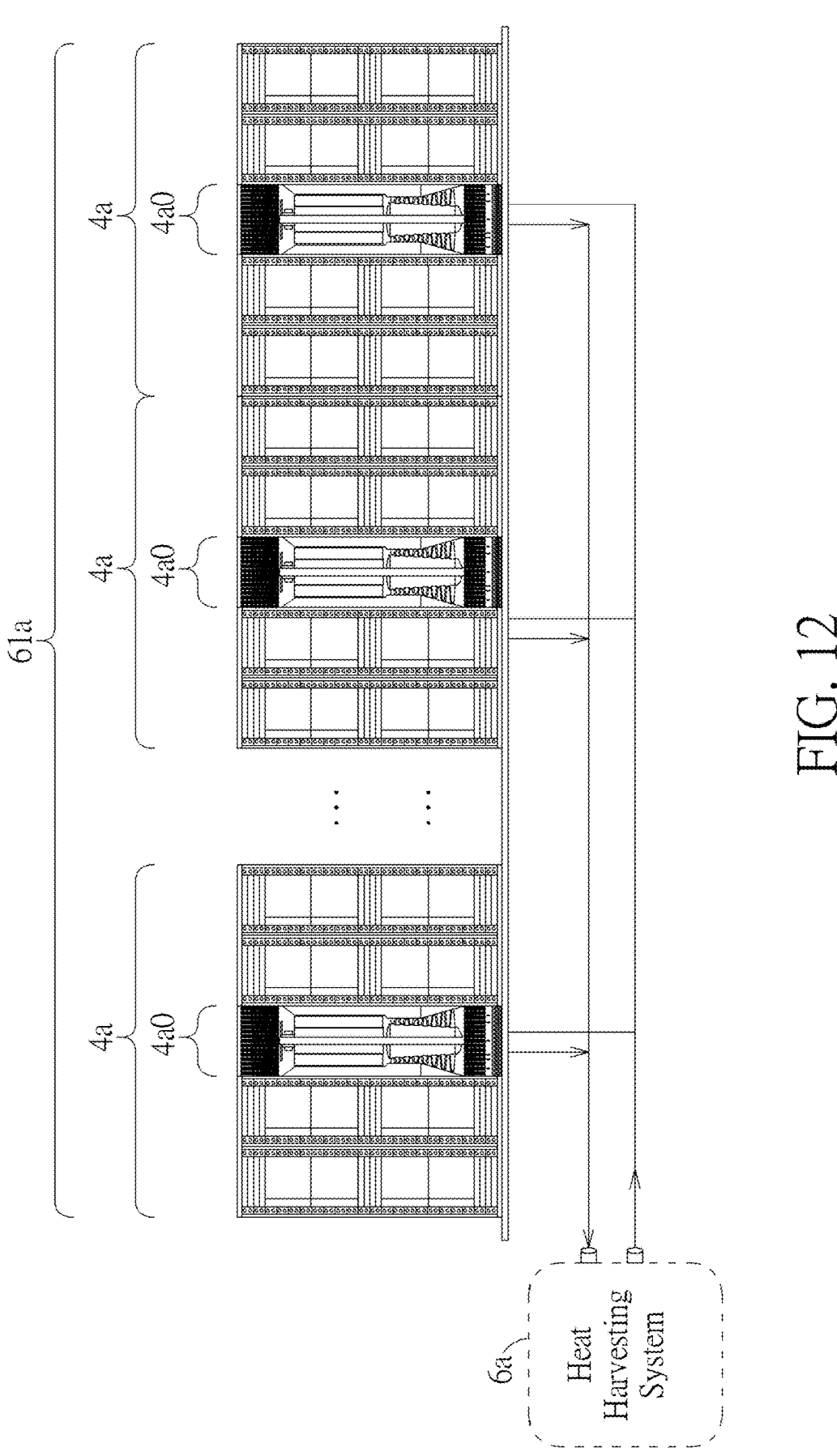
FIG. 12 illustrates a schematic diagram of a heat source according to an embodiment of the present invention.

For example, FIG. 12 illustrates a schematic diagram of a heat source 61_a_ of a heat harvesting system 6_a_ according to an embodiment of the present invention. The heat harvesting system 6_a_ may be realized by the heat harvesting system of the present invention (e.g., the system 6 in FIG. 9). The heat source 61_a_ comprises a plurality of inter-rack ReORCs or inter-rack heat harvesting systems 4_a_ (each system 4_a_ is similar to the arrangement 4 shown in FIG. 4). The plurality of inter-rack heat harvesting systems 4_a_ function as one heat source of the heat harvesting system 6_a_, and the heat harvesting system 6_a_ functions as a shared heat sink for each of the connected inter-rack heat harvesting systems 4_a_. The inter-rack heat harvesting system 4_a_ harvests the (waste) heat generated by CPU/GPU directly while the heat harvesting system 6a harvests the (waste) heat unharvested by the heat harvesting system 4a.

Consider a datacenter with 4,000 racks of GPU at a raw power rating of 500 kW/rack, i.e., the raw electricity (heat dissipation) requirement will be 4000*500 KW=2 GW at the facility level. Assume the system configuration is a 1 inter-rack ORC (e.g., ORC 30 shown FIG. 6 or ORC 4a0 shown in FIG. 12) for every 4 racks of CPU/GPU (as shown in FIG. 6 or FIG. 12) and assume the ORC operating condition is as shown in FIG. 5 with vapor pressure difference $\Delta P_{VPR}$=1.4 Bar from outlet of ORC evaporator to surface of coolant in ORC condenser. Due to low $\Delta P_{VPR}$, assume the total WHHR of the inter-rack ReORC 4a0 is 52%. Hence, net electricity becomes 2 GW*(1–52%)=960MW.

Figure 13:
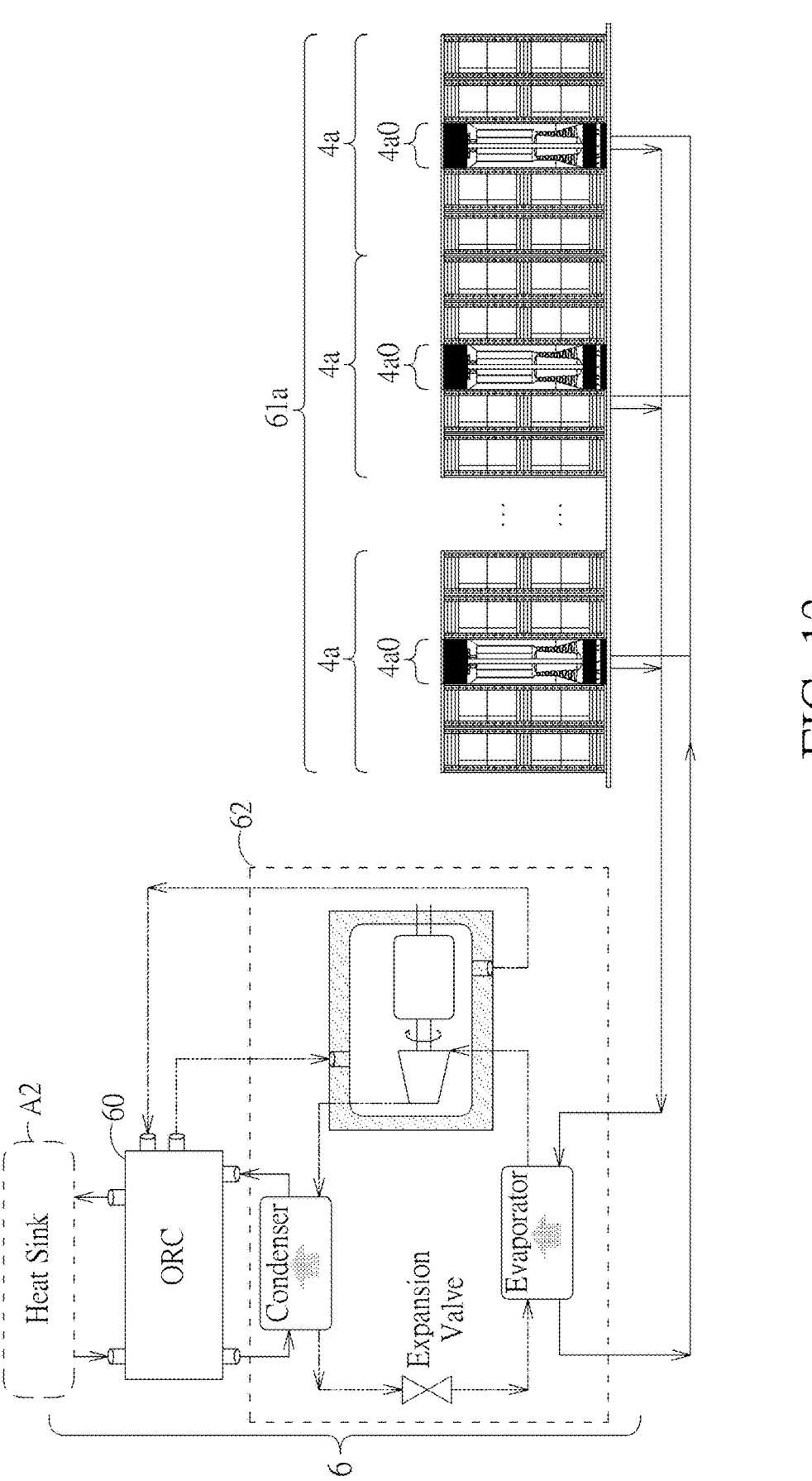
FIG. 13 illustrates a schematic diagram of a heat harvesting system and a heat source according to an embodiment of the present invention.

When the heat harvesting system 6 connects (or harvests heat from) the heat source 61a, such as the embodiment shown in FIG. 13, it would become a 2-stage heat harvesting system or a 2-stage ORC system, while the $1^{st}$ stage ORC is the inter-rack ORC (e.g., inter-rack ORC 4a0) and the 2nd stage ORC is the ORC 60. In FIG. 13, the temperature of the return water from the inter-rack ORC 4a0 may be around 52° C. The chiller (heat pump) 62 may increase the temperature of return water to the $2^{nd}$ stage ORC 60 to ~85° C. If Novec™ 7000 is used in the 2nd stage ORC 60, then its $\Delta P_{VPR}$≈4.68 Bar at 85° C. and the total WHHR of this 2nd stage ORC 60 (if it is ReORC) may exceed 80%.

Assume, after weighing between different considerations, system design team may settle on a total WHHR of 75% for the 2nd stage ReORC, including non-heat losses like EM, vibration, material wears, etc., then the net electricity demand of this 2-stage ReORC is 960MW*(1–75%) ≈240MW at the facility level, which is reduced (by >8×) compared to the 2 GW if no ReORC is used.

Figure 14:
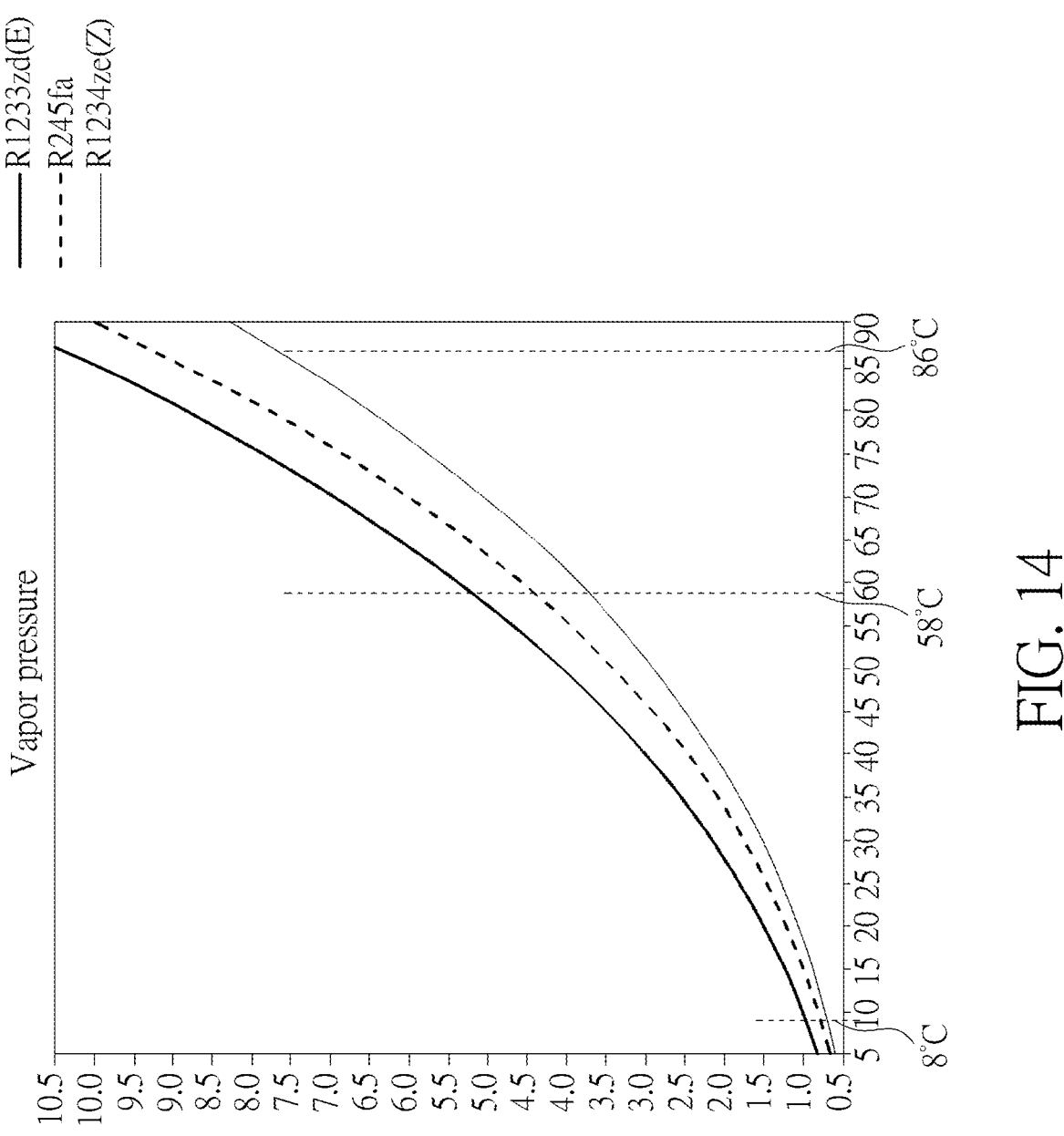
FIG. 14 illustrates curves of vapor pressure versus temperature of working fluid.

In the 2-stage ORC system above, with combined features from FIG. 6, FIG. 9 and FIG. 12, the chiller 62 not only raises waste-heat source temperature of the $2^{nd}$ stage ORC 60 to 80~95° C., increasing $\Delta P_{VPR}$ across expander within ORC 60 to 3.5~6 ATM (vapor pressure curve according to FIG. 5), much higher than $\Delta P_{VPR}$ of 1.4 ATM inside $1^{st}$ stage ORC 4a0, sharply raising the heat to electricity conversion efficiency, thusly allowing the 2nd stage ORC 60 to reclaim the waste-heat unharvested by the $1^{st}$ stage ORC 4a0 efficiently, but also lower cold facility fluid temperature of $1^{st}$ stage ORC 4a0 to 8~15° C., enabling the use of low boiling point (denoted as $T_{BP}$) working fluid, such as Hydrofluoroolefin (HFO) refrigerant R245fa, R1234ze(Z). Assume the cold facility fluid from the chiller 62 is reduced to 8° C., then $\Delta P_{VPR}$ for the $1^{st}$ stage ORC 4a0 becomes 2.98/3.91/3.56 ATM, for working fluid R245fa/R1233zd(E)/R1234ze(Z), according to curves shown in FIG. 14, which is 2.5/2.1/2.8 times the 1.4 ATM achieved by/with the Novec™ 7000 working fluid shown in FIG. 5, which would vastly improve WHHR of the 1st stage ORC 4a0.

Assume the low $T_{BP}$ working fluid help improve the WHHR of the $1^{st}$ stage ORC 4a0 from 52% to 64%, then the facility-wide total WHHR of this "2-stage ORC with inter-stage chiller" configuration becomes 1–(1–64%)*(1–75%) =91%, reducing the facility wide electricity usage from the raw 2 GW to 180MW net, drawn from the grid, a reduction ratio of 2 GW/180MW=11 times, which is very significant.

In summary, by utilizing 2-stage ReORC with inter-stage-chiller (such as the heat harvesting system 6 connecting the heat source 61a), both the electricity and heat dissipation demands can be cut by more than 10 times in a divide-and-conquer manner while allowing requirements of each stage of ReORC to become relatively relaxed.

Note that, the ORC 60 is preferably ReORC for better WHHR, which is not limited thereto. The ORC 60 may be altered as typical ORC, like ORC 10, and have connections with chiller as (or similar to) which is shown in FIG. 9, which is also within the scope of the present invention.

Referring to FIG. 9, recall that, the chiller 62 functions as heat source of the ORC generator 60 when ORC generator 60 heat-source ports are connected to the condenser ports of chiller 62. This'll be referred to as "ORC sits downstream to chiller". Conversely, chiller may also function as heat sink of the ORC when ORC generator's heat-sink ports are connected to the evaporator ports of chiller. This'll be referred to as "ORC sits upstream to chiller", like FIG. 15.

Figure 15:
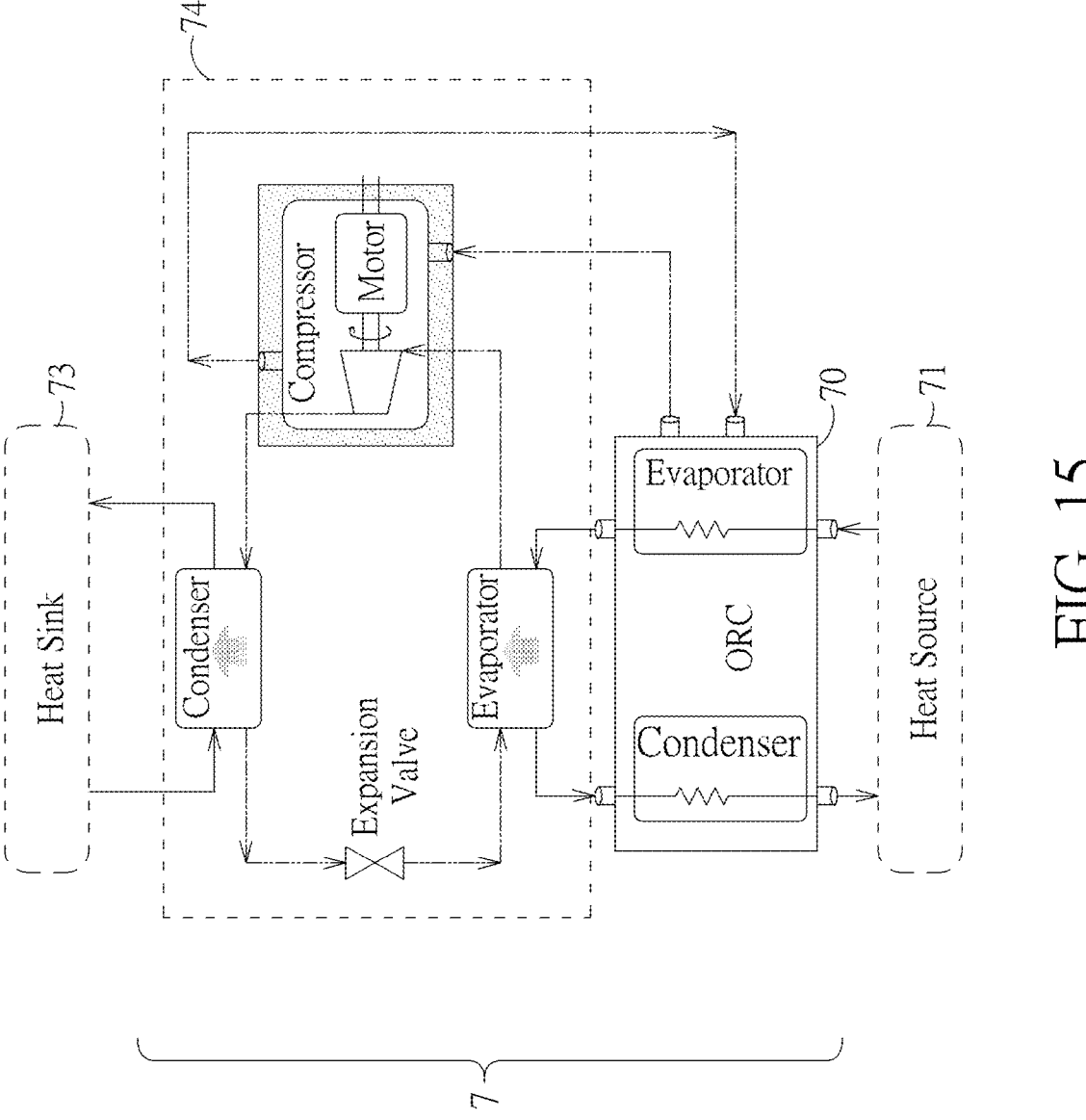
FIG. 15 illustrates a schematic diagram of a heat harvesting system according to an embodiment of the present invention.

FIG. 15 illustrates a schematic diagram of a heat harvesting system 7 according to an embodiment of the present invention. The heat harvesting system 7 is connected to a heat source 71 upstream and heat sink 73 (e.g., cooling tower) downstream. The heat harvesting system 7 comprises an ORC generator 70 and a chiller 72. The chiller 72 may function as heat sink of the ORC generator 70, which provides cold facility fluid to the ORC generator 70 and receive warm facility fluid returned from the ORC generator 70.

Concepts of chiller as heat source and chiller as heat sink can be combined, which means heat harvesting system may comprise one ReORC sandwiched between two chillers.

Figure 16:
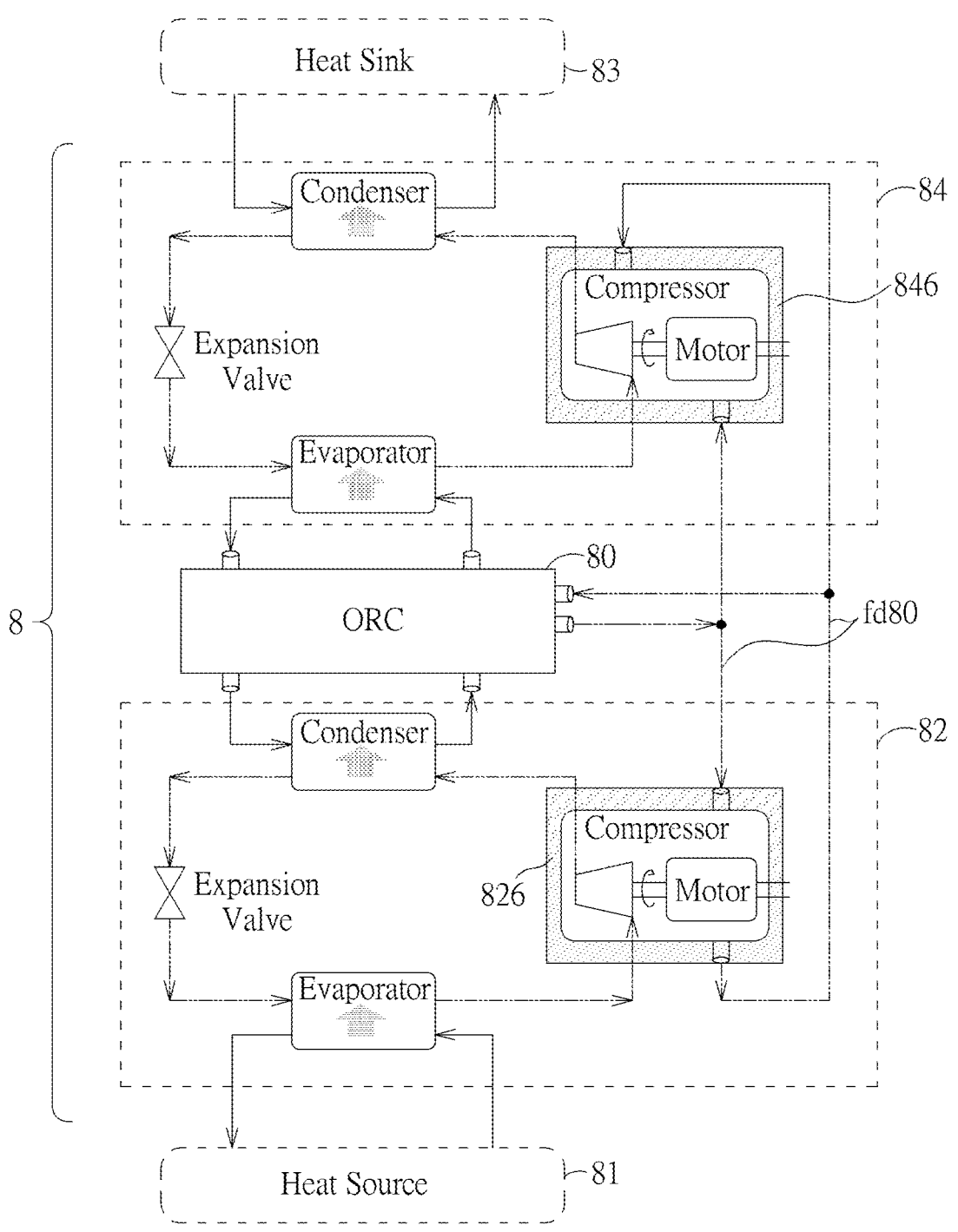
FIG. 16 illustrates a schematic diagram of a heat harvesting system according to an embodiment of the present invention.

FIG. 16 illustrates a schematic diagram of a heat harvesting system 8 according to an embodiment of the present invention. System 8, connected upstream to heat source 81 and downstream to heat sink 83 (e.g., cooling tower), comprises an ORC generator 80 sandwiched between two chillers 82, 84, where the chiller 82/84 functions as heat source/sink of the ORC generator 80. The ORC generator 80 may be the ReORC introduced in the present application. Similar to the ORC 60 or the teaching above, the ORC generator 80 circulates (working) fluid fd80 (analogous to fd60) to encapsulation chambers 826, 846, preheating the working fluid fd80 before returning fd80 to ORC generator 80, where fd80 enters the ORC evaporator of the ORC 80.

Conversely, heat harvesting system may comprise one chiller sandwiched between two ReORC.

Figure 17:
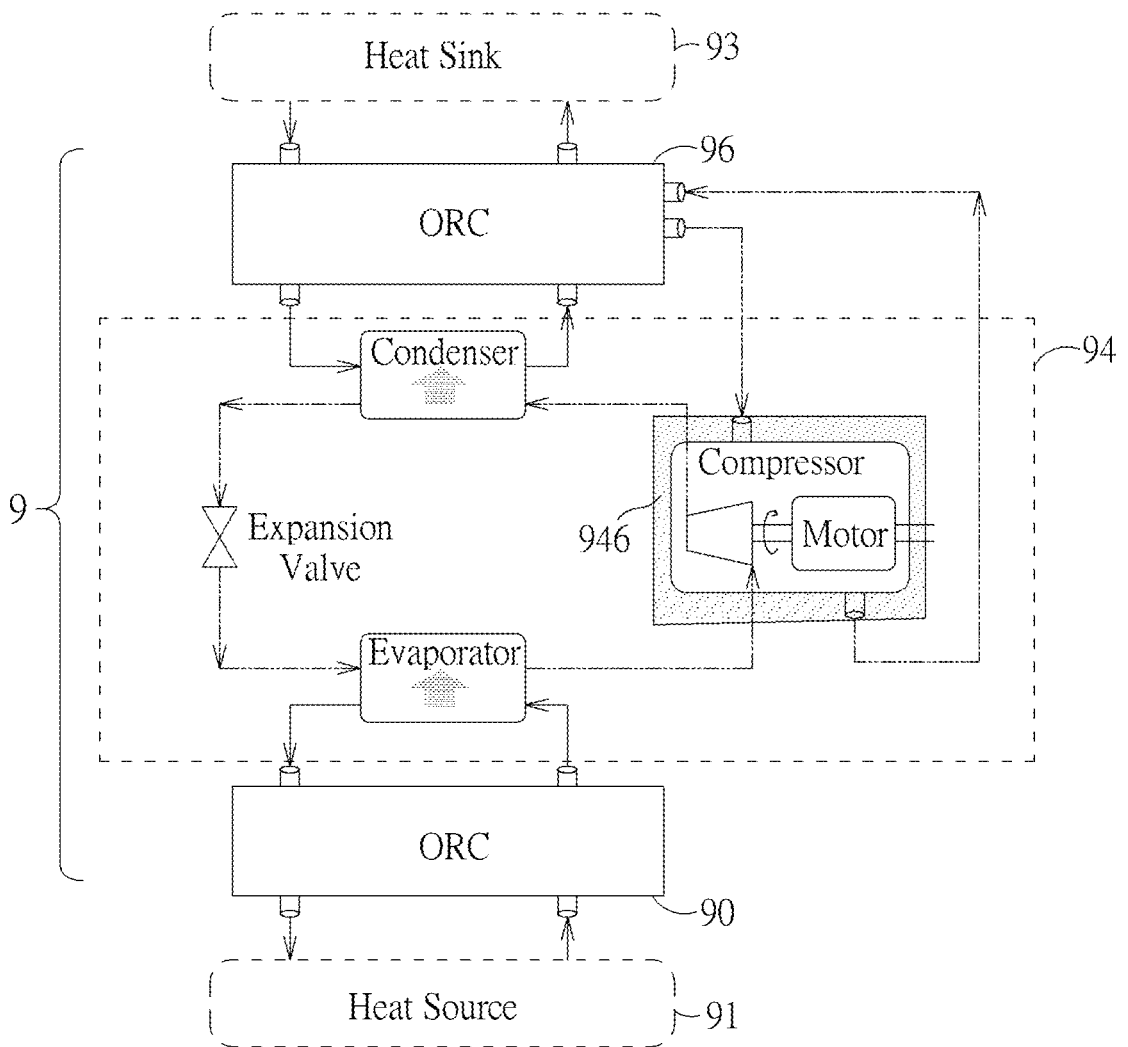
FIG. 17 illustrates a schematic diagram of a heat harvesting system according to an embodiment of the present invention.

FIG. 17 illustrates a schematic diagram of a heat harvesting system 9 according to an embodiment of the present invention. The system 9, connected upstream to heat source 91 and downstream to heat sink 93 (e.g., cooling tower), comprises two ORC generators 90, 96, sandwiching one chiller 94 in between. The ORC generator 90/96 may be the ReORC introduced in the present application. The chillers 94 may function as heat sink of the ORC 90 (by connecting Heat-sink source/return of ORC 90 to the Evaporator outlet/inlet of chiller 94) and function as heat source of ORC 96 (by connecting Heat-source source/return of ORC 96 to the Condenser outlet/inlet of chiller 94). The ORC 90 harvests the heat from the heat source 91, chiller 94 functions as a heat-pump, raising the temperature of unharvested heat received from ORC 90, and the ORC 96 harvests the heat from the chiller 94 under a temperature-raised, more optimal condition. System 9 may be a multi-stage or a 2-stage ReORC system.

Figure 18:
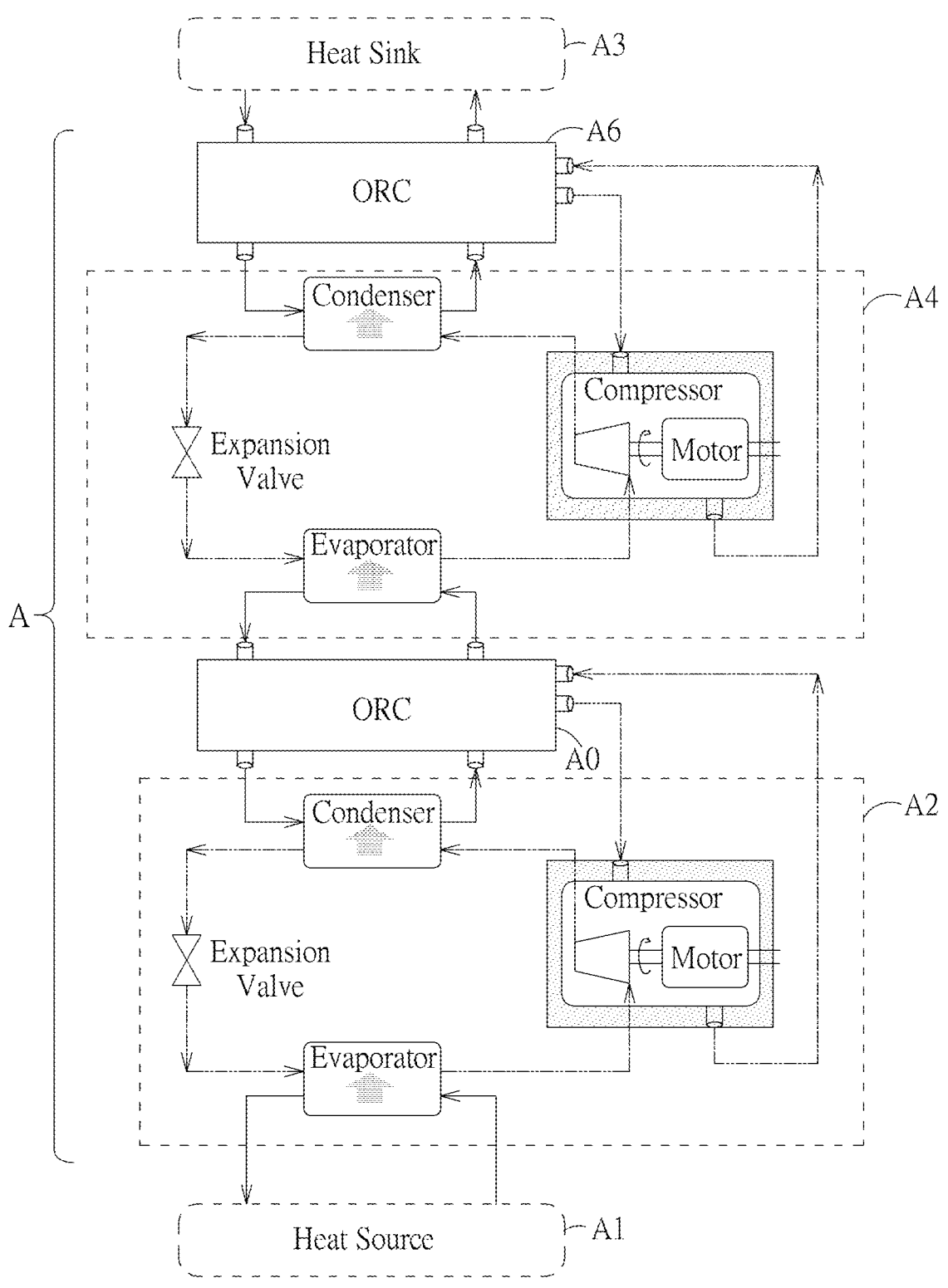
FIG. 18 illustrates a schematic diagram of a heat harvesting system according to an embodiment of the present invention.

Combining concept introduced in systems 8 and 9, FIG. 18 illustrates a schematic diagram of a heat harvesting system A according to an embodiment of the present invention. System A, connected upstream to heat source A1 and downstream to heat sink A3 (e.g., cooling tower), which comprises ORC generator A0, A6 and chillers A2, A4.

Figure 19:
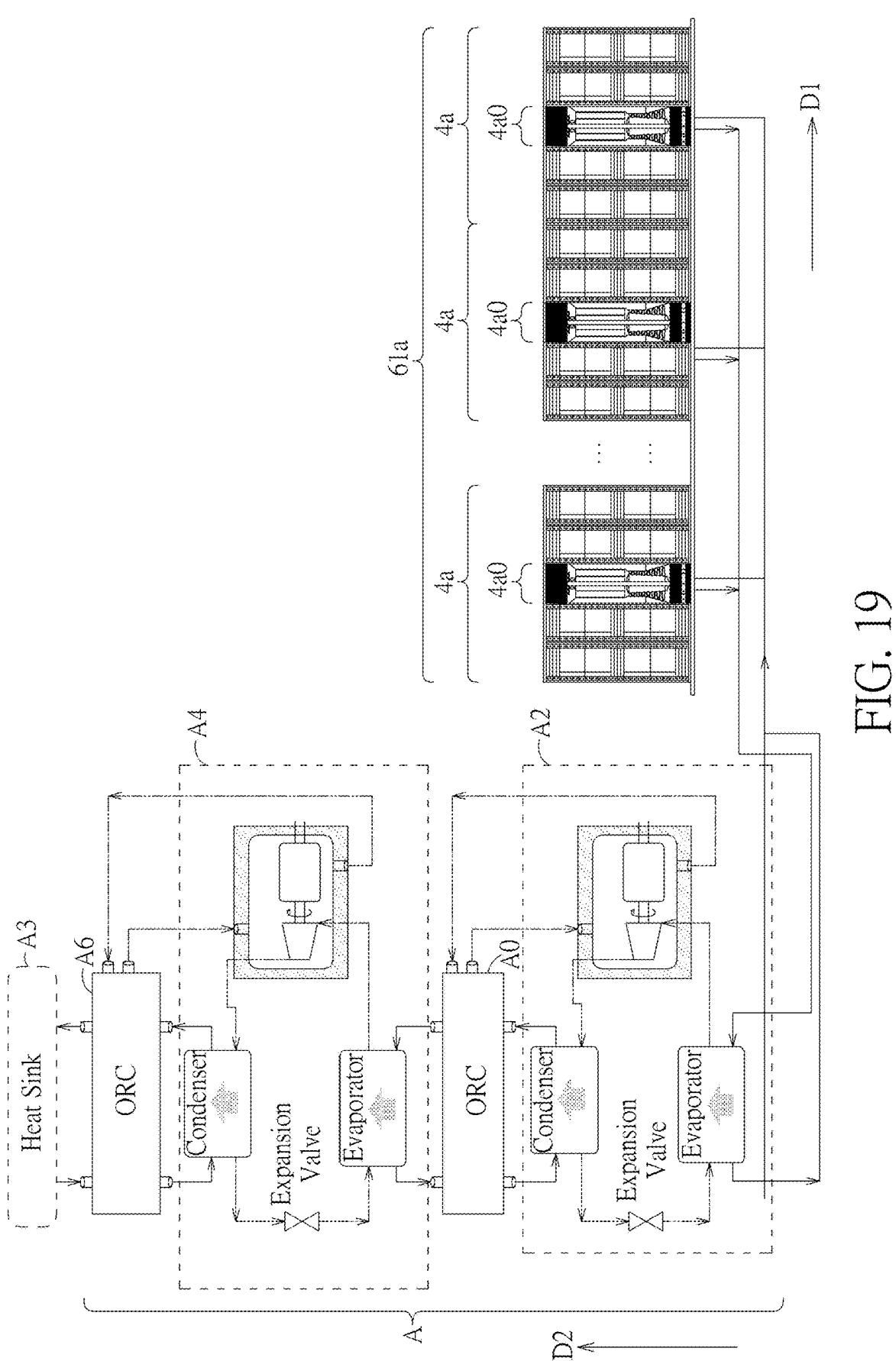
FIG. 19 illustrates a schematic diagram of a heat harvesting system and a heat source according to an embodiment of the present invention.

Connecting the heat harvesting system A with the heat source 61a, such as the embodiment shown in FIG. 19, may be the most effective solution to address the rapid rising electric power demand for host city of data center. By connecting the ORC A0 to the Condenser ports of chiller A2, which may reach as high as 86° C., and connecting the ORC A0 to Evaporator ports of chiller A4, which may reach as low as 8° C., and assume a low $T_{BP}$ working fluid such as R1233zd(E), R245fa or R1234ze(Z) is used as working fluid in the ORC A0, then, based on vapor pressure to temperature plot FIG. 14, the $\Delta P_{VPR}$ developed in the ORC A0 may reach 7~8.5 ATM, or 103~125 PSI, 1.7~2.1× the $\Delta P_{VPR}$ of roughly 4 ATM in the ORC 60 (where Novec™ 7000 is used as the working fluid and facility fluid returning from cooling tower, which is limited by wet-bulb temperature, serves as the cooling source of ORC.) This 1.7~2× higher $\Delta P_{VPR}$ of system A means heat previously unharvested in system 6 can now be harvested and converted to electricity in system A, allowing ORC A0 to achieve WHHR of 80~87%.

Specifically, given the potentially large number of instances of ORCs 4a0 (e.g., 1,000 for data center with 4,000 racks), the design of ORC 4a0 may favor compact size, lighter-weight, lower-cost, even when of WHHR$_{4a0}$ needs be compromised, because the savings in bulk, weight and cost will add up across (in horizontal/parallel or over a direction D1 in FIG. 19) the large number of instances of the ORC 4a0 while the sacrifice in WHHR (due to compact size, lighter-weight, lower-cost of ORC 4a0) can be compensated (in vertical/series or over a direction D2 in FIG. 19) by the ORC A0, which not only operates under a far more favorable condition ($\Delta P_{VPR} \approx 7~8.5$ ATM for ORC A0 vs. AP$_{VPR} \approx 1.4$ ATM for ORC 4a0) but also has far fewer instances (likely 20~80 times fewer) than the ORC 4a0, resulting in a system that is lower in overall cost, weight, bulk while achieving the same or even better WHHR at the system level.

As mentioned previously, instead of converting man-made "waste-heat" to electricity (WH2E) in addressing waste heat management & electricity demand of datacenter and AI compute as shown in FIG. 19, the methods and apparatus of this invention can also convert excess "ambi-ent-heat" (thermal energy) to electricity (electrical energy) (AH2E, ambient heat to electricity), producing cooler/dryer-air as a result. In addition to cool-air and electricity, other important AH2E byproducts include: 1) potentially lower humidity when the atmosphere is both very hot and very humid, a combination fatal for human survival; and 2) the $H_2O$ extracted from ambient by condensation. These three factors, air temperature, air humidity and $H_2O$ extraction, will be crucial for "climate adaptation" applications of AH2E. In these applications, the three factors mentioned above will be the primary focus, and electricity will be secondary. Such priority shifts can cause AH2E system to differ from WH2E system.

FIG. 20 illustrates a climate adaptation AH2E 61b for living space improvement according to embodiments of the present invention. Heat source 61b, or more accurately heat collector 61b (collecting heat from the nearby atmosphere, which is the true heat source), comprises a plurality of parasol-funnel combo units, each combo unit collects hot air from its nearby surrounding space, rejecting heat to a cooling fluid when passing through a heat-exchanger, low-ering temperature of the air in the process, producing cool air as a result. Thereby, parasol-funnel combo unit can also be considered as an air cooling system like air cooling system shown in FIG. 8. The heat source 61b may be disposed in outdoor places such as the surrounding of premium hotels, real-estates, office buildings or high traffic open spaces like shopping districts, fairgrounds, etc., where underground network of source & return cooling fluid (likely water-based mixtures) may be pre-established, and AH2E parasol-funnel combo units (or air cooling system) can be installed either on-demand based on short-term needs (such as events or weekend markets at the fairgrounds), or permanently (such as around premium real-estates, hotels, office buildings or shopping districts). When operating, the heat harvesting system of FIG. 20 harvests & transforms ambient heat into electricity, lowers air temperature as a result, and provides chilled air for dwellers & pedestrians.

Note that unlike A/C system which moves heat from space-A to space-B (usually from indoor spaces to the atmosphere immediately outside of the space being cooled), under the assumption that space-A is reasonably insulated from space-B, the climate adaptation system depicted in FIG. 20 lowers the temperature (a measure the thermal content) of air by harvesting & transforming the thermal energy (heat) to electricity, another form of energy. In other words, heat is removed from air not by moving it to another location, as in A/C (air conditioner), but by transforming heat to another form. As a result, the system depicted in FIG. 20 (and/or its derivatives) will be able to cool the air in open space, without needing to isolate the space being cooled from other spaces.

By combining AH2E's ability to cool open-space and the possibility to extract $H_2O$ and lower ambient humidity, AH2E (Re)ORC can be used to adapt micro-climates (within the area covered by heat collecting apparatus, e.g., the parasol-funnel combo units in FIG. 20) from being either too hot-'n-dry for growing plants or crops (i.e., for arable land cultivation) or too hot-'n-humid for human dwelling (i.e., for living space improvement) to lands/spaces with mild tem-perature, balanced humidity, moderate water usage, even during the hottest summer months.

FIG. 21 illustrates a climate adaptation AH2E system 61c (which may be considered as a heat source) according to embodiments of the present invention for arable lands cultivation in hot and water-scarce environments. For sim-plicity, label 61c shall refer to both the collective of parasol-funnel heat/air gathering units and the overall agriculture system. Heat source or agriculture system 61c comprises parasol-funnel combos 61c0 and inter-parasol-link (IPL) 61c2. IPL 61c2 may have high permeability for air and low permeability for water vapor. Such characteristics will allow air to flow through relatively freely but minimizes water vapor dissipation at the same time.

Within agriculture system AH2E 61c, water is absorbed by plants from soil 61c4, transported to plants' leaves and released to the atmosphere via stomata. Different from conventional agriculture systems where water vapor released by the plants is dissipated into the open atmosphere and fresh irrigation is needed to keep plant growing, an agriculture system based on AH2E 61c comprises a collec-tive of parasol-funnel combo units (61c0) which will gather the air rising from the plants/crops & soil, along with humidity/vapor released by the plants. This humid air is then fed through heat exchangers 610c where, with the help of the heat harvesting system, heat is harvested & converted to electricity while humidity ($H_2O$ vapor) is condensed to water.

In hot and dry climates, the heat exchangers 610c and the heat harvesting system of FIG. 21 not only removes poten-tially prohibitive heat of local climate from burning the plants, but also captures the humidity emitted into the air by the plants and condensed it back into water, which would greatly alleviate the demand on water resource in the water-scarce environments.

To optimize the "water retention" aspect of the system depicted in FIG. 20, the area to be "weather adapted" by AH2E should be constructed such that humidity escaping from the top and water seeping out from the bottom is minimized, such as by surrounding area to be climate-adapted with water-tight structures (walls, etc.) that is both high enough above ground and deep enough below ground. Within such surrounded area, so long as the parasols or canopies are dense enough or linked with low-breathability material (e.g., 61c2 shown in FIG. 21, which may be shade cloth/netting), not only can temperature be maintained under the canopies but also the humidity (water vapor) can be kept circulating (e.g., by motor 503 and fan 504 shown in FIG. 8) within the space enclosed by the parasols/canopies.

In addition to maintaining the temperature and humidity of the climate adapted area for optimal plant/crop growth, the agriculture system 61c, which is intrinsically a heat harvesting system, will also generate abundant electricity via AH2E during the hottest day of summer.

In a basic embodiment, heat harvesting system 2 of FIG. 2 may be adopted as the Heat Harvesting System in FIGS. 20 and 21, connected with the heat source 61b, forming a 1-stage AH2E system. Despite its simplicity, the cooling capacity and AH2E efficiency of such a 1-stage AH2E system will be limited by the ambient wet-bulb temperature, assuming cooling tower is used as heat sink for the heat harvesting system 2. This limitation could cause issues in some scenarios, e.g., the air 507 exiting heat exchanger 507 is not cool enough for occupants' comfort in FIG. 20, humidity does not condense into water and escape from system of FIG. 21, large quantity of water required to operate cooling tower, etc.

One way to improve these two parameters is to upgrade to a 2-stage AH2E embodiment such as shown in FIG. 22, where inter-stage chiller 94 is inserted to provide chilled facility fluid to and process the returned facility fluid from the $1^{st}$ stage ORC 90 (i.e., pumping the heat to facilitate the operation of the 2nd stage ORC 96). In this arrangement, the ORC 90 is freed from the constraint of ambient wet-bulk temperature, and, with suitable chiller and coolant, its cooling capability can be extended down to 8~12° C. (if ReORC is used). Note that, in addition to expanded cooling capacity, the much colder fluid from chiller 94 means working fluid with lower boiling point, e.g., R1233zd(E) @18.3° C., R245fa @15° C. or R1234ze(Z) @9.8° C., can be used in the ORC 90. Such lower BP working fluid can 1) improve the efficiency of the ORC 90; and 2) extract $H_2O$ from ambient humidity by condensing. The extracted $H_2O$ may be used in the cooling tower of the AH2E system itself or wherever $H_2O$ is most needed.

In embodiment of FIG. 23, the heat harvesting system 8 may connect with the heat source (of system) 61b, where chiller 82 may chill its facility fluid (primary supply) down to 8~12° C., ensuring system 61b has the same air-cooling power no matter what the ambient temperature is. Cooling source (heat-sink) of or cold facility fluid for the ORC 80 comes from (Primary Supply or Evaporator ports of) chiller 84, which may also be cooled to 8~12° C., which allows the ORC 80 to adopt low $T_{BP}$ working fluid like R1233zd(E), R245fa or R1234ze(Z). The heat source to the ORC 80 is the exhaust of condenser of heat-pump/chiller 82, which may be in the range of 75° ~ 90° C., where top vapor pressure $P_{VPR}$ can be raised to 6~10 ATM, according to the plot in FIG. 14.

When optimized, the combination of operating conditions above can produce $\Delta P_{VPR}$ of up to 8 ATM in the ORC 80, a rather favorable condition, under which a well-designed and fabricated ReORC may reach or exceed WHHR of 90% relatively easily.

In an alternative embodiment of FIG. 23, instead of heat source 61b, the heat harvesting system 8 may connect with the heat source 61c, where the chiller-(Re)ORC-chiller sandwiched structure of the system 8 is adopted for the high $\Delta P_{VPR} \approx 8$ ATM in ReORC 80 and the chilled 8~12° C. facility fluid is the cooling source to heat exchanger 610c. Due to the use of such chilled water as cooling source, this heat exchanger will be able to condense most ambient humidity collected under the canopies back to water and achieve the goal of "water conservation by recycling humidity in the air".

In the context of "climate adaptation" AH2E application, it's reasonable to assume generating electricity may no longer be the primary goal. However, even in AH2E, higher WHHR means higher percentage of heat is converted to electricity, which means more heat is removed from the ambient and the temperature of ambient will drop lower as a result. So, even for AH2E systems, it's still important to achieve high WHHR.

FIG. 24 illustrates curves of wet-bulb temperature ($T_{WB}$) and dew point ($T_{DP}$) of water plotted versus humidity (X axis) at ambient temperature of 39° C. From FIG. 24 several observations are made: 1) both $T_{WB}$ and $T_{DP}$ drop as relative humidity drops; 2) $T_{WB}$ is always higher than $T_{DP}$; 3) $T_{DP}$ drops at sharper rate as relative humidity drops; 4) if two spaces are separated to have different relative humidity, then $T_{DP}$ in the more humid space can rise above $T_{WB}$ of the dryer space.

Therefore, a fully outdoor/open-space (meaning temperature and relative humidity are the same as open space), since $T_{WB} > T_{DP}$ is always true, 1-stage AH2E ReORC system using cooling tower as source cooling water will NEVER be able to extract $H_2O$ from ambient humidity by condensing. For the ambient humidity to condense in a fully outdoor/open-space AH2E ReORC system, a chiller must be used to lower the temperature of the source cooling water (as cold facility fluid) of ReORC below $T_{DP}$.

On the other hand, in "arable lands cultivation" adaptation" ReORC AH2E applications, since one of the key focus is to "minimize vapor loss" and, in order to prevent humidity from escaping, the gaps between canopy/parasol may be kept narrow or rendered partially sealed with perforated interconnect (e.g., panels/films with pores), as indicated by the dashed line segments 61c2, so that relative humidity underneath the canopy/parasol may be much higher than the true open-space outside/above of the canopy/parasol. Such water vapor retention treatments (but not limited herein) may help push the humidity above 90% ⇨ $_{WB}$<$T_{DP}$ is possible ⇨ possible for the high relative humidity air to condense into water with cooling tower (located in open-space, outside of the canopy/parasol coverage, low humidity) as source of cooling water.

Note that, the amount of vapor can be condensed from a high humidity air can be estimated by the curve $T_{DP}$ in FIG. 24: a) let the humidity of air under the canopy/parasol be m %; b) Let the $T_{DP}$ curve of FIG. 24 at the temperature of cold water from cooling tower be k %; then, c) the limit of humidity extraction by condensing is (m−k) %. For example, if the water from cooling tower is 27° C., then max. % of humidity can be condensed is (m−50) %, where m % is the relative humidity of air under the canopy/parasol.

Therefore, for the "arable lands cultivation" subcategory of the overall "climate adaptation" application, under favorable conditions, it is possible to apply a 1-stage ReORC AH2E, skipping the chiller, without catastrophically affecting the "water usage" efficiency. However, the % of water recovery is quite suboptimal and susceptible to the unpredictable weather changes. Therefore, a 1/2-stage ReORC AH2E with 2/1 inter-stage chillers, such as system 8/9, is still a more reliable solution.

Note that, in heat harvesting systems discussed so far, the heat remained unharvested after recursion would eventually be dissipated to the atmosphere via heat sink, which is typically realized by cooling tower. This is a major leakage of heat from the heat harvesting systems and a grave violation of one of the objectives of the present invention, "Encapsulation", and it is highly desirable to remedy this deficiency.

FIG. 25 illustrates a schematic diagram of a conventional cooling tower B3. Cooling tower B3 may serve as the heat sink of the present application. Cooling tower B3 comprises a (hot fluid) distributor B12, fills B13, a fan B304 and a (cooled/cold fluid) basin B03.

The cooling tower B3 is classified as an induced draft, double-flow crossflow cooling tower. Cooling tower B3 receives warm/hot fluid (e.g., water) fdB1$w$ via the distributor B12 at the top (suffix "w" indicates "warm"). Warm/hot fluid fdB1$w$ may be sprayed out by distributor B12, it then flows down through fills B13, releases the heat it contains to crossflowing air B05 by vaporization, produce hot and humid airflow (or updraft) B06 toward an empty center space B02. As heat is progressively released into vapor when fdB1 (without suffix "w", indicate no longer warm) flows down the fill, when fdB1 approach bottom of fill B1 its temperature will approach the wet-bulb temperature and become fdB1$c$, where suffix "c" indicates cool/cold, fdB1$c$ is then collected in the basin B03 and be outputted as cool/cold fluid fdB1$c$. The hot and humid airflow B06 (carrying heat and humidity released from the warm/hot fdB1$w$) when then float upwards (by buoyancy of hot-humid air) and pulled from center space B2 out to the open-space (atmosphere) by exhaust fan B304. The heat and vapor/humidity carried by the airflow B06 will then dissipate upwards into the ambient, not coming back to the cooling tower B3.

However, if the heat and vapor carried by the airflow B06 can be recycled or recursively harvested, a major leakage of heat would be plugged, making the system significantly better encapsulated, enhancing the re-entry ratio r and thus improves the system's total WHHR.

FIG. 26 illustrates a schematic diagram of a heat-harvesting (HH) cooling tower B3$a$ according to an embodiment of the present invention. This HH cooling tower B3$a$ is modified from cooling tower B3, and thus same components are denoted by the same denotations. Different from cooling tower B3, HH cooling tower B3$a$ further comprises: a heat exchanger B310, disposed in the center of previously empty space B02, between (in the middle of) the two fills B13; a top cover B04, to form a closed-loop circulation B35 either by natural convection or, optionally, by powered motor and fan B304; a set of walls B11 and bottom plates B11$b$, to separate the space around heat exchanger B310 from the space around fills B13; and finally, deflectors B03$d$, to deflect cold air B08 upwards, into incoming airflow B05, facilitating formation of closed-loop circulation B35.

Following paragraphs serve as illustration of how HH cooling tower B3$a$ may operate, and they are not to be treated as limitations of the HH cooling tower of the present invention.

In FIG. 26, hot/warm fluid (e.g., water) fdB1$w$ starts to vaporize as it rains down from the distributor B12 onto fills B13 and flows downwards through fills B13. The buoyancy of vapor and hot air produces updrafts (or airflows) B06 along the two unobstructed channels between inner sides of fills B13 and walls B11, inducing or pulling open-space ambient air or crossflow B05 into the cooling tower B3$a$. Cold fluid fdB2$c$, which may be produced by a chiller (not shown in FIG. 26), enters the heat exchanger B310 (e.g., from the bottom), flows (upwards) through heat exchanger B310, absorbs heat from downward draft B35 to become warm fluid fdB2$w$, and warm fluid fdB2$w$ exits B310 (from its top), creating a (vertical) ascending temperature gradient within heat exchanger B310, where the temperature is close to the temperature of fdB2$c$/B35 at the bottom/top of B310.

Let's first examine how air flows with natural convection first (i.e., without motor & fan B304). The buoyancy of hot air and vapor release by fdB1 causes updrafts B06 by pulling air B05 into B3$a$. Updrafts B06 meet a down draft B07 at the top of heat exchanger B310 where downdraft B07 is induced by the vertical falling temperature gradient (colder at the bottom) created by the cold fluid fdB2$c$ entering the heat exchanger B310 from the bottom (note: downdraft B07 is separated from updrafts B06 by vertical partition walls B11). Let the temperature of cooling source fdB2$c$ be 8~12° C., then temperature of downdraft B07 exiting heat exchanger B310 and side-drafts B08 will be slightly higher than temperature of fdB2$c$ (8~12° C.). To use this cool air optimally, air guide or deflectors B03$d$ (e.g., created by extending the basin sidewall), may be used to deflect/guide the side-draft B08 (cool air) upwards to merge with crossflows B05, completing a quasi-closed-loop, creating an airborne recursive thermal energy harvesting loop/circuit.

The cold fluid fdB2$c$ entering the heat exchanger B310 may be cooled to 8~12° C. by a chiller (not shown in FIG. 26). Such cold water will condense most of the humidity (vapor) carried by updraft B06 (which subsequently turns into downdraft B07) to water droplets (liquid) B09, when air (and vapor) flows through heat exchanger 310, and liquid B09 will fall into the (liquid/water) basin B03 due to gravity force FG.

Note the above description rely only on the natural convection, combining the lifting force of buoyancy from hot-&-humid air with the sinking force from the descending temperature gradient going down the heat exchanger B310. Therefore, the involvement of motor & fan B304 is strictly optional, and the inclusion (of B304) depends on whether the added flexibility & controllability outweigh the increased power and cost of the B304.

FIG. 27 illustrates a schematic diagram of a heat-harvesting (HH) cooling tower B3$b$ according to an embodiment of the present invention. Different from the HH cooling tower B3$a$, the HH cooling tower B3$b$ optionally comprises sidewalls B14. With the deflectors B03$d$ and the sidewalls B14, a fully enclosed air circulation (in a sequence of B05=>B06=>B07=>B08=>B05) is formed (as opposed to the quasi-closed-loop of B3$a$), where the side-draft B08 would be guided and become the crossflow B05.

In an embodiment of the present invention, the HH cooling tower may transform between B3$a$ and B3$b$ based on the current local weather. For example, the HH cooling tower may take the form of B3$a$ by opening/removing the optional cover B14 when the local temperature falls between 3~20° C. and take the form of B3$b$ by closing the optional cover B14 otherwise.

In short summary, the HH cooling tower B3$a$ receives hot/warm fluid fdB1$w$, distributes the hot/warm fluid fdB1$w$ over the fills B13. The hot/warm fluid fdB1$w$ rejects heat toward the crossflow B05 within the fills B13, and the crossflow B05 becomes the updrafts B06 with heat and humidity. The heat carried by updrafts B06 are rejected to the heat exchanger B310, where the heat exchanger B310 receives cold fluid fdB2c near its bottom and a vertically upwards ascending temperature gradient is established therewithin. Through the heat exchange and the condensing within the heat exchanger B310, cold and dry side-draft B08 and condensed liquid fluid B09 are produced, the condensed liquid fluid B09 is collected in the basin B03 becomes cold fluid fdB1c.

Via properly deigned air guide/deflector B03d, the cold and dry side-draft B08 are re-mixed with/as or become the crossflow B05 reentering through fills B13, lowering the temperature of crossflow B05 and enhancing heat transportation efficiency within the fills B13. This circulating and recycling of the air (and the humidity it carries) within/around the HH cooling tower B3a/B3b lessens (or substantially eliminates) the heat and humidity dissipated to open space. As a result, when compared to conventional cooling tower like B3, HH cooling towers like B3a/B3b re-harvest both heat and humidity, sparing precious resources such as energy and water.

Regarding the heat absorbed by the heat exchanger B310, the warm fluid fdB2w can go to a heat-to-electricity (H2E) harvesting system where the heat in fdB2w (which was rejected from the hot/warm fluid fdB1w) can be harvested and converted to electricity. This topic will be covered later.

The HH cooling tower B3a might optionally comprise a diverting structure B10. In embodiments where motor & fan B304 is employed for active circulation, the volume of liquid fluid B09 and the speed of downdraft B07 may both be high, creating splashes in water basin, and downdraft B07 needs to rotate 90° into side-drafts B08, causing excessive turbulence. To mitigate these effects, the diverting structure B10, whose contoured surface may be perforated, may be included to both smooth out the liquid flow of B09 and facilitate the B07 ⇨ B08 90° airflow direction transition.

The HH cooling tower B3a might optionally comprise partitions B11, configured to isolate downdraft B07 from updrafts B06 (alternatively, B310 may be designed to have its sidewalls to achieve this B06⇔B07 isolation). Furthermore, partitions B11 may further comprise (or connect to) horizontal/bottom plates B11b to guide the side-draft B08 all the way out until merging with the crossflow B05, preventing the downdraft B07 or side-draft B08 from returning to the space B02 prematurely, and thus ensures the updraft B06 comprises entirely of air having passed through the fills B13.

To ensure close loop air flow circulation, the top of cooling tower B3a/B3b is closed off by the top cover B04. Furthermore the motor-fan B304 is placed beneath cover B04, exposed to airflow B35, meaning the heat generated by B304 will be collected by airflow B35 and later on harvested by a H2E system.

To smoothen updrafts B06 and downdraft B07 and minimize the turbulences, which waste kinetic energy useful for air circulation, the top edges of partitions B11 and the corners where B11 connects to B11b may be chamfered or flared.

Depending on the dimensions of HH cooling towers B3a, e.g., height of the heat exchanger B310, and details of designs of B310 and B11, the speed of downdraft B07 from natural convection alone may be fast enough, making fan B04 optional. That is, instead of forced-air, embodiment B3a may operate purely by convection.

In another perspective, if the goal of B3a is not only to reduce water usage and reclaim waste heat from operation within the facility, but also to harvest excess ambient heat and humidity from the open-space, then inclusion of fan B04 may be easily justified as it helps pull in more air from open-space and increase the ambient heat absorption rate of B310. Note that, different from cooling tower purely for AH2E or WH2E application, where the purpose of fan B04 may simply be facilitating airflow circulation within cooling tower B3a, in applications where "ambient heat/water harvesting" is one of the B3a design objective, the quantities of electricity (and even water) generated during the hottest hours of the year may exceed those consumed by the facility.

The embodiments of HH cooling tower (e.g., B3a/B3b) in induced draft, double-flow crossflow construct is just for illustrative purpose, and the present invention is not limited thereto. The cooling tower warm/hot airflow heat harvesting concepts, methods, apparatuses of this invention may be applied to any kinds of cooling towers, including induced, forced or natural draft cooling towers, counterflow or crossflow cooling towers, single-flow or double-flow (crossflow) cooling towers, and others.

As long as a cooling tower comprises any of the following features, it is within the scope of the present invention.

i) A heat exchanger is deposited in the pathway of hot/humid airflow to extract heat from the hot/humid airflow.

ii) The circulation of airflow forms a loop; the circulation can be either enclosed (a complete loop) or a semi-open (a quasi-loop).

iii) Any apparatus (e.g. deflectors) to cause/facilitate forming the above airflow loop.

Note that, in the present invention, drafts in all kinds of directions are considered as a kind of airflow.

The HH cooling tower (e.g., B3a/B3b) may be employed as heat sink of the heat harvesting system of the present invention. That is, the HH cooling tower (e.g., B3a/B3b) may serve as the heat sinks 23, 33, 53, 63, 73, 83, 93, A3, to further enhance WHHR. Note that, it is the fills along with the hot water distributor and basin play the role of heat sink. By collecting "waste heat" from cooling tower, heat exchanger B310 will also functions as a (secondary) heat source. In other words, HH cooling tower serves dual roles of both a heat-sink (with its hot water distributor, fill, crossflow, cold water basin) and a heat source (with its heat exchanger).

FIG. 28 illustrates connection between the HH cooling tower, the heat harvesting system and the primary heat source, according to an embodiment of the present invention. On one hand, the HH cooling tower receives the warm/hot facility fluid fdB1w from the heat harvesting system via port op3 and provides the cold facility fluid fdB1c to the heat harvesting system via port op4. On the other hand, the heat harvesting system provides the cold facility fluid fdB2c to primary heat source (e.g., 21, 21a, 31, 51, 61a, 61b, 61c) and secondary heat source (e.g., the heat exchanger B310) via port op1, and harvest heat from both the primary and the secondary heat sources by receiving returned warm facility fluid fdB2w via port op2. In an embodiment, the primary heat source may be CRAC system or cooling unit used in data center where the CRAC system or cooling unit receives hot/warm air from hot aisle and generating cold air toward cold aisle. In another embodiment, the primary heat source may be an array of ReORC heat harvesting units 4a0 such as depicted in FIG. 12, 13, or 19.

FIG. 29 and FIG. 30 illustrate heat flow diagrams regarding a HH cooling tower 22 and a heat harvesting system 2d of the present invention, wherein FIG. 29 is from a centric perspective of the heat harvesting system and FIG. 30 is from a centric perspective of the HH cooling tower. The heat harvesting system 2d comprises at least a ReORC 20 (where chiller(s) and/or other component are omitted for brevity). The HH cooling tower 22 can be separated into a heat sink portion 23d (representing the hot fluid distributor, the fill(s) and the basin within the cooling tower) and a (secondary) heat source portion 21d (representing the heat exchanger B310 disposed within the HH cooling tower). Heat Q23d from hot fluid via the port op3 is released within the heat sink portion 23d of the fill(s) B13; after Q23d is absorbed by crossflow B05, B05 becomes hot-humid updraft B06. When updraft B06 is induced or drawn into the heat exchanger B310, heat Q21d is rejected from updraft B06 when B06 passing through heat exchanger B310 and Q21d becomes the (secondary) heat source portion 21d. Different from convention cooling tower, the heat Q23d released from the hot fluid via the port op3 would be transported as the heat Q21d by air (or updraft B06) and be harvested via the port op2, with little heat loss from Q23d to Q21d. Hence, WHHR would be significantly enhanced.

FIGS. 31 and 32 illustrate schematic diagrams of systems for heat harvesting according to embodiments of the present invention. FIG. 31 illustrates a concept of one ORC sandwiched between two chillers (similar to the system 8), represented in a more abstract way to highlight different arrangements of facility fluid circuit. For example, system Ca comprises an ORC sandwiched between a front-chiller and a back-chiller. The front-chiller provides cold facility fluid (from its evaporator) to the heat source, the ORC harvest heat from (the compressor of) the front-chiller, and back-chiller provides cold facility fluid (from its evaporator) to the ORC, where chiller providing cold facility fluid is to facilitate heat exchange within heat source or within ORC. The ORC shown in the system Ca can be either a conventional ORC (as shown in system Cb) or an ReORC (as shown in system Cc), and the difference in facility-fluid plumbing between ORC condensers (cds) and ORC evaporators (evp) and the relationship between facility-fluid circuit and working-fluid circuit are shown in the system diagram Cb and Cc.

Note that in FIG. 31, the circuits of facility fluid chain the function blocks (e.g., heat source/sink, ORC, chiller) together, similar to forming a 1-way, non-looping system. Each facility fluid circuit, facilitating the (thermodynamic) cycles of working fluid within the function blocks (e.g., ORC, chiller), involves heat absorption and heat rejection. As can be seen from FIG. 31, there is an upward heat movement direction which never turns back, therefore, no loop is formed.

When the heat sink in FIG. 31 is realized by conventional cooling tower, as an open loop system, heat rejected from the facility fluid circuit within the heat sink would eventually be dissipated toward ambient and would not be recycled.

On the other hand, when the heat sink is realized by HH cooling tower of the present invention, in a system Da shown in FIG. 32, an addition (loopback/feedback) circuit (e.g., circuit cktDa) is established, with which each pair of neighboring function blocks are chained together by a distinct circuit of facility fluid, with no loose ends, forming a closed loop thermodynamic system.

Specifically, the primary and the secondary heat sources (heat-exchanger inside HH cooling tower Da3) are chained together by loopback/feedback circuit cktDa, which is configured to transport heat QDa back from (the heat exchanger inside) HH cooling tower Da3 to the corresponding ports between Front-Chiller and the Primary Heat Source, so that heat QDa (which was to be dissipated) can merge with heat QDp of Primary-Heat-Source, enter Front-Chiller, ORC, etc., and be recursively recycled/harvested, so as to enhance re-entry ratio r and/or enhance WHHR.

Similarly, a (loopback/feedback) circuit (e.g., circuit cktDb) may be included, as shown in system Db in FIG. 32 where the loopback/feedback circuit cktDb is configured to transport heat QDb from the Back-Chiller to the corresponding ports between Front-Chiller and the Primary Heat Source. Note that schematic Db has gotten rid of the cooling tower all together and short-cutting the heat-harvesting looping to the compressor exhaust outlets directly. When the WHHR of the ORC stage is high enough, system based on schematic Db has the potential to achieve very high re-entry ratio r and therefore high overall system WHHR.

From FIG. 32, the heat harvesting system (e.g., Da/Db) of the present invention may comprise an ORC (which can be ReORC), a front subsystem (e.g., Daf/Dbf) and a back subsystem (e.g., Dab/Dbb). The ORC provides/receives cold/warm facility fluid to/from the front subsystem, to harvest heat from the front subsystem. Meanwhile, the ORC returns/receives warm/cold facility fluid to/from the back subsystem, to dissipate (residual) heat within the ORC. In order to enhance re-entry ratio r, a loopback/feedback circuit (e.g., cktDa/cktDb) is included to transport/feedback the heat within the back subsystem back to or toward the front subsystem. Hence, overall system WHHR would be enhanced (according to eq. 2).

Furthermore, heat harvesting systems with loopback/feedback circuit are not limited to the ones shown in FIG. 32. FIG. 33 illustrates alternative schematic diagrams of heat harvesting systems, Dc and Dd, with loopback/feedback circuits, cktDc and cktDd. Compared to system Db, heat harvesting systems Dc and Dd may have better temperature matchiness between merging streams of facility fluid. For example, in system Dc of FIG. 33, facility fluid from/to condenser of front-chiller and from/to condenser of back-chiller are merged, and temperature of facility fluid from/to condenser of back-chiller can be made to match to temperature of facility fluid from/to condenser of front-chiller. Similarly, in system Dc shown in FIG. 33, warm facility fluid output from ORC and warm facility fluid output from heat source may have more or less the same temperature, and cold facility fluid to the heat source and cold facility fluid to ORC are both provided from the front-chiller. Good temperature matching between merging facility fluids can reduce undesirable inter-fluid heat transfer and enhance system's overall heat harvesting efficiency.

In FIG. 32 and FIG. 33, ORC comprises heat source ports p1, p2 and heat sink ports p3, p4. The front subsystem (Daf/Dbf/Dcf/Ddf) connected to the ORC via the heat source ports p1, p2. The back subsystem (Dab/Dbb/Dcb/Ddb) connected to the ORC via the heat sink ports p3, p4.

Note that, ORC in the present invention generally refers to the thermodynamic cycle involving evaporator, expander, electricity converting unit, condenser and pump. The recursion and encapsulation concept of present invention are applicable to variants of ORC, such as R-ORC (ORC with recuperator), OFC (organic flash cycle), and other present and future variants. All such variations are within the scope of the present invention.

Applications of the recursive and encapsulated heat harvesting systems are numerous. For example, the present invention may be applied for electric vehicle (EV) battery thermal management and range extension. Current EV battery thermal management systems (BTMS) employ active cooling (air or liquid), passive cooling (e.g., phase change materials-PCMs), or hybrid approaches. It is possible to integrate a compact ReORC system to convert the waste heat absorbed from the batteries into electricity. This recovered energy can be used to supplement the vehicle's auxiliary power needs or even provide a marginal boost to range, especially during high thermal load conditions. It is also possible to design the entire BTMS with a focus on minimizing thermal losses and maximizing heat recovery through the encapsulation techniques of the present invention.

The present invention may be applied for industrial process heat recovery for on-site power generation. Industries of the oil and gas, chemical, cement, and metals are major contributors to waste heat. Multi-stage ReORC systems with inter-stage chillers/heat pumps can be used to maximize energy extraction from varying temperature waste heat streams. Recursive encapsulation with robust thermal insulation may be designed to maximize heat re-entry into the cycle, significantly boosting overall conversion efficiency.

As mentioned earlier, the present invention may be applied for high-performance computing (HPC) and data center energy optimization. Converting the server heat directly to electricity via ReORC reduces the net power drawn from the grid specifically for cooling and potentially other loads, directly improving PUE (Power Usage Effectiveness). As the ReORC system can operate efficiently with facility water temperatures that avoid or reduce the need for evaporative/conventional cooling towers (by using the HH cooling tower instead), it could lead to significant water savings.

The present invention may be applied for decentralized power generation and cooling for off-grid/remote locations. A hybrid ambient/waste heat to electricity system including ReORC with integrated cooling/water production can be designed. The condensation process may not only facilitate power generation but also produce chilled air (as a byproduct of ambient heat absorption) or potable water, which offers multiple essential outputs from a single integrated system and provides significant value, especially in resource-scarce remote areas. The AH2E capability can provide cooling and power even using just ambient heat, a unique advantage in hot climates.

The present invention may be applied for advanced cooling and power for aerospace and defense electronics. Miniaturized ReORC generators may be developed, to convert heat from the most power-dense components directly into localized electrical power. This could power sensors or reduce the load on the main power system. By improving thermal management and potentially reducing power system demands through energy recovery, systems can operate for longer durations or support higher-performance electronics within the same power budget. Such systems can be more robust in wide temperature range environments.

In summary, the ReORC and the heat harvesting system improves upon conventional ORC systems by employing recursion and encapsulation. Recursion allows unharvested heat to be repeatedly cycled and converted, while encapsulation minimizes overall system energy loss and recycles heat generated from internal inefficiencies. This results in substantially higher WHHR, leading to a 10+ times reduction in net electricity consumption and significant water savings across diverse applications, including datacenters and HVAC/CRAC.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A system for cooling and heat harvesting, comprising:
a first organic Rankine cycle (ORC) and a second ORC; and
a first chiller, disposed between the first ORC and the second ORC;
wherein the first ORC is configured to harvest a first heat from a heat source and generate electricity; and
wherein the first chiller provides a first facility fluid to the first ORC;
wherein the first chiller comprises a first chiller evaporator;
wherein the first ORC receives the first facility fluid from the first chiller evaporator and returns the first facility fluid to the first chiller evaporator;
wherein the second ORC is configured to harvest a second heat from the first chiller and generate electricity.

2. The system of claim 1,
wherein the first ORC receives the first facility fluid from the first chiller and returns the first facility fluid to the first chiller; and
wherein the second ORC provides a second facility fluid to the first chiller and receiving the second facility fluid returned from the first chiller.

3. The system of claim 1,
wherein the first ORC comprises a first ORC condenser and a first ORC evaporator;
wherein the first ORC condenser provides the first facility fluid to the heat source, and the heat source returns the first facility fluid to the first ORC evaporator.

4. The system of claim 1,
wherein the first ORC comprises a first ORC condenser and a first ORC evaporator;
wherein the first ORC condenser receives the first facility fluid from the first chiller;
wherein the first ORC evaporator returns the first facility fluid to the first chiller.

5. The system of claim 1,
wherein the heat source receives the first facility fluid and returns the first facility fluid;
wherein a temperature of the first facility fluid returned by the heat source is higher than a temperature of the first facility fluid received by the heat source.

6. The system of claim 1,
wherein the heat source comprises a heat exchanger;
wherein the heat exchanger receives the first facility fluid from the first ORC condenser, and returns the first facility fluid to the first ORC evaporator.

7. The system of claim 6,
wherein the heat source is a cooling system comprising the heat exchanger.

8. The system of claim 7,
wherein the cooling system is configured to perform a cooling process on a data computation system.

9. The system of claim 7,
wherein the cooling system comprises a coolant condensing unit, and the coolant condensing unit is connected to a coolant chamber;
wherein the coolant condensing unit receives the first facility fluid from the first ORC condenser, and returns the facility fluid to the first ORC evaporator.

10. The system of claim 7,
wherein the cooling system is configured to perform a cooling process on an ambient environment of the heat exchanger.

11. The system of claim 6,
wherein the heat exchanger is disposed under a sunshade.

12. The system of claim 1,
wherein the first chiller comprises a first chiller condenser;
wherein the second ORC provides a second facility fluid to the first chiller condenser and the first chiller condenser returns the second facility fluid to the first chiller condenser.

13. The system of claim 1,
wherein the second ORC comprises a second ORC condenser and a second ORC evaporator;
wherein the second ORC condenser provides the second facility fluid to the first chiller, and the first chiller returns the second facility fluid to the second ORC evaporator.

14. The system of claim 1,
wherein the second ORC provides a first working fluid toward the first chiller;
wherein the first working fluid absorbs a third heat from a first compressor or a first motor of the first chiller and is returned back to the second ORC;
wherein the first chiller comprises the first compressor and the first motor.

15. The system of claim 14,
wherein the second ORC comprises a second ORC condenser and a second ORC evaporator;
wherein the first chiller comprises a first compressor a the first motor;
wherein the second ORC condenser provides the first working fluid toward the first chiller;
wherein the first working fluid absorbs a third heat from the first compressor or the first motor of the first chiller and is returned back to the second ORC evaporator.

16. The system of claim 14, comprising:
a first insulation chamber, configured to encompass the first compressor and the first motor of the first chiller;
wherein the second ORC comprises a second ORC condenser and a second ORC evaporator;
wherein the second ORC condenser provides the first working fluid to the first insulation chamber, the first working fluid absorbs the heat from the compressor and the motor of the chiller, and the first insulation chamber returns the first working fluid to the second ORC evaporator.

17. The system of claim 1,
wherein the second ORC receives a second facility fluid from a first heat sink, and the second ORC returns the second facility fluid to the first heat sink;
wherein a temperature of the second facility fluid received from the first heat sink is lower than a temperature of the second facility fluid returned to the first heat sink.

18. The system of claim 1,
wherein the second ORC comprises a second ORC condenser and a second ORC evaporator;
wherein the second ORC condenser receives the second facility fluid from a first heat sink, and the second ORC evaporator returns the second facility fluid to the first heat sink.

19. The system of claim 18,
wherein the first heat sink is a cooling tower;
wherein the second ORC condenser receives the second facility fluid from the cooling tower, and the second ORC evaporator returns the second facility fluid to the cooling tower.

20. The system of claim 18,
wherein the first heat sink is a second chiller;
wherein the second ORC condenser receives the second facility fluid from the second chiller, and the second ORC evaporator returns the second facility fluid to the second chiller.

21. The system of claim 20,
wherein the second chiller comprises a second chiller evaporator;
wherein the second ORC receives the second facility fluid from the second chiller evaporator and returns the second facility fluid to the second chiller evaporator.

22. The system of claim 20, comprising:
wherein the second ORC provides a first working fluid toward the first chiller and the second chiller;
wherein the first working fluid absorbs a third heat from a first compressor or a first motor of the first chiller and a third heat from a second compressor or a second motor of the second chiller;
wherein the first working fluid is returned back to the second ORC;
wherein the first chiller comprises the first compressor and the first motor;
wherein the second chiller comprises the second compressor and the second motor.

23. The system of claim 22, comprising:
a first insulation chamber, configured to encompass the first compressor and the first motor of the first chiller;
a second insulation chamber, configured to encompass the second compressor and the second motor of the first chiller;
wherein the first working fluid is returned back to the second ORC from the first and second insulation chambers;
wherein the second ORC comprises a second ORC condenser and a second ORC evaporator;
wherein the second ORC condenser provides the first working fluid to the first insulation chamber, the first working fluid absorbs the heat from the compressor and the motor of the chiller, and the first insulation chamber returns the first working fluid to the second ORC evaporator.

24. The system of claim 20,
wherein the second chiller comprises a second chiller condenser;
wherein the second chiller condenser receives the third facility fluid from a second heat sink and returns the third facility fluid to the second heat sink.

25. The system of claim 24,
wherein the second heat sink for the second chiller is a cooling tower;
wherein the second chiller condenser receives the third facility fluid from the cooling tower and returns the third facility fluid to the cooling tower.

26. The system of claim 24,
wherein the second heat sink for the second chiller is a third ORC;
wherein the second chiller condenser receives the third facility fluid from a second heat sink and returns the third facility fluid to the second heat sink.

27. The system of claim 26, comprising:
wherein the third ORC provides a second working fluid toward the second chiller;

wherein the second working fluid absorbs a third heat from a second compressor or a second motor of the second chiller and is returned back to the third ORC;

wherein the second chiller comprises the second compressor and the second motor.

28. The system of claim 27, comprising:

a second insulation chamber, configured to encompass the second compressor and the second motor of the second chiller;

wherein the third ORC comprises a third ORC condenser and a third ORC evaporator;

wherein the third ORC condenser provides the second working fluid to the second insulation chamber, the second working fluid absorbs the third heat from the compressor and the motor of the second chiller, and the second insulation chamber returns the second working fluid to the third ORC evaporator.

29. The system of claim 1, comprising:

a plurality of first ORCs, configured to harvest a plurality of first heats from a plurality of first heat sources, wherein the first chiller is configured to provide the first facility fluid to the plurality of first ORCs and the plurality of first ORCs returns the first facility fluid to the chiller.

* * * * *